United States Patent [19]
Isogai et al.

[11] Patent Number: 6,088,911
[45] Date of Patent: *Jul. 18, 2000

[54] ELECTRONIC COMPONENT TRANSFERRING APPARATUS

[75] Inventors: Takeyoshi Isogai, Hekinan; Hiroshi Katsumi, Toyoake; Sinsuke Suhara, Kariya, all of Japan

[73] Assignee: Fuji Machine Mfg. Co., Ltd., Chiryu, Japan

[ * ] Notice: This patent is subject to a terminal disclaimer.

[21] Appl. No.: 08/801,460

[22] Filed: Feb. 18, 1997

Related U.S. Application Data

[63] Continuation-in-part of application No. 08/769,700, Dec. 18, 1996, Pat. No. 5,926,950.

[30] Foreign Application Priority Data

Dec. 28, 1995 [JP] Japan ..................................... 7-342430
Feb. 23, 1996 [JP] Japan ..................................... 8-036351

[51] Int. Cl.[7] ...................................................... H05K 3/30
[52] U.S. Cl. ..................... 29/740; 198/470.1; 198/471.1; 198/574; 198/586; 29/743; 29/DIG. 44; 414/752
[58] Field of Search .............................. 29/740, 741, 743, 29/DIG. 44; 198/470.1, 471.1, 574, 586; 414/752

[56] References Cited

U.S. PATENT DOCUMENTS 5,588,195 12/1996 Asai et al. .

FOREIGN PATENT DOCUMENTS 2-69998   3/1990  Japan .
6-45787   2/1994  Japan .
6-77693   3/1994  Japan .

*Primary Examiner*—Lee Young
*Assistant Examiner*—Rick Kiltae Chang
*Attorney, Agent, or Firm*—Oliff & Berridge, PLC

[57] ABSTRACT

An electronic component transferring apparatus for transferring electronic components, including at least one movable member, a movable-member moving device which moves the movable member, a rotary head which is supported by the movable member such that the rotary head is rotatable about an axis line thereof, a plurality of component holders which are supported by the rotary head such that the component holders are provided along a circle whose center is positioned on the axis line of the rotary head, a drive source which is supported by the movable member and which provides a motion, and a motion transmitting device which is selectively operable in a component-holder selecting state in which the motion transmitting device transmits the motion of the drive source to the rotary head, to rotate the rotary head about the axis line thereof and thereby position one of the component holders at an operating position in which the one component holder holds one of the electronic components, and in a component-holder rotating state in which the motion transmitting device transmits the motion of the drive source to at least the one component holder being positioned at the operating position, to rotate the one component holder about an axis line thereof.

32 Claims, 21 Drawing Sheets

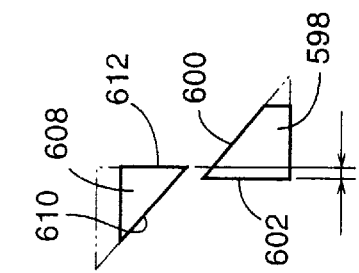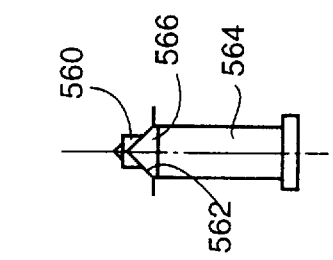
FIG.22A
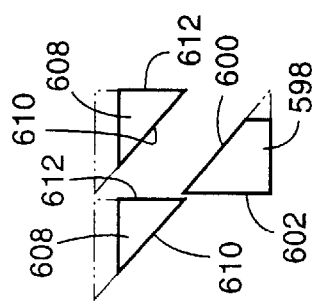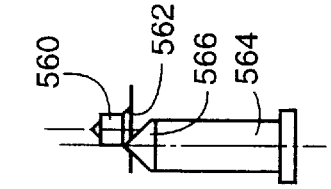
FIG.22B
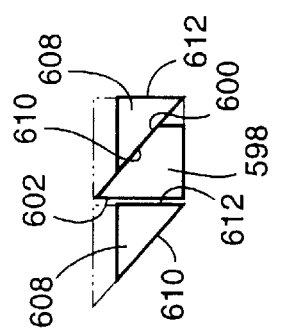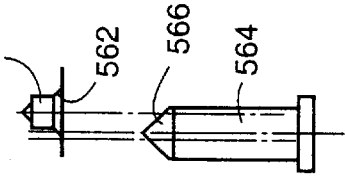
FIG.22C
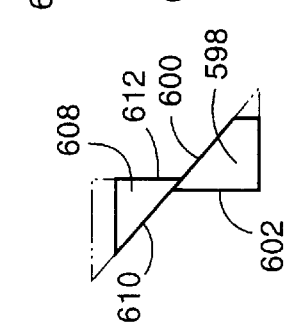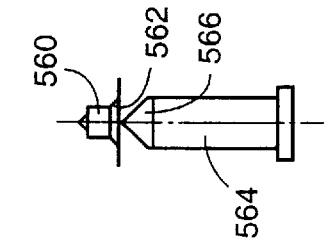
FIG.22D
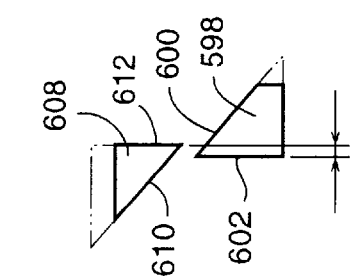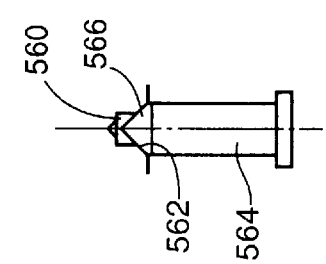
FIG.22E

ELECTRONIC COMPONENT TRANSFERRING APPARATUS

This is a Continuation-In-Part of application Ser. No. 08/769,700, filed Dec. 18, 1996, U.S. Pat. No. 5,926,950.

BACKGROUND OF THE INVENTION

1. Field of the Invention

The present invention relates to an apparatus which includes a plurality of component holders one of which is selectively used for transferring an electronic component and rotates the selected component holder about an axis line thereof for rotating the electronic component, and particularly relates to the improvements of a device which selects one of the component holders and rotates the selected component holder.

2. Related Art Statement

There is known an electronic component ("EC") transferring apparatus which includes a plurality of component holders. For example, the EC transferring apparatus is employed in an EC mounting system which mounts ECs on a workpiece such as a printed circuit ("PC") board. Recently, the number of the kinds of ECs which are mounted on a workpiece tends to increase. Hence, the EC mounting system is provided with a plurality of component holders having different dimensions and shapes corresponding to different kinds of ECs, and those component holders are selectively used for mounting the different kinds of ECs.

Meanwhile, in some cases, it is required that the selected component holder be rotated about an axis line thereof. For example, in the case where an image of the EC held by the component holder is taken to detect an error of holding of the EC and an error of holding of the EC about an axis line of the EC (hereinafter, referred to as the "angular error" of EC) is detected, it is required that the EC be rotated about the axis line thereof to correct the angular error. In addition, in the case where an EC which has an angular position different from an angular position at which the EC is supplied from an EC supply device to the EC mounting system is mounted on a workpiece, it is required that the EC be rotated about the axis line thereof to change the original or first angular position to the second angular position. In each case, the component holder needs to be rotated. In the case where the EC mounting system includes a plurality of component holders, at least one of the component holders which is being positioned at an operating position where the said one component holder can receive an EC from the EC supply device and hold the EC, must be rotatable about the axis line thereof.

Japanese Patent Application laid open for inspection purposes under Publication No. 2-69998 discloses an EC mounting system which employs a single electric motor as a common drive source for not only selecting one of a plurality of component holders but also rotating one component holder being positioned at an operating position. More specifically described, the disclosed EC mounting system includes a rotary table which is rotatable about a vertical axis line, and a plurality of nozzle holders which are supported by the rotary table such that each nozzle holder is rotatable about a vertical axis line thereof and which are provided along a circle whose center is located on the axis line of the rotary table and are equiangularly spaced from each other about the same axis line. Each nozzle holder supports a plurality of component suction nozzles which have respective vertical axis lines and which are provided along a circle whose center is located on the axis line of the each nozzle holder and are equiangularly spaced from each other about the same axis line. While the rotary table is intermittently rotated, each of the nozzle holders is sequentially stopped at each of a plurality of working positions including an EC sucking position and an EC mounting position where each nozzle holder sucks an EC and mounts the EC. When each of the nozzle holders is rotated about an axis line thereof by the electric motor mounted on the rotary table, one of the suction nozzles is selected and moved to the operating position. When one nozzle holder is rotated about the axis line thereof that is parallel to the axis line of each suction nozzle, each suction nozzle is revolved around the axis line of the nozzle holder and simultaneously is rotated about the axis line of the each suction nozzle. Thus, an angular error of an EC held by each suction nozzle may be corrected. However, when this correction is effected, the EC held by the suction nozzle is revolved around the axis line of the nozzle holder, that is, the position of the center of the EC is changed. Hence, a PC board as a workpiece is moved so as to eliminate the positional change, before the EC is mounted thereon.

In the EC transferring apparatus employed in the above EC mounting system, the electric motor as the drive source is provided on the rotary table, and the selection and rotation of each suction nozzle are effected by rotating the nozzle holder while the rotary table is rotated. Thus, a long time can be used for the nozzle selection and rotation, and accordingly each suction nozzle can be rotated at a small angular acceleration. Therefore, the angular error of the EC is corrected while the out-of-position movement of the EC is prevented. In addition, the angular pitch at which the nozzle holder is rotated to select and position each of the suction nozzles at the operating position may be increased, or the nozzle holder can be rotated by two or more angular pitches at one time.

Moreover, the above EC transferring apparatus enjoys a simpler and lighter construction and a lower production cost than an apparatus which utilizes different electric motors, each mounted on a rotary table, for selecting and rotating an EC, respectively. In addition, since each nozzle unit including each nozzle holder, the electric motor, and a rotation transmitting device which transmits the rotation of the motor to the each nozzle holder enjoys a small mass, the vibration of the rotary table and the nozzle units which is produced when the rotary table is intermittently stopped at the working positions is reduced.

However, in the EC transferring apparatus disclosed in the above-indicated publication, the EC is rotated by revolving the suction nozzle holding the EC around the nozzle holder, so that an centrifugal force is exerted to the EC and an out-of-position movement of the EC tends to take place. Before the EC is rotated, a positional error of the EC is detected and corrected. However, since the above out-of-position movement of the EC takes place after the positional error of the EC is corrected, the out-of-position movement of the EC cannot be corrected.

Moreover, the axis line of each suction nozzle is offset by a certain distance from the axis line of the nozzle holder. Accordingly, if the nozzle holder is rotated by an inaccurate angle for rotating the EC, the position of the axis line of the nozzle holder is subject to an error corresponding to the product of the above offset distance and the angular error of the nozzle holder. This error is maintained as it is when the EC is mounted at a predetermined EC placing position on the PC board.

As described above, when the angular error of the EC is corrected, the position of the EC in the horizontal plane (i.e., X-axis and Y-axis direction positions) changes. Accordingly, the PC board is moved so as to eliminate the positional change of the EC. Thus, a longer time may be needed for moving the PC board from the prior EC placing position to the current position. In consideration of this, a longer cycle time at which ECs are cyclically mounted is employed, and the efficiency of mounting of ECs is lowered.

SUMMARY OF THE INVENTION

It is therefore an object of the present invention to provide an electronic component transferring apparatus which enjoys the advantages of the electronic component transferring apparatus disclosed in the above-indicated publication and which is freed of at least one of the drawbacks of the same apparatus.

According to a first aspect of the present invention, there is provided an electronic component transferring apparatus for transferring electronic components, comprising at least one movable member; a movable-member moving device which moves the movable member; a rotary head which is supported by the movable member such that the rotary head is rotatable about an axis line thereof; a plurality of component holders which are supported by the rotary head such that the component holders are provided along a circle whose center is positioned on the axis line of the rotary head; a drive source which is supported by the movable member and which provides a motion; and a motion transmitting device which is selectively operable in a component-holder selecting state in which the motion transmitting device transmits the motion of the drive source to the rotary head, to rotate the rotary head about the axis line thereof and thereby position one of the component holders at an operating position in which the one component holder holds one of the electronic components, and in a component-holder rotating state in which the motion transmitting device transmits the motion of the drive source to at least the one component holder being positioned at the operating position, to rotate the one component holder about an axis line thereof. The component holders may be component suckers each of which suck an electronic component ("EC") by vacuum as described in the preferred embodiments of the invention, component chucks each of which includes a plurality of jaws which open and close to grasp and release an EC, or other kinds of component holders.

In the electronic component transferring apparatus in accordance with the first aspect of the invention, when the motion transmitting device is operated in the component-holder selecting state, the rotary head is rotated and one of the component holders is selected and positioned at the operating position; and when the motion transmitting device is operated in the component-holder rotating state, the component holder being positioned at the operating position is rotated about the axis line thereof. The drive source supported by the movable member is utilized for both the selection and rotation of the component holder. Thus, the present apparatus enjoys the same advantages as those of the prior apparatus disclosed in the above-indicated publication. In addition, the component holder being positioned at the operating position is rotated about the axis line thereof. Thus, when the component holder holding the EC is rotated, the position of the center of the EC in a plane perpendicular to the axis line of the component holder (hereinafter, referred to as the "center position" of EC) is subject to substantially no change. In the case where the center position of the EC is accurately aligned with the axis line of the component holder, the center position does not change; and in the case where the center position is not accurately aligned with the axis line, the amount of misalignment is, however, so small that the center position is subject to substantially no change. Accordingly, the position of an EC receiving workpiece relative to the component holder is easily corrected by slightly changing the relative position for eliminating the possible change of the center position of the EC resulting from the correction of the angular error of the EC. For example, in the case where the EC transferring apparatus in accordance with the first aspect of the invention is employed in the EC mounting system disclosed in the above-indicated Publication 2-69998, the ECs are mounted on a PC board as a EC receiving workpiece. In this case, the position of the PC board relative to the component holder is corrected by slightly changing the relative position for eliminating the possible change of the center position of the EC resulting from the correction of the angular error of the EC. Thus, the present apparatus is free from the above-indicated disadvantage that a long time may be consumed for moving the PC board from the prior EC placing position to the current EC placing position and accordingly a long cycle time is needed for cyclically mounting ECs on the PC board. Thus, the present apparatus mounts the ECs on the PC board with high efficiency. Even if the component holder is rotated by an inaccurate angle for rotating the EC, a possible error of the center position of the EC resulting from that rotation is so small that it is negligible. The error of the center position of the EC corresponds to the product of the offset distance of the center position of the EC from the axis line of the component holder and the angular error of the component holder. Since the two factors are both so small, the product thereof is accordingly small. Moreover, since the EC is rotated without being subject to any centrifugal force, no movement of the EC relative to the component holder takes place, even if the component holder is provided by a component sucker. Thus, the angular error of the EC can be quickly corrected. If the present EC transferring apparatus is employed in an EC mounting system, the EC mounting system can mount ECs on a workpiece with high accuracy and high efficiency.

According to a preferred feature of the first aspect of the invention, the electronic component transferring apparatus further comprises a rotary holder which supports the rotary head such that the rotary head is rotatable about the axis line thereof and which is supported by the movable member such that the rotary holder is rotatable about an axis line thereof coaxial with the axis line of the one component holder being positioned at the operating position, wherein the motion transmitting device rotates, in the component-holder rotating state thereof, the rotary holder about the axis line thereof coaxial with the axis line of the one component holder being positioned at the operating position, so as to rotate the one component holder about the axis line thereof. In this apparatus, when the motion transmitting device operates in the component-holder rotating state thereof, the rotary holder is rotated about the axis line thereof coaxial with the axis line of the one component holder being positioned at the operating position. Consequently the rotary head supported by the rotary holder is not rotated about the axis line thereof but is rotated together with the holder about the axis line of the holder, and the component holder being positioned at the operating position is rotated about the axis line thereof. Meanwhile, when the motion transmitting device operates in the component-holder selecting state thereof, the rotary head is rotated about the axis line thereof, so that one of the component holders is selected and positioned at the operating position. In the present apparatus, the axis line of the rotary head intersects the respective axis lines of the component holders.

According to another feature of the first aspect of the invention, the drive source comprises a rotary motor having a rotary output shaft, and wherein the motion transmitting device comprises a component-holder selecting-rotation transmitting device including a component-holder selecting-rotation input member which is rotatable to rotate the rotary head about the axis line thereof, a component-holder rotating-rotation transmitting device including a component-holder rotating-rotation input member which is rotatable to rotate at least the one component holder positioned at the operating position, about the axis line thereof, a transmission control device which is selectively operable in a first transmitting state in which the transmission control device permits a rotation of the output shaft of the rotary motor to be transmitted to each of the component-holder selecting-rotation input member and the component-holder rotating-rotation input member, and in a second transmitting state in which the transmission control device permits the rotation of the output shaft to be transmitted to only one of the component-holder selecting-rotation input member and the component-holder rotating-rotation input member. The component-holder rotating-rotation input member may be provided as an integral part of the above-indicated rotary holder, and the component-holder selecting-rotation input member may be provided such that the input member is rotatable relative to the rotary holder. In the latter case, when the rotation of the output shaft of the rotary motor is transmitted to each of the two input members, the component holder is rotated; and when the rotation is transmitted to only the component-holder selecting-rotation input member, one of the component holders is selected. In the present apparatus, the transmission of rotation of the output shaft of the drive source to the two input members is so controlled that the axis line of the component holder is not moved when the component holder is rotated.

According to another feature of the first aspect of the invention, the motion transmitting device comprises a connecting device which permits the rotation of the output shaft of the drive motor to be transmitted to one of the component-holder selecting-rotation input member and the component-holder rotating-rotation input member, and a switching device which is selectively operable in a first state in which the switching device permits the rotation of the output shaft to be transmitted to the other of the selecting-rotation input member and the rotating-rotation input member and in a second state in which the switching device does not permit the rotation of the output shaft to be transmitted to the other of the selecting-rotation input member and the rotating-rotation input member. When the switching device is operated in the first state, the rotation of the drive motor is transmitted to each of the two input members; and when the switching device is operated in the second state, the rotation of the drive motor is transmitted to only one of the two input members. The connecting device and the switching device cooperate with each other to provide the above-indicated transmission control device.

According to another feature of the first aspect of the invention, the rotary motor comprises a bi-directional rotary motor having a rotary output shaft which is rotatable in a first direction and a second direction opposite to the first direction, and wherein the motion transmitting device comprises an each-direction-rotation transmitting device which transmits a rotation of the output shaft of the bi-directional rotary motor in each of the first and second directions to one of the component-holder selecting-rotation input member and the component-holder rotating-rotation input member, and a one-direction-rotation transmitting device which transmits, to the other of the selecting-rotation input member and the rotating-rotation input member, the rotation of the output shaft in the first direction and does not transmit the rotation of the output shaft in the second direction. The present apparatus is operable in a first state in which the rotation of the rotary motor is transmitted to each of the two input members, and in a second state in which the rotation of the rotary motor is transmitted to only one of the two input members. The each-direction-rotation transmitting device and the one-direction-rotation transmitting device cooperate with each other to provide the above-indicated transmission control device.

According to another feature of the first aspect of the invention, the motion transmitting device comprises a switching device which is selectively operable in a first state in which the switching device permits the transmission of the motion of the drive source, and in a second state in which the switching device does not permit the transmission of the motion of the drive source. For example, the switching device is operable in the second state to inhibit the transmission of the motion of the drive source to one of the above-indicated two input members. If the switching device inhibits the transmission of the motion to the component-holder rotating input member, only the component-holder selection may take place. On the other hand, if the switching device inhibits the transmission of the motion to the component-holder selecting input member, only the component-holder rotation may take place. The switching device is utilized for rotating the component holder without moving the axis line of the holder.

According to another feature of the first aspect of the invention, the drive source comprises a rotary motor having a rotary output shaft, wherein the motion transmitting device comprises a component-holder selecting-rotation transmitting device including a component-holder selecting-rotation input member which is rotatable to rotate the rotary head about the axis line thereof, and a component-holder rotating-rotation transmitting device including a component-holder rotating-rotation input member which is rotatable to rotate at least the one component holder being positioned at the operating position, about the axis line thereof, and wherein the switching device comprises a drive member which is rotatable with the output shaft of the rotary motor, a driven member which is rotatable with one of the component-holder selecting-rotation input member and the component-holder rotating-rotation input member and which is engageable with the drive member such that the driven member is rotatable with the drive member, and an engaging and disengaging device which moves at least one of the drive member and the driven member relative to each other in an axial direction of the output shaft of the rotary motor and thereby engages, and disengages, the drive member and the driven member with, and from, each other.

According to another feature of the first aspect of the invention, the driven member is rotatable with the component-holder rotating-rotation input member, and wherein the motion transmitting device comprises a rotation preventing device which permits the rotation of the component-holder rotating-rotation input member, while the drive member and the driven member are engaged with each other, and prevents the rotation of the component-holder rotating-rotation input member, while the drive member and the driven member are disengaged from each other. In the present apparatus, when the selecting-rotation input member is rotated while the drive and driven members are disengaged from each other, the rotation of the rotating-rotation input member is prevented, so that the rotating-rotation input member is not rotated with the selecting-rotation input member. Thus, the driven member is reliably engageable with the drive member after the drive member has been rotated to a different angular phase because of the rotation of the selecting-rotation input member.

According to another feature of the first aspect of the invention, the rotation preventing device comprises a first rotation preventing member which is rotatable with the component-holder rotating-rotation input member, and a second rotation preventing member which is not rotatable relative to the movable member and which is engageable with the first rotation preventing member, and wherein the engaging and disengaging device engages, and disengages, the drive member and the driven member with, and from, each other and simultaneously disengages, and engages, the first and second rotation preventing members from, and with, each other.

According to another feature of the first aspect of the invention, the electronic component transferring apparatus further comprises a motor support on which the rotary motor is fixedly supported and which is supported by the movable member such that the motor support is movable relative to the rotary holder in an axial direction of the output shaft of the rotary motor, wherein the drive member and the second rotation preventing member are immovable relative to the motor support in the axial direction of the output shaft, and wherein the engaging and disengaging device comprises a biasing member which provides a biasing force to bias the motor support in a direction away from the rotary holder, and a motor-support moving device which moves the motor support toward the rotary holder against the biasing force of the biasing member.

According to another feature of the first aspect of the invention, the electronic component transferring apparatus further comprises a rotary-head positioning device which positions the rotary head at an angular position about the axis line thereof where the one component holder is positioned at the operating position. In the present apparatus, since the selected component holder is positioned at the operating position with accuracy, the component holder does not fail to receive or pass the EC, and passes the EC to an accurate position on an EC receiving workpiece such as a PC board.

According to another feature of the first aspect of the invention, the rotary-head positioning device comprises an engageable projection and an engageable recess one of which is provided in a portion of the rotary head which portion is away from the axis line of the rotary head and the other of which is supported by a head holder which holds the rotary head such that the rotary head is rotatable about the axis line thereof, and a pressing device which elastically presses at least one of the projection and the recess to engage each other at least in a state in which one of the component holders is positioned at the operating position, the projection and the recess having respective shapes which are engageable with each other to define an angular position of the rotary head about the axis line thereof.

According to another feature of the first aspect of the invention, respective axis lines of the component holders intersect the axis line of the rotary head.

According to another feature of the first aspect of the invention, respective axis lines of the component holders are parallel to the axis line of the rotary head. The axis lines of the component holders may, or may not, be parallel to the axis line of the rotary head. The manner in which the axis lines of the holders are not parallel to the axis line of the head is not limited to the above-indicated case in which the axis lines of the holders intersect the axis line of the head. The case in which the axis lines of the holders perpendicularly intersect the axis line of the head is a typical example of the manner in which the axis lines of the holders intersect the axis line of the head.

According to another feature of the first aspect of the invention, the electronic component transferring apparatus further comprises a component-holder selecting-rotation transmitting device including a component-holder selecting-rotation input member which is rotatable to rotate the rotary head about the axis line thereof, and a component-holder rotating-rotation transmitting device including a component-holder rotating-rotation input member which is rotatable to rotate at least the one component holder being positioned at the operating position, about the axis line thereof. The motion transmitting device comprises the component-holder selecting-rotation transmitting device and the component-holder rotating-rotation transmitting device.

According to another feature of the first aspect of the invention, the electronic component transferring apparatus further comprises a rotary holder which supports the rotary head such that the rotary head is rotatable about the axis line thereof and which is supported by the movable member such that the rotary holder is rotatable about an axis line thereof coaxial with the axis line of the one component holder being positioned at the operating position, wherein the component-holder selecting-rotation transmitting device includes the component-holder selecting-rotation input member which is held by the rotary holder such that the selecting-rotation input member is rotatable about the axis line of the rotary holder relative thereto, and an input-member-rotation converting device which converts the rotation of the selecting-rotation input member into the rotation of the rotary head about the axis line thereof.

According to another feature of the first aspect of the invention, the input-member-rotation converting device comprises at least one pair of bevel gears which are engaged with each other.

According to another feature of the first aspect of the invention, the electronic component transferring apparatus further comprises a rotary holder which supports the rotary head such that the rotary head is rotatable about the axis line thereof and which is supported by the movable member such that the rotary holder is rotatable about an axis line thereof coaxial with the axis line of the one component holder being positioned at the operating position, wherein the drive source comprises a rotary motor having a rotary output shaft, and wherein the motion transmitting device comprises a rotation transmitting device which transmits a rotation of the output shaft of the rotary motor to the rotary holder, and a rotation converting device which is provided between the rotary holder and the rotary head and which converts at least a portion of a rotation of the rotary holder into a rotation of the rotary head relative to the rotary holder. In the present apparatus, when the rotary holder is rotated about the axis line thereof, the component holder being positioned at the operating position is rotated about the axis line thereof. In addition, when the rotation of the rotary holder is converted by the rotation converting device, the rotary head is rotated about the axis line thereof, so that one of the component holders is selected and positioned at the operating position. Thus, both the selection and rotation of the component holder are effected based on the rotation of the rotary holder. If a component-holder selection is effected when the component holder is rotated, the component holder currently being positioned at the operating position is changed with another component holder. Hence, it is required that no component-holder selection takes place when the component holder is rotated. On the other hand, when a component-holder selection is effected, it is usual that no component holder holds an EC. Thus, the component holder may be rotated when the component-holder selection is effected. However, it is preferred that the rotation converting device be adapted to return the component holder to its original angular position when the component-holder selection is finished. Means for rotating the component holder without causing the component-holder selection may be provided by the rotation converting device which is adapted to be selectively operable in an operative state in which the converting device converts the rotation of the rotary holder into the rotation of the rotary head relative to the rotary holder, and in an inoperative state in which the converting device does not perform the conversion. In this case, the selection and rotation of the component holder takes place independently of each other. Otherwise, the means may be provided by the rotation converting device which is adapted to use the rotation of the rotary holder over a predetermined angular range out of 360 degrees, for rotating the component holder, and use the rotation of the rotary holder over a predetermined different angular range, for selecting one of the component holders. In the former case, the full (360 degrees) rotation of the rotary holder can be used for the component-holder rotation, or the component-holder selection, without being limited to any particular angular ranges. In the present apparatus, the rotation of the rotary holder holding the rotary head is utilized for both the component-holder rotation and the component-holder selection.

According to another feature of the first aspect of the invention, the rotation converting device comprises a cam, a cam follower which is supported by the rotary holder such that the cam follower is movable relative thereto and which is engageable with the cam when the rotary holder is rotated about the axis line thereof, and a cam-follower-motion converting device which converts the motion of the cam follower relative to the rotary holder into the rotation of the rotary head relative to the rotary holder. In the present apparatus, the rotation of the rotary holder is converted into the rotation of the rotary head by the cooperation of the cam and the cam follower. The present rotation converting device enjoys a simple construction and a low production cost.

According to another feature of the first aspect of the invention, the motion transmitting device comprises a position changing device which changes a position of at least one of the rotary holder and the cam relative to the other of the rotary holder and the cam, between a first position in which the cam and the cam follower are engageable with each other when the rotary holder is rotated about the axis line thereof, and in a second position in which the cam and the cam follower are not engageable with each other. In the present apparatus, when one of the component holders is selected, the position of the rotary holder and the cam relative to each other is changed to the first position in which the cam and the cam follower are engageable with each other; and when the component holder being positioned at the operating position is rotated, the relative position is changed to the second position in which the cam and the cam follower are not engageable with each other. Thus, when the component-holder rotation takes place, the component-holder selection does not take place. Accordingly, the component holder can be rotated by a great angle. In addition, when the component-holder selection is effected, the rotary holder can be rotated by 360 degrees. For example, in the case where the rotation converting device comprises a plurality of cams which are equiangularly spaced from each other, the rotary head is rotated by two or more angular pitches when the rotary holder is rotated by 360 degrees in one direction. In the present apparatus, the motion transmitting device is selectively operable in a first state in which the rotation of the rotary holder is converted into the rotation of the rotary head by the cooperation of the cam and the cam follower, and a second state in which the rotation conversion does not take place. Thus, the component holder can be rotated while the movement of the axis line of the holder is prevented.

According to another feature of the first aspect of the invention, the rotation converting device comprises a drive cam which is not rotatable about the axis line of the rotary head, a driven cam which is rotatable with the rotary head and which is movable relative to the drive cam in a direction parallel to the axis line of the rotary head, and a biasing member which provides a biasing force to bias at least one of the drive cam and the driven cam in a direction away from each other, the drive cam and the driven cam having respective shapes which cooperate with each other to rotate the rotary head about the axis line thereof by a predetermined angle each time the drive cam and the driven cam are engaged, based on the movement of the cam follower relative to the rotary holder, with each other against the biasing force of the biasing member. In the present apparatus, either the drive cam or the driven cam may be adapted to be movable in the direction parallel to the axis line of the rotary head. In the case where the drive cam is movable in that direction, the drive cam is adapted to be not rotatable relative to the rotary holder about the axis line of the rotary head and is movable in the direction parallel to the axis line of the rotary head; and in the case where the driven cam is movable in that direction, the driven cam is adapted to be not rotatable relative to the rotary head and is movable relative to the rotary holder in the direction parallel to the axis line of the rotary head.

According to another feature of the first aspect of the invention, the electronic component transferring apparatus comprises a rotary-head positioning device which positions the rotary head at an angular position about the axis line thereof where the one component holder is positioned at the operating position, the rotary-head positioning device comprising an engageable projection which projects from a portion of one of the rotary head and the rotary holder which portion is away from the axis line of the rotary head, an engageable recess which is formed in the other of the rotary head and the rotary holder and which is engageable with the engageable projection, and a holding and biasing device which holds one of the engageable projection and the engageable recess such that the one of the projection and the recess is movable in a first direction to engage the other of the projection and the recess and in a second direction to disengage from the other of the projection and the recess and such that the one of the projection and the recess is rotatable with the rotary head, the holding and biasing device biasing the one of the projection and the recess in the first direction, one of the projection and the recess being provided in a number which is not less than one and is natural-number times as great as a number of the component holders, the other of the projection and the recess being provided in one, the projection and the recess having respective shapes which cooperate with each other to guide, when one of the projection and the recess being not accurately aligned with each other is biased by the biasing member, the one of the projection and the recess and thereby accurately align the projection and the recess with each other, so as to cause the projection and the recess to be engaged with each other. It is typical that the same number of engageable recesses as the number of component holders supported by the rotary head are provided and a single engageable projection is selectively engaged with each of the recesses. However, it is possible that a plurality of engageable projections be provided and a single engageable recess be engaged with each of the projections. In the latter case, it is preferred that the single recess be provided on a projecting portion of the rotary head or the rotary holder, so as to permit the engagement of the recess with each one of the projections and prevent the collision of the other projections with the rotary holder or the rotary head. In addition, it is possible that the projections or the recesses be provided in a number which is not less than two and is natural-number times as great as the number of component holders. In the last case, one of the component holders is selected by rotating the rotary head by two or more angular pitches, one angular pitch corresponding to the number of projections or recesses. However, the distance of movement of the drive and driven cams relative to each other in the direction parallel to the axis line of the rotary head, needed to rotate the rotary head by one angular pitch, can be reduced.

According to another feature of the first aspect of the invention, the rotary head and the driven cam are supported by the rotary holder such that the rotary head and the driven cam are movable in a direction parallel to the axis line of the rotary head, and wherein the holding and biasing device comprises fixing means for fixing one of the engageable projection and the engageable recess to the rotary head, and a biasing member which biases the rotary head in a direction to engage the projection and the recess with each other. One of the engageable projection and the engageable recess may be produced independent of the rotary head, and be fixed to the rotary head by fixing means such as a bolt, or may be produced as an integral part of the rotary head. For example, as will be described in the detailed description of the preferred embodiments, the engageable projection is provided by a positioning pin fixed to the rotary holder, and the engageable recess is provided by a plurality of positioning holes formed in a nozzle holder as the rotary head. In the last latter case, a portion of the nozzle holder functions as the fixing means.

According to another feature of the first aspect of the invention, the rotary head and the driven cam are supported by the rotary holder such that the rotary head and the driven cam are movable in a direction parallel to the axis line of the rotary head, and wherein the rotary-head positioning device comprises an engageable projection and an engageable recess one of which is provided in a portion of the rotary head which portion is away from the axis line of the rotary head and the other of which is supported by the rotary holder such that the other of the engageable projection and the engageable recess is not movable in an direction of rotation of the rotary head and is movable toward, and away from, the rotary head and is biased in a direction to engage the one of the projection and the recess, the projection and the recess having respective shapes which are engageable with each other to define an angular position of the rotary head about the axis line thereof and permit the rotary head to be moved in the direction parallel to the axis line thereof. In the present apparatus, the rotary head and the driven cam are movable in the direction parallel to the axis line of the rotary head, in the state in which an angular position of the rotary head about the axis line thereof is fixed by the engagement of the engageable projection and recess. Thus, irrespective of whether or not the driven cam is engaged with the drive cam, the angular position of the rotary head cannot be changed. Thus, the present apparatus is free from the problem that the rotary head cannot be rotated because the angular phase of the driven and drive cams relative to each other is changed due to the rotation of the rotary head and the driven cam before the engagement of the driven and drive cams. When the rotary head is rotated, the other of the projection and recess is moved against the biasing force of the biasing, so that the projection and the recess are disengaged from each other and the rotation of the rotary head is permitted. The rotary head is positioned at one or more predetermined angular positions because of the engagement of the projection and the recess. The engageable projection may has a conical shape, or a bar-like shape extending in the direction parallel to the axis line of the rotary head. The engageable recess should extend in the direction parallel to the axis line of the rotary head. It is preferred that one of the projection and the recess which is to be provided on the rotary head be provided on an outer circumferential surface of a cylindrical portion of the rotary head which is concentric with the axis line of the rotary head. In the case where one or more engageable recesses are provided on the rotary head, the one or more engageable recesses may be provided by one or more V grooves each of which has a V-shaped cross section and which are formed in the outer circumferential surface of the cylindrical portion and extend parallel to the axis line of the rotary head. Otherwise, as will be described in the detailed description of the preferred embodiments, two engageable recesses are provided by two plane surfaces which are formed by cut away two opposite portions of the rotary head and extend parallel to the axis line of the rotary head. In the latter case, two engageable projections may be provided by respective portions of two flat sheet springs. The rotary-head positioning device employed in the present EC transferring apparatus may be used in addition to, or in place of, the rotary-head positioning device employed in the EC transferring apparatus in accordance with the preceding feature of the first aspect of the invention.

According to another feature of the first aspect of the invention, the rotary head supports the component holders such that the component holders are rotatable about respective axis lines thereof parallel to the axis line of the rotary head, and wherein the motion transmitting device rotates, in the component-holder selecting state thereof, the rotary head about the axis line thereof and rotates, in the component-holder rotating state thereof, the at least one component holder about the axis line thereof relative to the rotary head. In the present apparatus, one of the component holders is positioned at the operating position when the rotary head is rotated, and the component holder being positioned at the operating position is rotated about the axis line thereof relative to the rotary head. The component holder is not rotated indirectly via the rotary head, but directly rotated. Thus, the present apparatus does not need a rotary holder which holds the rotary head and rotates the component holder being positioned at the operating position. In the present apparatus, the axis lines of the component holders are parallel to the axis line of the rotary head. In the present apparatus, the motion transmitting device may comprise a component-holder selecting-rotation input member which is provided as an integral part of the rotary head, and a component-holder rotating-rotation input member which is rotatable relative to the rotary head. In the latter case, when a rotation of the drive source is transmitted to only the rotating-rotation input member, the component-holder rotation takes place; and when the rotation is transmitted to only the selecting-rotation input member, the component-holder selection takes place. That is, when the rotation is transmitted to the rotating-rotation input member, the rotation is not transmitted to the selecting-rotation input member; and when the rotation is transmitted to the selecting-rotation input member, the rotation is not transmitted to the rotating-rotation input member.

According to another feature of the first aspect of the invention, the drive source comprises a rotary motor having a rotary output shaft which is rotatable in a first direction and a second direction opposite to the first direction, and wherein the motion transmitting device comprises a component-holder selecting-rotation transmitting device including a component-holder selecting-rotation input member which is rotatable to rotate the rotary head about the axis line thereof, a component-holder rotating-rotation transmitting device including a component-holder rotating-rotation input member which is rotatable to rotate at least the one component holder positioned at the operating position, about the axis line thereof, a first one-way rotation transmitting device which transmits, to the selecting-rotation input member, a rotation of the rotary motor in the first direction and does not transmit a rotation of the rotary motor in the second direction, and a second one-way rotation transmitting device which transmits, to the rotating-rotation input member, the rotation of the rotary motor in the second direction and does not transmit the rotation of the rotary motor in the first direction. In the present apparatus, when the rotary motor is rotated in the first direction, the component-holder selection takes place; and when the rotary motor is rotated in the second direction, the component-holder rotation takes place. Thus, the selection and rotation of the component holder are selectively effected.

According to another feature of the first aspect of the invention, the drive source comprises a rotary motor which is rotatable in a first direction and a second direction opposite to the first direction, and wherein the motion transmitting device comprises a one-way rotation transmitting device which transmits a rotation of the rotary motor in the first direction and does not transmit a rotation of the rotary motor in the second direction. In the present apparatus, the one-way rotation transmitting device is utilized for rotating the component holder without moving the axis line of the holder. In the case where the one-way rotation transmitting device is provided between the rotary motor as the drive source and one of the component-holder selecting-rotation and rotating-rotation input members, the rotation of the rotary motor in the first direction is transmitted to the said one input member and the rotation of the rotary motor in the second direction is not transmitted to the said one input member. In this case, if a connecting device is employed which connects between the rotary member and the other input member and permits the rotation of the rotary member to be transmitted to the other input member, the rotation of the rotary motor in the first direction is transmitted to each of the two input members and the rotation of the rotary motor in the second direction is transmitted to only the other input member. Meanwhile, in the case where the above-described switching device is employed, it is possible to employ, as the drive source, a uni-directional rotary motor which rotates in only one direction, or a bi-directional rotary motor which rotates in opposite directions. If the bi-directional rotary motor is employed, the component holder or the rotary head can be rotated in each of the first and second directions, preferably in the direction in which a smaller angle is contained between its current angular position and its target or next angular position. Thus, the selection or rotation of the component holder is quickly effected. If one or more one-way rotation transmitting devices are employed, the motion transmitting device does not need an actuator needed in the case where a switching device is employed, which contributes to simplifying the construction of the EC transferring apparatus. If the motion transmitting device comprise one or more switching devices and one or more one-way rotation transmitting devices in combination, it enjoys a high degree of freedom.

According to a second aspect of the present invention, there is provided an electronic component transferring apparatus for transferring electronic components, comprising at least one movable member; a movable-member moving device which moves the movable member; a rotary head which is supported by the movable member such that the rotary head is rotatable about an axis line thereof; a plurality of component holders which are supported by the rotary head such that the component holders are provided along a circle whose center is positioned on the axis line of the rotary head; a drive source which is supported by the movable member and which provides a motion; a component-holder selecting device which rotates, based on a motion of the drive source, the rotary head about the axis line thereof and positions one of the component holders at an operating position in which the one component holder holds one of the electronic components; and a component-holder rotating device which rotates, based on the motion of the drive source, at least the one component holder being positioned at the operating position, about an axis line thereof, without causing the rotation of the rotary head about the axis line thereof.

In the EC transferring apparatus in accordance with the second aspect of the invention, the component-holder selecting device and the component-holder rotating device share the common drive source which is supported by the movable member. Thus, the present apparatus enjoys the same advantages as those of the EC transferring apparatus in accordance with the first aspect of the invention.

According to a preferred feature of the second aspect of the invention, respective axis lines of the component holders intersect the axis line of the rotary head.

According to another feature of the second aspect of the invention, respective axis lines of the component holders are parallel to the axis line of the rotary head.

According to another feature of the second aspect of the invention, the component-holder selecting device comprises a component-holder selecting-rotation transmitting device including a component-holder selecting-rotation input member which is rotatable to rotate the rotary head about the axis line thereof, and wherein the component-holder rotating device comprises a component-holder rotating-rotation transmitting device including a component-holder rotating-rotation input member which is rotatable to rotate at least the one component holder being positioned at the operating position, about the axis line thereof.

According to another feature of the second aspect of the invention, the electronic component transferring apparatus further comprises a rotary holder which supports the rotary head such that the rotary head is rotatable about the axis line thereof and which is supported by the movable member such that the rotary holder is rotatable about an axis line thereof coaxial with the axis line of the one component holder being positioned at the operating position, wherein the component-holder selecting-rotation transmitting device includes the component-holder selecting-rotation input member which is held by the rotary holder such that the selecting-rotation input member is rotatable about the axis line of the rotary holder relative thereto, and an input-member-rotation converting device which converts the rotation of the selecting-rotation input member into the rotation of the rotary head about the axis line thereof.

BRIEF DESCRIPTION OF THE DRAWINGS

The above and optional objects, features, advantages and technical and industrial significance of this invention will be better understood by reading the following detailed description of presently preferred embodiments of the invention, when considered in connection with the accompanying drawings, in which:

FIGS. 22A–22E are views for explaining the manner in which a drive cam and a driven cam are engaged with, and disengaged from, each other and a positioning pin and positioning holes are engaged with, and disengaged from, each other, when one of the component suction nozzles is selected in the component holder head shown in FIG. 14;

DETAILED DESCRIPTION OF THE PREFERRED EMBODIMENTS

Referring first to FIGS. 1–9, there will be described an electronic component mounting system including an electronic component transferring and mounting apparatus 12 which is equipped with an electronic component transferring device constructed according to one embodiment of the present invention.

Figure 1:
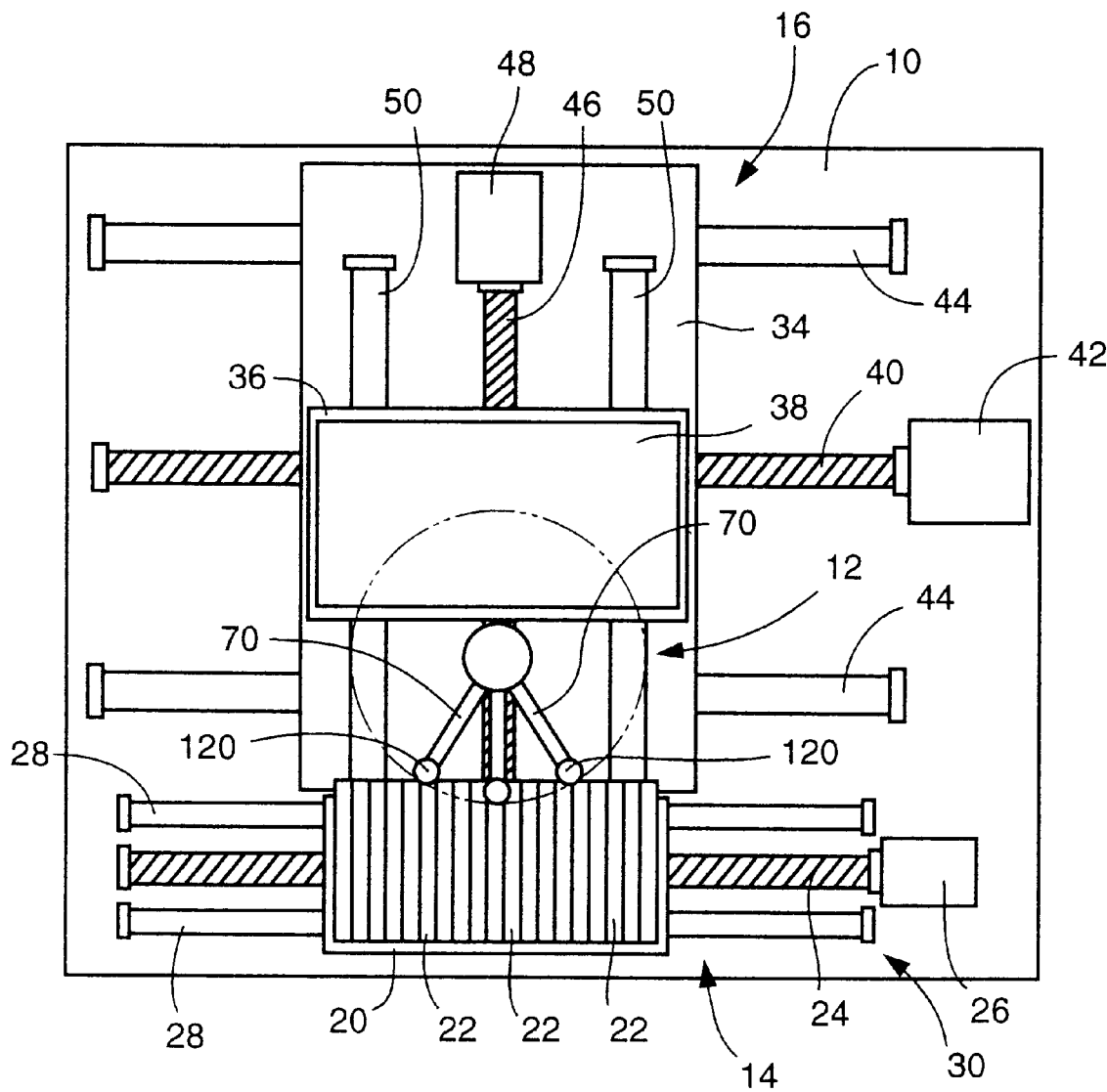
FIG. 1 is a plan view schematically showing an electronic component mounting system according to one embodiment of the present invention, including an electronic component transferring and mounting apparatus equipped with one embodiment of an electronic component transferring device of the invention.

In FIG. 1, reference numeral 10 denotes a base on which are mounted the electronic component transferring and mounting apparatus 12, an electronic component supply device 14, and a board supporting and positioning device 16. The electronic component supply device 14 includes a cartridge support block 20 which carries a multiplicity of component supply cartridges 22 (hereinafter referred to as "cartridges 22) such that the component supply portions of the cartridges 22 are arranged along a straight line.

The cartridge support block 20 is provided with a nut (not shown) engaging a feed screw 24. When the feed screw 24 is rotated by a cartridge feed servomotor 26, the cartridge support block 20 is fed in an X-axis direction while it is guided by a pair of straight guide rails 28. Thus, one of the cartridges 22 which are arranged in the X-axis direction is brought to a predetermined component supply position. The nut, feed screw 24 and cartridge feed servomotor 26 constitute a major portion of a cartridge feeding device 30 for feeding the cartridges 22 in the X-axis direction.

The board supporting and positioning device 16 is disposed at a level lower than that of the cartridges 22 of the electronic component supply device 14. This device 16 includes an X-axis table 34 movable in the X-axis direction, and a Y-axis table 36 which is mounted on the X-axis table 34 and which is movable in a Y-axis direction which is perpendicular to the X-axis direction in a horizontal plane. The Y-axis table 36 has a board holding device (not shown) mounted thereon to position a workpiece in the form of a printed-circuit board 38. The X-axis table 34 is moved in the X-axis direction while it is guided by straight guide rails 44 when a feed screw 40 is rotated by an X-axis drive servomotor 42. The Y-axis table 36 is moved in the Y-axis direction while it is guided by straight guide rails 50 when a feed screw 46 is rotated by a Y-axis drive servomotor 48. With the X-axis table 34 and the Y-axis table 36 being moved in the horizontal plane, the printed-circuit board 38 is positioned such that a multiplicity of component mounting portions of the board 38 are sequentially aligned with a predetermined component mounting position. The X-axis table 34 extends below the electronic component transferring and mounting apparatus 12, and a portion of the table 34 is located below the cartridges 22. The printed-circuit board 38 is loaded and unloaded onto and from the board holding device of the board supporting and positioning apparatus 16, in the X-axis direction.

The electronic component transferring and mounting apparatus 12 is disposed above the electronic component supply device 14 and the board supporting and positioning device 16. The apparatus 12 is adapted to receive the electronic components from the electronic component supply device 14 and transfer the electronic components onto the printed-circuit board 38, namely, mount the electronic components on the board 38. Thus, the apparatus 12 serves not only as an electronic component transferring device, but also as an electronic component mounting device.

Figure 2:
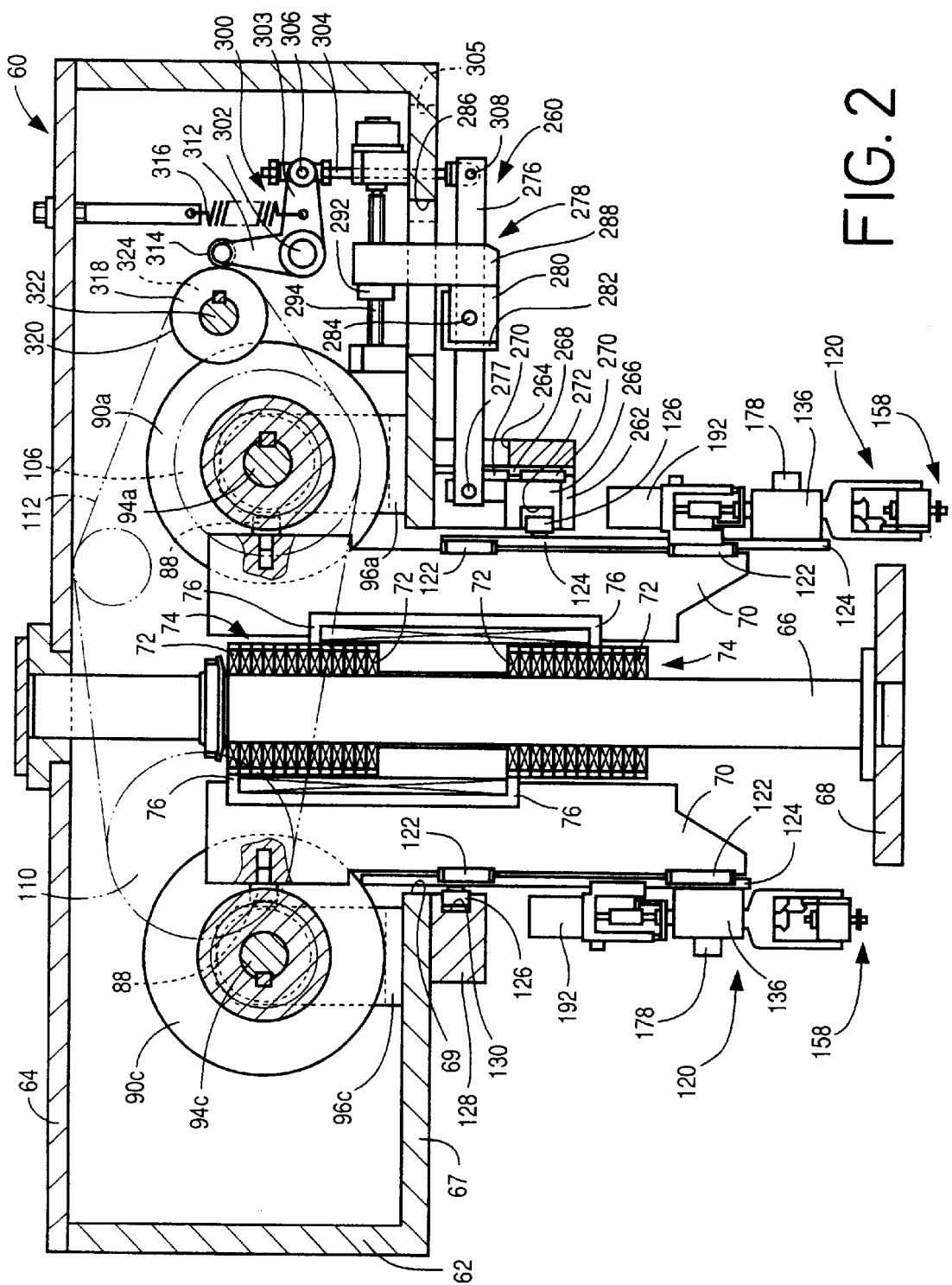
FIG. 2 is a front elevational view in cross section of the electronic component transferring and mounting apparatus of FIG. 1.

Referring to FIG. 2, the electronic component transferring and mounting apparatus 12 has a main body including a frame 60, which is supported by support members (not shown) fixed to the base 10 indicated above. That is, the frame 60 is disposed above the base 10. The frame 60 has a mounting structure 62 in the form of a box having a U-shape in cross section, and a support plate 64 which extends between, and are fixed to, a pair of side walls of the mounting structure 62.

Figure 3:
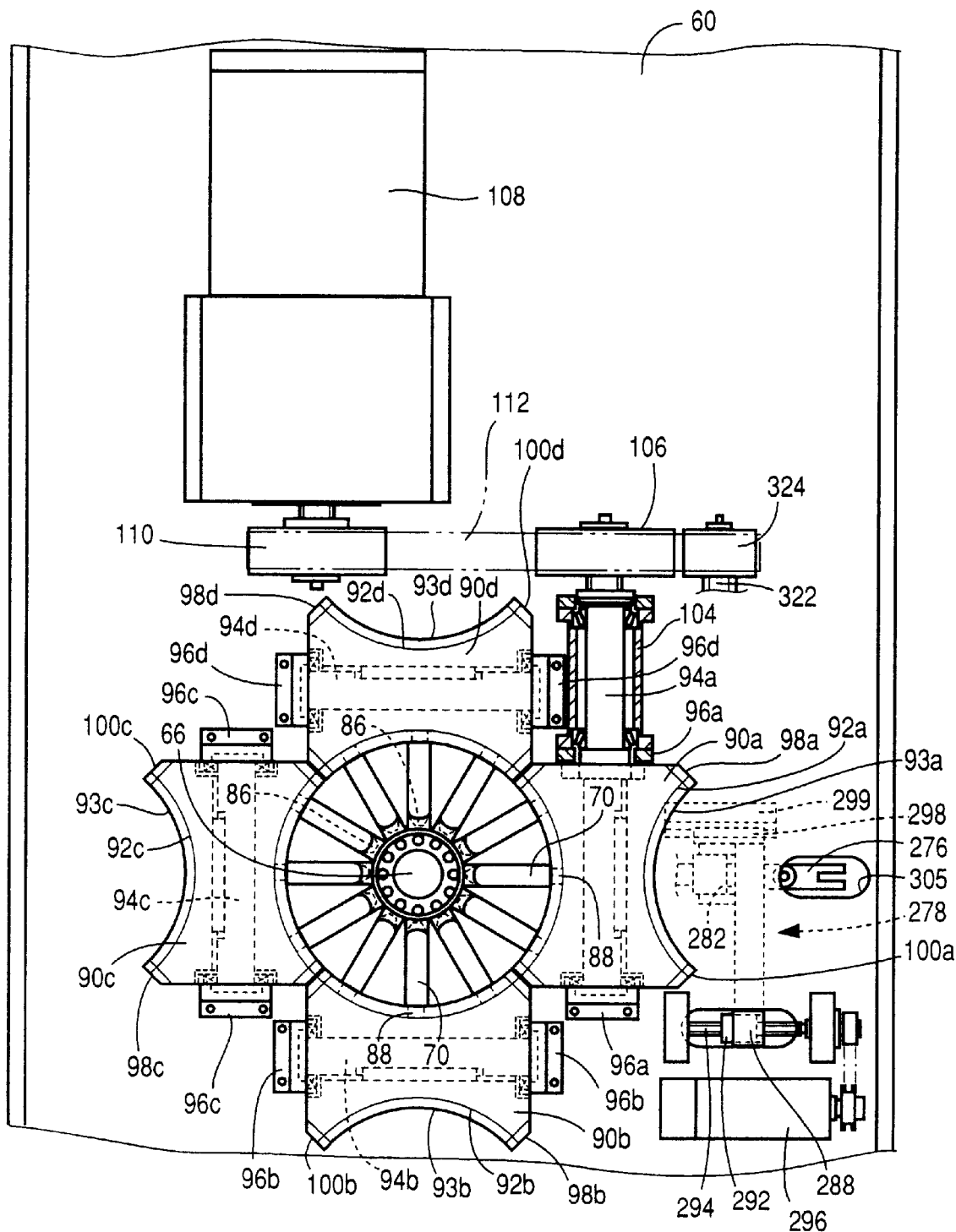
FIG. 3 is a plan view of the present electronic component transferring and mounting apparatus.

A stationary shaft 66 having a circular cross sectional shape is fixed at its upper end to the support plate 64 of the frame 60, and extends downwards through an opening 69 formed through a bottom wall 67 of the mounting structure 62. The lower end portion of the stationary shaft 66 is located outside and below the mounting structure 62, and is fixed at its lower end to a support plate 68 secured to the base 10. As shown in FIGS. 2 and 3, twelve rotary members in the form of rotary plates 70 are fixed to respective pairs of bearings 72, such that the rotary plates 70 are rotatable about an axis of the stationary shaft 66. This axis of the stationary shaft 66 serves as a common axis about which the rotary plates 70 are rotatable.

The bearings 72 consists of two arrays 74 of bearings which are fixedly disposed on the stationary shaft 66 such that the two arrays 74 are spaced apart from each other in the axial direction of the shaft 66. Each of these two arrays 74 consists of twelve bearings 74 which are arranged in the axial direction, namely, superposed on each other in a stack. The twelve rotary plates 70 have respective pairs of support arms 76 fixed thereto. Each pair of support arms 76 is fixed to, and supported by, the corresponding pair of bearings 72 which belong to the two arrays 74, respectively. All pairs of bearings 72 corresponding to the respective pairs of support arms 76 of the twelve rotary members 70 have the same distance therebetween in the axial direction of the stationary shaft 66.

Figure 4:
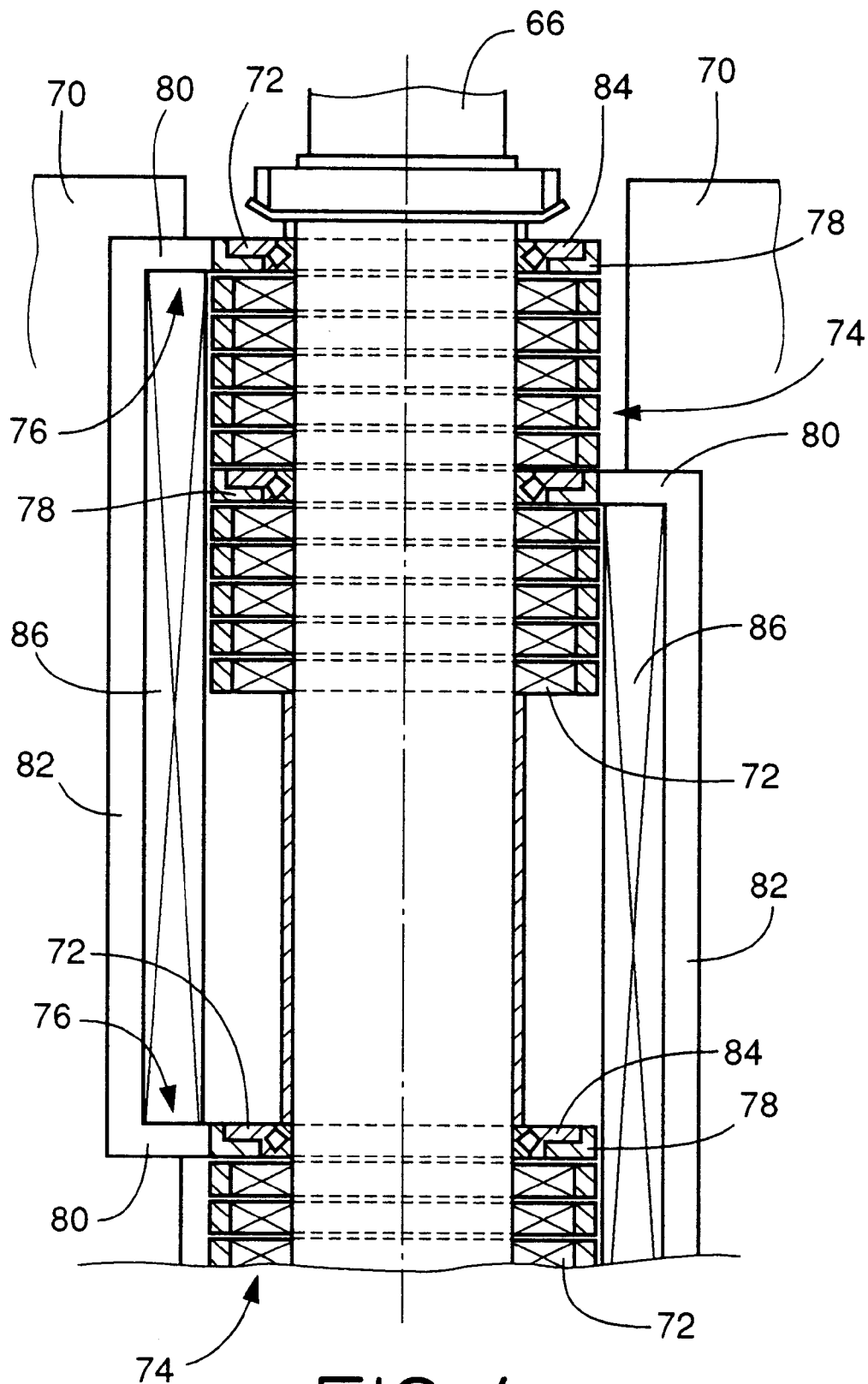
FIG. 4 is a front elevational view in cross section showing rotary plates supported by a stationary shaft in the present transferring and mounting apparatus.

As shown in FIG. 4, each of the support arms 76 consists of an annular fitting 78, and a radial arm 80 which extends from a portion of the circumference of the annular fitting 78 in a radial outward direction of the annular fitting 78. Each pair of support arms 76 has a connecting portion 82 which connects the two radial arms 80. The connecting portion 82 of each pair of support arms 76 and the end portions of the radial arms 76 connected to the connecting portion 82 are fixed to the corresponding rotary plate 70, while the annular fittings 78 are fitted on respective outer casings 84 of the corresponding pair of bearings 72 and are fixed to the outer casings 84 by a plurality of bolts. The twelve pairs of support arms 76 have different axial positions at which the arms 76 are fixed to the respective rotary plates 70. Accordingly, the support arms 76 do not interfere with each other, though the rotary plates 70 have the same position with respect to the stationary shaft 66 in the axial direction of the shaft 66. In this arrangement, the twelve rotary plates 70 are rotatable about the common axis, namely, about the axis of the stationary shaft 66, such that all the rotary plates 70 maintain a predetermined position or height in the axial direction of the stationary shaft 66. Each rotary plate 70 is provided with a rib 86, which has a thinned fixed end portion on the side of the stationary shaft 66, as indicated by broken lines in FIG. 3. The thickness of the thinned fixed end portion of the rib 86 decreases in a radial direction toward the stationary shaft 66, so that the fixed end portions of the adjacent ribs 86 and the adjacent radial arms 80 do not interfere with each other. Each rotary plate 70 extends downwards through the opening 69 formed through the bottom wall 67 of the frame 60, and the lower end portion of the rotary plate 70 is located below the bottom wall 67.

As shown in FIG. 2, a cam follower in the form of a cam follower roller 88 is attached to a radial end of each rotary plate 70 remote from the stationary shaft 66, such that the roller 88 is rotatable about a horizontal axis extending in the radial direction of the stationary shaft 88. As shown in FIG. 3, the rollers 88 of the twelve rotary plates 70 are held in rolling engagement with cam grooves 92a, 92b, 92c, 92d formed in four concave globoidal cams 90a, 90b, 90c, 90d which are rotatably mounted on the frame 60. In the interest of brevity and simplification, the twelve rotary plates 70 are shown in FIG. 3 as positioned relative to each other such that the rotary plates 70 are evenly or equi-angularly spaced apart from each other about the stationary shaft 66.

The four concave globoidal cams 90a, 90b, 90c, 90d have respective outer circumferential surfaces 93a, 93b, 93c, 93d. The outer circumferential surface 93 is defined by a locus which is to be described by a circular arc having a center at the axis of the stationary shaft 66 when the circular arc is rotated about an axis which is located such that the circular arc is interposed between this axis and the axis of the stationary shaft 66 and which is perpendicular to the axis of the stationary shaft 66. The axis about which the circular arc is rotated to describe the above-indicated locus defining the circumferential surface 93 is an axis of a rotary shaft 94 of the concave globoidal cam 90, which will be described. The four concave globoidal cams 90a, 90b, 90c, 90d are disposed symmetrically with respect to the axis of the stationary shaft 66, such that lines of intersection of the outer circumferential surfaces 90a, 90b, 90c, 90d of the cams 90a, 90b, 90c, 90d with a plane (horizontal plane) including the axes of the cams 90 and perpendicular to the axis of the stationary shaft 66 cooperate to define a substantially continuous circle which has a center at the axis of the shaft 66. The cam grooves 92a, 92b, 92c, 92d formed in the outer circumferential surfaces 93a, 93b, 93c, 93d are substantially connected to each other.

The concave globoidal cams 90a, 90b, 90c, 90d are fixedly mounted on respective rotary shafts 94a, 94b, 94c, 94d, as shown in FIG. 3. The rotary shafts 94 are rotatably supported by respective pairs of brackets 96a, 96b, 96c, 96d fixed to the mounting structure 62 of the frame 60. The four concave globoidal cams 90a–90d have respective pairs of bevel gears 98a, 100a, 98b, 100b, 98c, 100c, 98d, 100d. The bevel gears 98, 100 of each globoidal cam 90 are formed integrally and coaxially with the cam 90, at the axially opposite ends. The bevel gears 98, 100 of the adjacent concave globoidal cams 90a–90d are held in meshing engagement with each other.

The rotary shaft 94a to which the concave globoidal cam 90a is attached has a larger axial length than the other rotary shafts 94b–94d, and is rotatably supported also by another bracket 104 fixed to the frame 60, as shown in FIG. 3. At the free end of the rotary shaft 94a, there is fixed a timing pulley 106, which is connected by a timing belt 112 to a timing pulley 110 fixed to an output shaft of an electrically operated main drive servomotor 108. When the rotary shaft 94a is rotated by the main servomotor 108, the four concave globoidal cams 90 are contemporaneously rotated in synchronization with each other, with the bevel gears 98a–98d meshing with the bevel gears 100a–100d, so that the twelve rotary plates 70 are rotated about the stationary shaft 66 or held stationary, as described below.

In the present electronic component transferring and mounting apparatus 12, the rotary plates 70 are stopped at a component sucking station, an image taking station and a component mounting station. In these stations, there are set a predetermined component sucking position, a predetermined image taking position and the component mounting position, respectively. At the component sucking position, the apparatus 12 receives the electronic components from the electronic component supply device 14, which is located on the base 60, at a position in the vicinity of the component sucking position. A CCD (charged-coupled device) camera 114 (FIG. 9) is located on the base 10, at a position corresponding to the image taking position, while the board supporting and positioning device 16 is located on the base 10, at a position corresponding to the component mounting position.

The concave globoidal cam 90a is located at a position corresponding to the component mounting position, and the concave globoidal cam 90c is located at a position corresponding to the component sucking position, while the concave globoidal cam 90d is located at a position corresponding to the image taking position. The cam grooves 92a, 92c, 92d of the cams 90a, 90c, 90d are formed or shaped such that the rotary plates 70 (cam follower rollers 88) are held stopped at the component sucking and mounting positions and the image taking position, and are decelerated and accelerated during movements thereof toward and from those three positions, and such that the rotary plates 70 are rotated at a predetermined constant angular velocity when the corresponding cam follower rollers 88 are moving into and from the cam grooves 92a, 92c, 92d. Each of the cam grooves 92a, 92c, 92d of the concave globoidal cams 90a, 90c, 90d has an inclined portion having a lead angle with respect to a plane perpendicular to the axis of the rotary shaft 94a, 94c, 94d, and a non-lead portion perpendicular to that axis. The inclined portion includes a curved section and a straight section. The cam groove 92b of the concave globoidal cam 90b has only a straight inclined portion having a lead angle with respect to a plane perpendicular to the axis of the rotary shaft 94b. This lead angle is determined to permit the rotary plates 70 to be rotated at the above-indicated constant angular velocity.

It is noted that a component container (not shown) is provided in a component discarding area between the component mounting and sucking stations of the apparatus 12. Described more specifically, the component container is provided along a circular arc path of component holder heads 120 carried by the rotary plates 70, and are located below the component holder heads 120, so that the component container accommodates electronic components which are discarded from the component holder heads 120 during rotation of the rotary plates 70 from the component mounting station to the component sucking station. Namely, the electronic components which have been sucked up by the component holder heads 120 are not mounted on the printed-circuit board 38 and discarded into the component container, if the components have not been adequately positioned with respect to suction nozzles 158 of the heads 120, that is, if the components held by the heads 120 are dislocated to such an extent that the positions of the components cannot be corrected. The components are also discarded if the kinds of the components which have been held by the heads 120 are different from those of the components that should be mounted.

Each of the twelve rotary plates 70 carries a component holder head 120, as shown in FIG. 2. Each rotary plate 70 has a pair of guide blocks 122 fixed thereto such that the guide blocks 122 are spaced apart from each other in the vertical direction. A vertical slide 124 engages the guide blocks 122 such that the vertical slide 124 is vertically slidably movable. To an upper part of the vertical slide 124, there is attached a cam follower in the form of a cam follower roller 126 such that the roller 126 is rotatable about an axis extending in the radial direction of the stationary shaft 66. To a lower part of the vertical slide 124, there is attached the component holder head 120.

A stationary cylindrical cam 128 is fixed to the underside (lower surface) of the bottom wall 67 of the frame 60, in coaxial relationship with the stationary shaft 66. The cam follower roller 126 indicated above is held in rolling engagement with a cam groove 130 formed in the inner circumferential surface of the cylindrical cam 128. The cam groove 130 has a height varying portion whose height (in the axial direction of the shaft 66) gradually varies in the circumferential direction of the cam 128, and a level portion whose height is held constant in the circumferential direction. The cam groove 130 is formed such that each component holder head 120 is placed in its upper end position when the rotary plate 70 is located at the component sucking position, and is placed in its lower end position when the rotary plate 70 is located at the component mounting position, and such that the component holder head 120 is moved in a horizontal plane when the rotary plate 70 is rotated between each of the component sucking and mounting positions and the image taking position. In the present arrangement, the vertical slides 124 are moved up and down to move the component holder heads 120 in the vertical direction when the cam follower rollers 126 are moved in rolling contact with the height varying portion of the cam groove 130, with the rotary plates 70 being rotated with the cam follower rollers 126.

Figure 6:
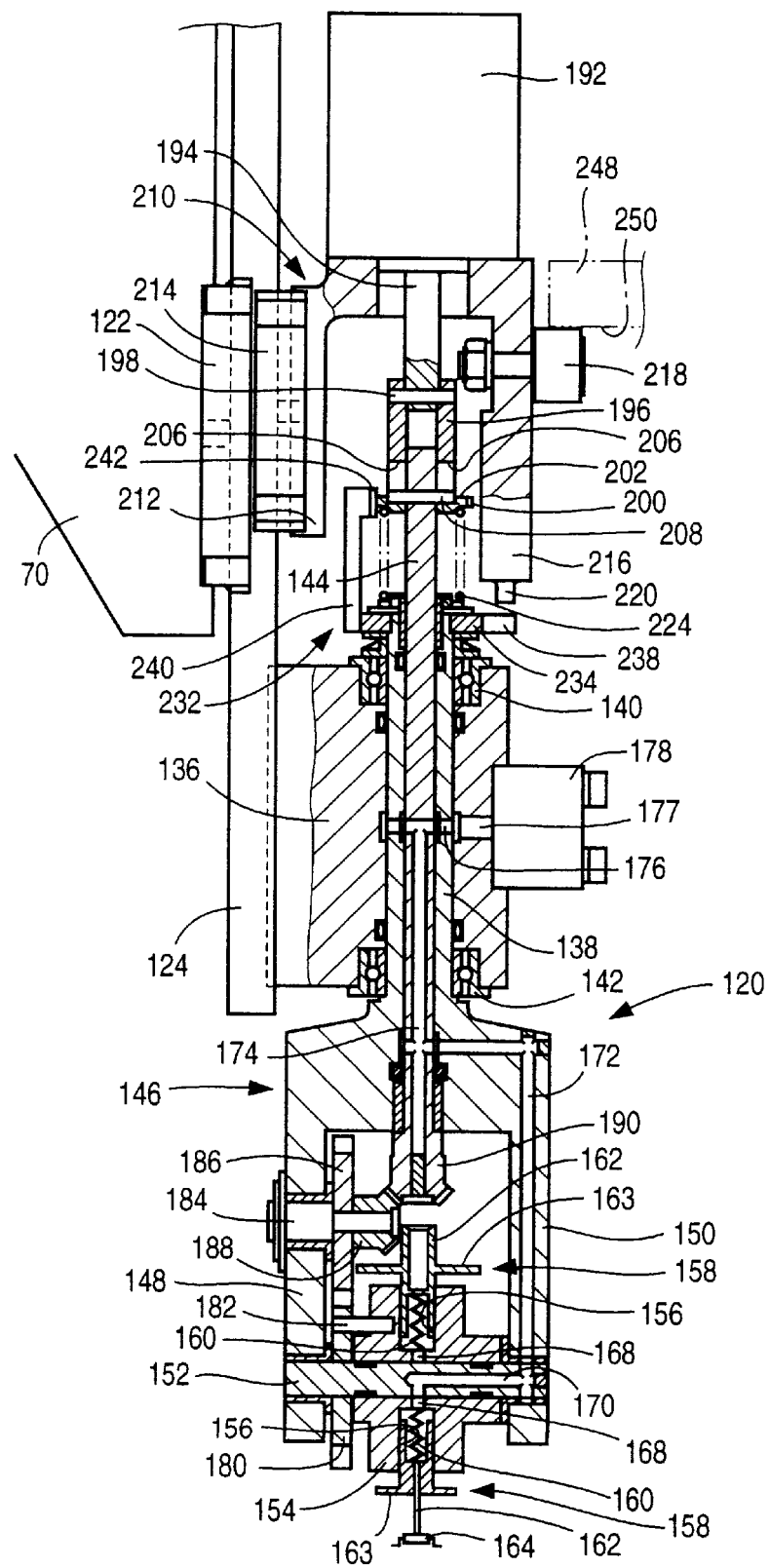
FIG. 6 is a front elevational view in cross section showing one of the component holder heads in the transferring and mounting apparatus.

As shown in FIG. 6, a bracket 136 is fixed to the lower end portion of the vertical slide 124, and a sleeve or hollow shaft 138 is supported by the bracket 136 via bearings 140, 142 such that the sleeve 138 is rotatable relative to the bracket 136 and is axially immovable relative to the bracket 136. An inner shaft 144 is fitted in the sleeve 138 such that the inner shaft 144 is rotatable, and is not axially movable, relative to the sleeve 138. A holder portion 146 which is generally U-shaped in cross section is provided at the lower end of the sleeve 138 located outside the bracket 136. The holder portion 146 has a pair of side walls 148, 150, and a support shaft 152 which is fixed at its opposite ends to the side walls 148, 150. The support shaft 152 carries a cylindrical nozzle holder 154 rotatably mounted thereon.

The nozzle holder 154 has six nozzle engaging radial holes 156 which are equi-angularly spaced from each other in the circumferential direction of the support shaft 152. The radial holes 156 accommodate respective cylindrical suction nozzles 158 such that the nozzles 158 are axially movable in the radial holes 156 and are not rotatable relative to the nozzle holder 154. The suction nozzles 158 are biased in a radially outward direction of the nozzle holder 154 by biasing means in the form of elastic members in the form of respective compression coil springs 160 accommodated in the radial holes 156. Rotation of each suction nozzle 158 in the radial hole 156 and axial movement of the suction nozzle 158 out of the radial hole 156 are prevented by engagement of a pin (not shown) provided on the suction nozzle 158 with the opposite ends of a corresponding groove (not shown) formed in the nozzle holder 154. The six suction nozzles 158 are provided for sucking up electronic components 164 of respective different sizes. The six suction nozzles 158 have respective suction tubes 162 having respective different diameters. Each of the suction nozzles 158 has a reflector plate 163. The diameter of the reflector plates 163 of the suction nozzles 158 whose suction tubes 162 have a comparatively small diameter is smaller than that of the reflector plates 163 of the suction nozzles 158 whose suction tubes 162 have a comparatively large diameter. The suction tubes 162 of the six suction nozzles 158 have the same length, so that the free ends of the suction tubes 162 lie on a circle having a center on the axis of rotation of the cylindrical nozzle holder 154.

The six suction nozzles 158 are selectively placed in an operating position by rotation of the nozzle holder 154, as described below. When a selected one of the suction nozzles 158 is in the operating position, its axis extends in the vertical direction, and the free end of its suction tube 162 is located right below the axis of the support shaft 152. The axis of the suction nozzle 158 placed in the operating position is aligned with the axis of the sleeve 138.

The suction nozzles 158 are adapted to hold the electronic component 164 by air suction. As shown in FIG. 6, passages 168, 170, 172, 174, 176, 177 are formed through the nozzle holder 154, support shaft 152, side wall 150, inner shaft 144, sleeve 138 and bracket 136, respectively. A switching device 178 is attached to the bracket 136, such that the suction nozzle 158 placed in the operated position is communicated selectively with a vacuum source (not shown) or the atmosphere by an operation of the switching device 178. The vacuum source is connected through a conduit (not shown) to a passage (not shown) formed through the stationary shaft 66, and this passage is connected through a rotary valve (not shown) to the twelve switching devices 178 through respective hoses. The rotary valve is disposed at a position of the stationary shaft 66, which is lower than the bearing arrays 74. A rotary motion of a valve drive servomotor (not shown) disposed on the support plate 68 is transmitted to the rotary valve through timing pulley and belt, so that the rotary valve is held operated at the same angular velocity as that of the constant-velocity movement of the rotary plate 70, whereby the switching device 178 is held connected to the vacuum source. When the rotary plate 70 is stopped, the switching device 178 and the rotary valve are rotated by a small angle relative to each other. This relative rotation is permitted by the elastic deformation of the hose.

Each switching device 178 has a solenoid-operated switch valve operated for selective communication of the suction nozzle 158 with the vacuum source or the atmosphere, so that the electronic component 164 is sucked up by the suction tube 158 or released therefrom. The passage 170 formed through the support shaft 152 is connected to the passage 168 which communicates with the suction nozzle 158 placed in the operating position.

Figure 9:
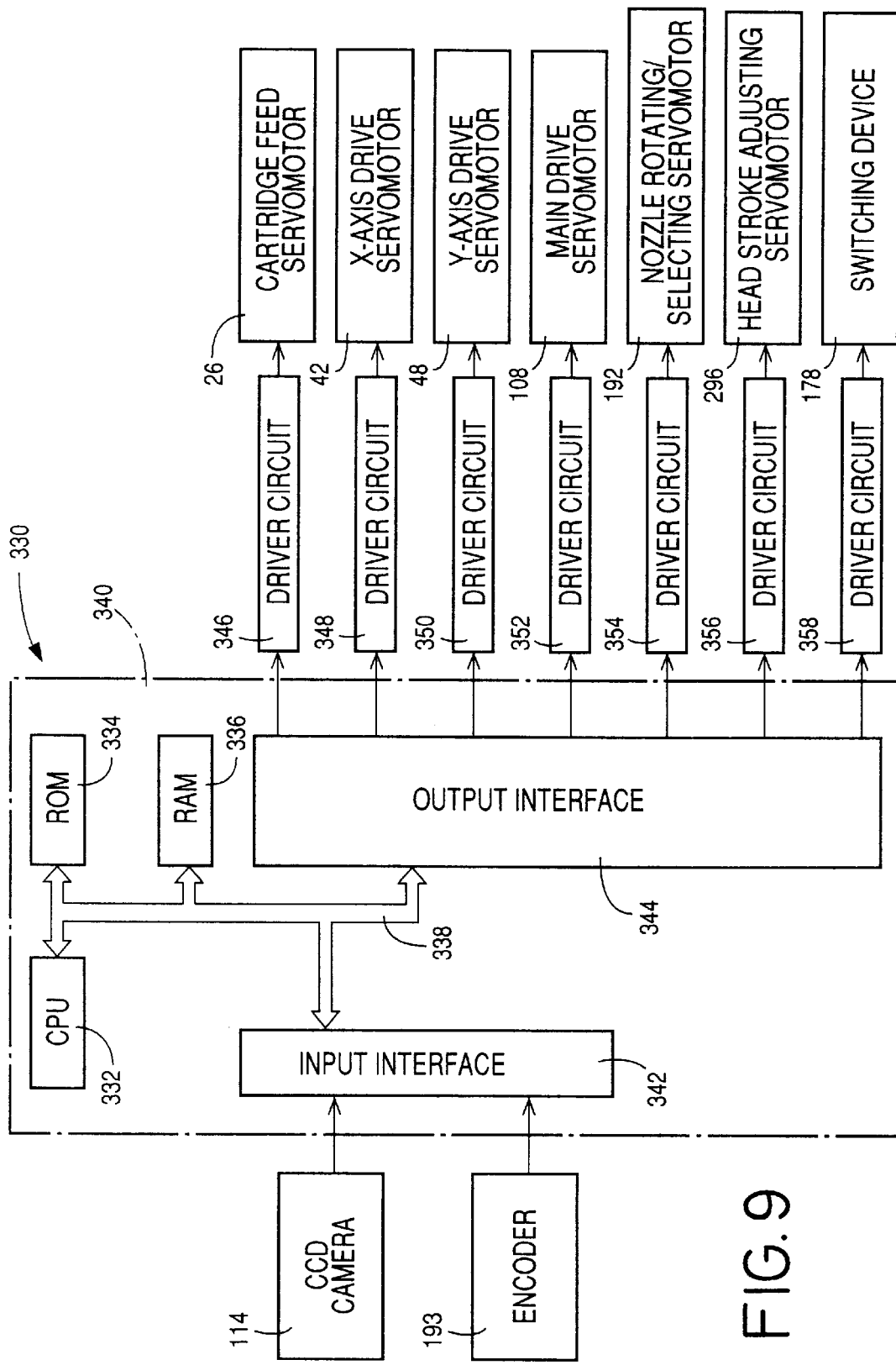
FIG. 9 is a block diagram illustrating a part of a control device for controlling the present electronic component mounting system, which part relates to the present invention.

A gear 180 is rotatably mounted on the support shaft 152, and is fixed to the nozzle holder 154 by a pin 182 such that the nozzle holder 154 is rotated with the gear 180. The gear 180 meshes with a gear 186 fixed to a support shaft 184 which is rotatably attached to the side wall 148 of the holder portion 146. The gears 180, 186 have the same diameter. The gear 186 has an integrally formed bevel gear 188, while the inner shaft 144 has a bevel gear 190 integrally formed at its lower end. The bevel gears 188, 190 mesh with each other, and have the same diameter. The upper end portion of the inner shaft 144 projects upwards from the sleeve 138, and is connected through a connecting member 196 to an output shaft 194 of a nozzle rotating/selecting servomotor 192. The inner shaft 144 is axially movable, and is not rotatable, relative to the connecting member 196. The nozzle rotating/selecting servomotor 192 is bidirectionally operated at a suitable speed, and an angle of rotation of the output shaft 194 is detected by an encoder 193 (FIG. 9).

The connecting member 196 takes the form of a sleeve which engages the output shaft 194 and is connected to the output shaft 194 through a pin 198 such that the sleeve 196 is not rotatable, or axially movable, relative to the output shaft 194. The connecting member 196 has two cutouts 206 formed in diametrically opposite portions thereof, These cutouts 206 extend in the axial direction of the connecting member 196 and are open in the lower end face of the connecting member 196. The upper end portion of the inner shaft 144 is fitted in the connecting member 196 such that the inner shaft 144 is axially movable relative to the connecting member 196. The inner shaft 144 has a pin 208 extending diametrically through its upper end portion such that the opposite end portions of the pin 208 project outwardly of the inner shaft 144. These opposite end portions of the pin 208 engage the respective cutouts 206 such that the opposite end portions of the pin 206 are movable in the cutouts 206 in the axial direction of the inner shaft 144. With the pin 206 and the cutouts 206 engaging each other, a rotary motion of the nozzle rotating and selecting servomotor 192 is transmitted to the inner shaft 144 through the connecting member 196. Thus, the pin 208 and the cutouts 206 serve as a first engaging member and a second engaging member, respectively, which engage each other and cooperate to permit the connecting member 196 and the inner shaft 144 to be connected to each other such that these connecting member 196 and inner shaft 144 are axially movable relative to each other and are not rotatable relative to each other.

A drive member 202 in the form of a ring is fitted on the inner shaft 144 such that the drive member 202 is axially movable relative to the inner shaft 144. The drive member 202 includes a portion which is concentrically and fixedly fitted in the lower end of the connecting member 196 so as to close the lower open ends of the cutouts 206. The drive member 202 has a toothed peripheral portion 200 formed by six grooves, which are formed through the thickness of the drive member 202 such that the grooves are equiangularly arranged in the circumferential direction of the drive member 202 and are open in radially outward directions, respectively.

The vertical slide 124 carries a motor support in the form of an elevator 210 on which the nozzle rotating/selecting servomotor 192 is mounted. The elevator 210 is generally U-shaped in cross section, and includes two opposed side walls 212, 216 which partly defines the U-shape. The elevator 210 has a guide block 214 fixed to the side wall 212, and is vertically slidable on the vertical slide 124 through the guide block 214. To an outer surface of the other side wall 216, there is attached a cam follower in the form of a cam follower roller 218, which is rotatable about an axis extending in the radial direction of the stationary shaft 66. The side wall 216 has a cylindrical engaging boss 220 formed on its lower end face. The engaging boss 220 has a relatively small diameter.

The elevator 210 is biased upwards by biasing means in the form of an elastic member in the form of a compression coil spring 224 interposed between the drive member 202 and the upper end of the sleeve 138 which is located above the bracket 136. That is, the elevator 210 is biased by the spring 224 in a vertical direction away from the sleeve 138. An upward movement of the elevator 210 under the biasing action of the compression coil spring 224 is limited by abutting contact of the drive member 202 with the pin 208 fixed to the inner sleeve 144. In other words, the upper stroke end position of the elevator 210 is established by this abutting contact of the drive member 202 with the pin 208. A driven member 232 is fixed to the upper end portion of the sleeve 138. The driven member 232 includes an annular portion 234 fixedly fitted on the sleeve 138. The annular portion 234 has a radial extension which extends radially outwardly in a direction away from the vertical slide 124 and which has an engaging cutout 238.

The driven member 232 further includes an arm portion 240 extending upwards from the annular portion 234. The arm portion 240 has teeth 242 formed on an inner surface thereof facing the inner shaft 144. The teeth 242 provide a part of an internally threaded gear, which cooperates with the toothed peripheral portion 200 of the drive member 202 to constitute a claw clutch. When the elevator 210 is placed in its upper stroke end position under the upward biasing action of the compression coil spring 224, the toothed peripheral portion 200 of the drive member 202 is held in meshing engagement with the teeth 242 of the arm portion 240 of the driven member 232, such that the toothed peripheral portion 200 and the teeth 242 are movable relative to each other in the axial direction of the sleeve 138 and are not rotatable relative to each other, whereby the sleeve 138 and the inner shaft 144 are not rotatable relative to each other. In this condition, the engaging boss 220 provided on the elevator 210 is aligned with the engaging cutout 238 formed through the driven member 232, in the circumferential direction of the sleeve 138, and the engaging boss 220 is engageable with the cutout 238 when the elevator 210 is moved down. This position in which the boss 220 is engageable with the cutout 238 will be referred to as an "original circumferential position" of the sleeve 138 and the component holder head 120. In this original circumferential position, the horizontal axis of the support shaft 152 rotatably supporting the nozzle holder 154 extends in the radial direction of the stationary shaft 66 (axis of rotation of the rotary plate 70), which is parallel to the plane of the rotary plate 70.

A stationary nozzle selecting cam 248 is located in an area which is between the component discarding area and the component sucking station and in which the rotary plates 70 are rotated at the predetermined constant velocity while the component holder heads 120 are moved in a horizontal plane maintaining a constant height. The nozzle selecting cam 248 has a cam surface 250 which is elongated in the rotating direction of the rotary plates 70, along a circular arc having a center at the axis of the stationary shaft 66. The cam surface 250 consists of a downwardly inclined region, a level region, and an upwardly inclined region, which are arranged in the rotating direction of the rotary plates 70. The downwardly inclined region is inclined downwards in the rotating direction of the rotary plates 70, namely, in the direction toward the level region. The level region extends from the downward or lowest end of the downwardly inclined region, at the same level or height as the lowest position at the downward end of the downwardly inclined region. The upwardly inclined region extends from the opposite end of the level region remote from the downwardly inclined region, and is inclined upwards in the rotating direction of the rotary plates 70, namely, in the direction away from the level region. As the cam follower roller 218 is moved in rolling contact with the downwardly inclined region of the cam surface 250, the elevator 210 is moved downwards. The elevator 210 is held level while the cam follower roller 218 is moved in rolling contact with the level region. As the roller 218 is moved in rolling contact with the upwardly inclined region, the elevator 210 is permitted to be moved upwards. The height of the nozzle selecting cam 248 is determined such that the downwardly inclined region of the cam surface 250 is engageable with the cam follower roller 218 when the elevator 210 is placed in its upper stoke end position. The initial portion of the downwardly inclined region is shaped to have a part-cylindrical surface, for facilitating the engagement with the roller 218. The elevator 210 is placed in its lower stroke end position while the roller 218 is in rolling contact with the level region of the cam surface 250 of the cam 248.

While a certain rotary plate 70 is moved from the image taking position toward the component mounting position, the nozzle rotating/selecting servomotor 192 is actuated in a controlled manner to correct a positioning error of the electronic component 164 held by the component holder head 120, more specifically, to remove a deviation of the angular position of the electronic component 164 about the axis of the suction tube 162. While the rotary plate 70 is located between the image taking position and the component mounting position, the sleeve 138 and the inner shaft 144 are connected to each other through engagement of the teeth 242 of the driven member 232 with the toothed peripheral portion 200 of the drive member 200, as shown in FIG. 6, so that a rotary motion of the nozzle rotating/selecting servomotor 192 is transmitted to the sleeve 138 through the connecting member 196, drive member 202 and driven member 232. A rotary motion of the sleeve 138 causes a rotary motion of the suction nozzle 158 placed in the operating position, about its axis, whereby the electronic component 164 held by suction on the end face of the suction tube 162 is rotated about the axis of the suction tube 162, by an amount suitable to remove the angular positioning error of the component 164. This amount of rotation of the component 164 is calculated on the basis of angular positioning data obtained from an output of the CCD camera 144 at the image taking position.

It is noted that the inner shaft 144 is rotated with the sleeve 138, whereby the meshing position of the two bevel gears 188, 190 remains unchanged, so that the bevel gear 188 remains stationary, and the nozzle holder 154 is prevented from being rotated about the axis of the support shaft 152, to thereby prevent changing the suction nozzle 158 placed in the operating position.

As a result of rotation of the sleeve 138, the engaging cutout 238 formed in the driven member 232 is offset from the engaging boss 220 provided on the elevator 210, in the rotating direction of the sleeve 138. After the electronic component 164 is mounted on the printed-circuit board 38 and while the rotary plate 70 is rotated toward the component discarding area, the sleeve 138 is rotated in the direction opposite to the direction of the rotation effected to remove the angular positioning error of the component 164, by the same amount as in the removal of the angular positioning error, so that the engaging cutout 238 is brought into alignment with the engaging boss 220 in the circumferential or rotating direction of the sleeve 138.

Figure 7:
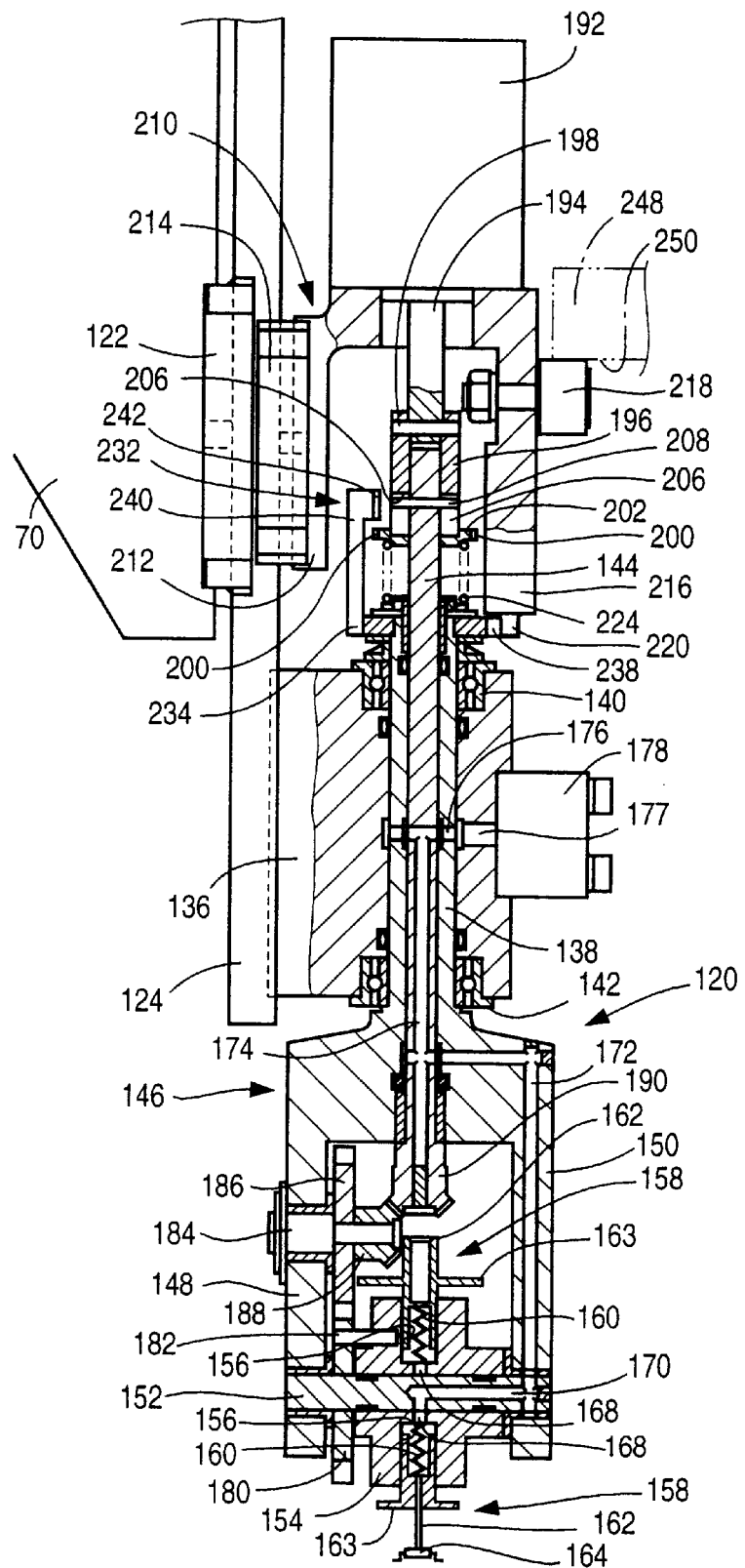
FIG. 7 is a front elevational view in cross section of the component holder head of FIG. 6 placed in an operating state in which a sleeve and an inner shaft are disconnected from each other.

While the rotary plate 70 is rotated from the component discarding area toward the component sucking station, with the component holder head 120 being moved at the constant velocity while maintaining the same height, the cam follower roller 218 is brought into engagement with the cam surface 250 of the nozzle rotating/selecting cam 248. Described in detail, the roller 218 initially contacts the downwardly inclined region of the cam surface 250, pushing down the elevator 210 against the biasing force of the compression coil spring 224. As a result, the teeth 242 of the driven member 232 is disengaged from the toothed peripheral portion 200 of the drive member 202, and the sleeve 138 is disengaged from the inner shaft 144, as shown in FIG. 7. Before the driven member 232 and the drive member 202 are completely disengaged from each other, the engaging boss 220 on the elevator 210 is moved into the engaging cutout 238 formed in the driven member 232, whereby the sleeve 138 is prevented from rotating and is held in the original circumferential position. The sleeve 138 is returned to the original circumferential position before the cam follower roller 218 is brought into contact with the cam surface 250, that is, before an operation to select the suction nozzle 158 is initiated. Consequently, the engaging boss 220 can be moved into the engaging cutout 238 to prevent rotation of the sleeve 138 when the elevator 210 is moved down by the cam follower roller 218. While the rotary plate 70 is rotated after the driven member 232 and the drive member 202 are disengaged from each other, the roller 218 is held in contact with the level region of the cam surface 250, so that the sleeve 138 and the inner shaft 144 are held disengaged from each other with the driven and drive members 232, 202 being held disengaged from each other.

When it is desired to change the suction nozzle 158 used to hold the electronic component 164, the nozzle rotating/selecting servomotor 192 is actuated in the state shown in FIG. 7. As a result, only the inner shaft 144 is rotated, and a rotary motion of the inner shaft 144 is transmitted to the nozzle holder 154 through the bevel gears 188, 190 and the gears 180, 182, so that the nozzle holder 154 is rotated about the axis of the support shaft 152 to place a desired one of the six suction nozzles 158 in the operating position. The suction nozzle 158 currently placed in the operating position can be determined by the angle of and direction of rotation of the inner shaft 144, and the kind of the suction nozzle 158 that should be used for holding the next electronic component 164 can be determined according to a component mounting program which is formulated to mount various electronic components 164 in a predetermined order on the printed-circuit board 38. The angle and direction of rotation of the servomotor 192 can be determined based on the determined kind of the suction nozzle 158 currently placed in the operating position and the determined kind of the electronic component 164 to be mounted next. Thus, the appropriate suction nozzle 158 is brought into the operating position by an operation of the servomotor 192. The direction of rotation of the servomotor 192 is determined so as to reduce the angle of rotation of the nozzle holder 154 required to select the desired suction nozzle 158.

Since the bevel gears 189, 186 have the same diameter while the gears 180, 182 have the same diameter, the nozzle holder 154 is rotated by the same angle as the inner shaft 144. The teeth of the bevel gears 188, 190 and gears 180, 186 are accurately shaped to minimize an amount of gear backlash, so that the desired suction nozzle 158 can be positioned at the operating position with high accuracy by rotation of the servomotor 192 by the determined angle.

When only the inner shaft 144 is rotated, the sleeve 138 is prevented from rotating by engagement of the engaging boss and cutout 220, 238, so that the sleeve 138 is not rotated through friction between the sleeve 138 and the inner shaft 144, that is, so that the nozzle holder 154 is rotated about the horizontal axis which extends in the radial direction of the stationary shaft 66 and which is parallel to the plane of the rotary plate 70.

During an operation to select the desired suction nozzle 158, the elevator 210 is held in its lower stroke end position with the cam follower roller 218 held in rolling contact with the level region of the cam surface 250 of the cam 248, so that the inner shaft 144 and the sleeve 138 are held disengaged from each other. After the desired suction nozzle 158 has been selected, the roller 218 is brought into contact with the upwardly inclined region of the cam surface 250. As the rotary plate 70 is further rotated, the elevator 210 is gradually elevated by the compression coil spring 224. As a result, the teeth 242 of the driven member 232 are brought into engagement with the toothed peripheral portion 200 of the drive member 202, and the engaging boss 220 is disengaged from the engaging cutout 238, whereby the sleeve 138 and the inner shaft 144 are connected to each other for simultaneous rotation, and the sleeve 138 is disengaged from the elevator 210. The teeth 242 are brought into engagement with the toothed peripheral portion 202 before the boss 220 is disengaged from the cutout 2238. Since the sleeve 138 is prevented from rotating during rotation of the inner shaft 144 to select the suction nozzle 158, the teeth 242 can engage the toothed peripheral portion 200 of the drive member 202 which has been rotated during the operation to select the suction nozzle 158. Since the bevel gears 188, 190 have the same diameter and the gears 180, 186 have the same diameter, the nozzle holder 154 is rotated by the same angle as the inner shaft 144 during a nozzle selecting operation to select the suction nozzle 158. The toothed peripheral portion 242 consists of six grooves. The angular phase of the toothed peripheral portion 200 in which the teeth 200 engage the portion 200 after the nozzle selecting operation is offset from that before the nozzle selecting operation, by the angle of rotation of the nozzle holder 154 during this operation.

The selection of the desired suction nozzle 158 as described above is effected before the electronic component 164 is sucked up by the component holder head 120. When the rotary plate 70 reaches the component sucking position, the desired suction nozzle 158 for holding the next component 164 has been placed in the operating position. At this time, the head 120 is placed in the original circumferential position. When the angular position of the electronic component 164 as held by the suction nozzle 158 is corrected, the head 120 is rotated from the original circumferential position in the forward or reverse direction.

As described above, the nozzle rotating/selecting servomotor 192 provided on the component holder head 120 is used as the drive source for selecting the desired suction nozzle 158 and for removing an angular positioning error of the component 164 held by the head 120. This arrangement makes it possible to effect the above operations during rotation of the component holder head 120 about the stationary shaft 66, and allows for a relatively long time in which these operations should be completed. Accordingly, the present arrangement is effective to reduce the angular velocity upon rotation of the suction nozzle 158 about its axis, and prevent or minimize the vibration which would take place during the operations to select the suction nozzle 158 and correct the angular position of the component 164. The present arrangement is also effective to increase the maximum angle of rotation of the nozzle holder 154. Further, since the servomotor 192 is used not only as the drive source for selecting the suction nozzle 158 but also as the drive source for correcting the angular position of the component 164, these operations can both be performed during movement of the head 120 about the stationary shaft 66, whereby the electronic component transferring and mounting apparatus 12 can be simplified in construction, and manufactured with a reduced weight and at a reduced cost.

Figure 8:
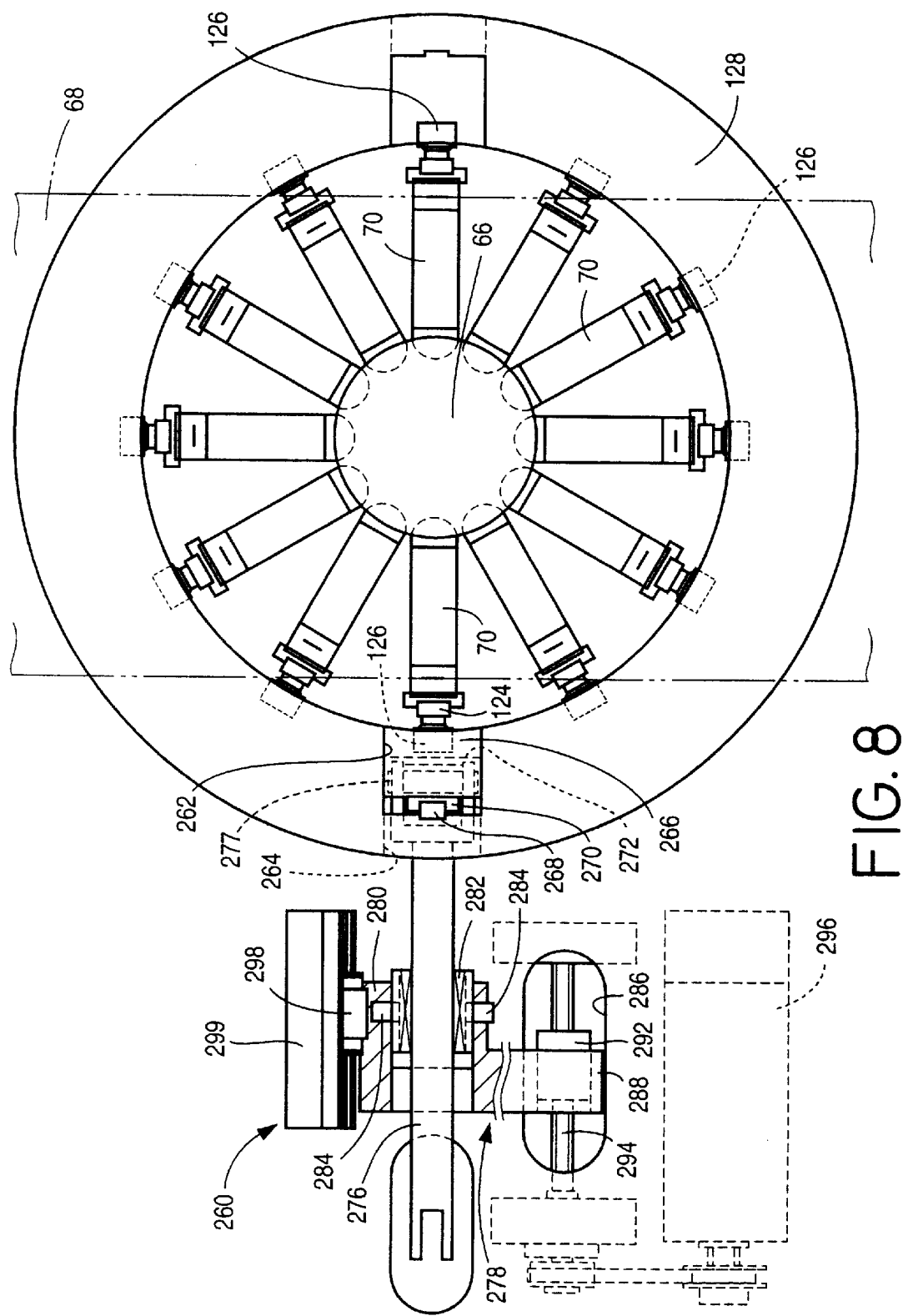
FIG. 8 is a bottom plan view showing a head elevating and lowering device and a stationary cylindrical cam in the transferring and mounting apparatus.

At two positions corresponding to the component sucking and mounting positions of the frame 60, there are disposed two head elevating and lowering devices 260 as shown in FIGS. 2 and 8. More precisely, these figures show the head elevating and lower device 260 disposed at the position corresponding to the component mounting position. FIG. 8 is a bottom plan view of the device 260 as seen from under the frame 60. Since the two head elevating and lower devices 260 have the same construction, the device 260 at the position corresponding to the component mounting position of the frame 60 will be explained.

The stationary cylindrical cam 128 has an engaging groove 262 formed at a circumferential position thereof corresponding to the component mounting position. This groove 262 is open in the inner circumferential surface and the upper and lower surfaces of the cylindrical cam 128, as shown in FIGS. 2 and 8. The cam 128 further has a radial opening 264, which is formed through an upper part of a radially outer portion of the cam 128 in the radial direction, for communication with the engaging groove 262. A vertically movable member 266 is vertically movably received in the groove 262. The cam 128 further has a straight guide rail 268 formed on the bottom wall of the groove 262 in the vertical direction (in the axial direction of the cam 128). On the other hand, a pair of guide blocks 270 are fixed to the vertically movable member 266. These guide blocks 270 slidably engage the guide rail 168.

A lower portion of the vertically movable member 266 has a circumferential dimension (as measured in the circumferential direction of the cylindrical cam 128), which is determined to provide a small clearance between that lower portion and the inner surfaces of the groove 262, for permitting the vertically movable member 266 to move vertically in the groove 262. A groove 272 is formed through this lower portion of the vertically movable member 266, such that the groove 272 is open in the inner surface of the member 266 corresponding to the inner circumferential surface of the cylindrical cam 128, and extends in a horizontal plane in a direction parallel to a tangent line at a circumferential point of the cam groove 130 corresponding to the component mounting position.

The vertically movable member 266 has an upper portion whose circumferential dimension is smaller than that of the lower portion described above. This upper portion is pivotally connected at an upper part thereof to a forked end portion of a lever 276 through a pin 277. The lever 276 extends through the radial opening 264 and projects radially outwardly from the outer circumferential surface of the cam 128. The lever 276 is supported at an intermediate portion thereof by a support portion 280 of a support member 278 through a bearing 282 such that the support member 278 is moved relative to the lever 276 in the longitudinal direction of the lever 276. The bearing 282 has two support pins 284 formed on two side surfaces thereof parallel to the longitudinal direction of the lever 276, such that the support pins 284 extend perpendicularly to the longitudinal direction of the lever 276, as shown in FIG. 8. These support pins 284 function as a shaft portion which rotatably engages the support portion 280 of the support member 278, so that the lever 276 is pivotable together with the bearing 282, about the axis of the support pins 284.

As shown in FIG. 8, the support member 278 has an arm portion 288 extending horizontally from the support portion 280 and projecting into the interior of the frame 60 through an elongate hole 286 formed through the frame 60. The arm portion 288 carries a nut 292 fixed at its free end within the frame 60. The nut 292 engages a feed screw 294, which is rotated by a head stroke adjusting servomotor 296 for moving the support member 270 in the longitudinal direction of the lever 276. A movement of the support member 278 in the longitudinal direction of the lever 276 causes a longitudinal movement of the bearing 282 and the support pins 284 relative to the lever 276, whereby the pivoting axis of the lever 276 is changed in the longitudinal direction of the lever 276, to thereby change the vertical stroke of the vertically movable member 266. Thus, the feed screw 294 and the servomotor 296 constitute a major portion of a device for changing the vertical stroke of the vertically movable member 266. A guide block 298 is fixed to the support portion 280. This guide block 298 is in sliding contact with a guide rail 299 fixed to the frame 60, so that the support member 278 is guided by the guide block 298 and the guide rail 299.

As shown in FIG. 2, a generally L-shaped lever 300 is rotatably supported by a shaft 302 fixed to the frame 60. The lever 300 has an arm 303 whose free end is pivotally connected to an upper end portion of a rod 304 through a pin 306. The upper end portion of the rod 304 is movable relative to the pin 306 in the axial direction of the pin 306. The rod 304 extends through an elongate hole 305 formed through the mounting structure 62, and the lower end of the rod 304 is pivotally connected through a pin 308 to an end portion of the lever 276 remote from the end portion connected to the vertically movable member 266.

The generally L-shaped lever 300 has another arm 312 which carries a cam follower roller 314 pivotally attached at its free end portion. The lever 300 is biased by biasing means in the form of an elastic member in the form of a tension coil spring 316 so that the cam follower roller 314 is held in rolling contact with a cam surface 320 of a head elevating and lowering cam 318 which is rotatably attached to the frame 60.

The head elevating and lowering cam 318 is supported by a support shaft 322 which is rotatably supported by the frame 60. As shown in FIG. 3, a timing pulley 324 is fixedly mounted on the support shaft 322, and the timing pulley 324 is connected through the timing belt 112 to the timing pulley 110 fixed to the output shaft of the main drive servomotor 108. Thus, the head elevating and lowering cam 318 is driven by the same servomotor 108 as used for driving the concave globoidal cams 90a–90d. The diameter of the timing pulley 324 is determined so that the cam 318 is rotated through 360° for a component mounting time interval equal to a time interval at which the rotary plates 70 are successively stopped at the component mounting position.

While FIG. 2 shows that the head elevating and lowering cam 318 has the cam surface 320 which has a circular shape, the cam 318 actually has a heart-like shape in cross section, so that a rotary motion of the cam 318 causes the lever 300 to be pivoted to vertically move the rod 304 for thereby pivoting the lever 276 so as to vertically move the vertically movable member 266. Since the rod 304 and the vertically movable member 266 are connected to the opposite ends of the lever 276 on the opposite sides of the support pins 284, the member 266 is moved down while the rod 304 is moved up, and vice versa. The lowermost and uppermost positions of the rod 304 are determined by the profile of the cam surface 320. Described more specifically, the lowermost position of the rod 304 is adjusted by adjusting the axial position of the rod 304 so that the groove 272 formed through the vertically movable member 266 is aligned or contiguous with the cam groove 130 in the cylindrical cam 128 in the vertical direction, so as to form a horizontal groove, and so that the lever 276 has a horizontal attitude parallel to the feed screw 294 and the guide rail 299 when the rod 304 is placed in the lowermost position. The uppermost position of the vertically movable member 266 is determined by the lowermost position of the rod 304 determined as described above. In the uppermost position of the vertically movable member 266, this member 266 cooperates with the adjacent portions of the cam groove 130 to hold the component holder head 120 at the uppermost position for a predetermined time. To mount the electronic component 164 on the printed-circuit board 38 when the rotary plate 70 is located at the component mounting position of the cylindrical cam 128, the vertically movable member 266 disposed at the position corresponding to the component mounting position is first lowered from the uppermost position to the lowermost position and then elevated back to the uppermost position. The member 266 is held at the uppermost position at the positions other than the component mounting position.

As is apparent from the above description, the lever 276 is parallel to the guide rails 299 for guiding the support member 278 when the vertically movable member 266 is placed in the uppermost position with the rod 304 moved to the lowermost position. In this condition, the support member 278 is moved as needed, in the direction parallel to the guide rails 299, to change the position of the pivoting axis of the lever 276. Thus, the operating stroke of the vertically movable member 266 can be changed by changing the lowermost position of the member 266, without changing the uppermost position of the member 266.

The electronic component transferring and mounting apparatus 12 is controlled by a control device 330 illustrated in the block diagram of FIG. 9. The control device 330 is constituted principally by a computer 340 incorporating a central processing unit (CPU) 332, a read-only memory (ROM) 334, a random-access memory (RAM) 336, and a bus 338 connecting these elements 332, 334, 336. To the bus 338, there is connected an input interface 342 which receives an output of the CCD camera 114. Also connected to the bus 338 is an output interface 344 which is connected to the cartridge feed servomotor 26, X-axis drive servomotor 42, Y-axis drive servomotor 48, main drive servomotor 108, nozzle rotating/selecting servomotor 192, head stroke adjusting servomotor 296, and switching device 178, through respective driver circuits 346, 348, 350, 352, 354, 356 and 358. The ROM 334 stores various control programs such as those for sucking up the electronic component 164, taking an image of the component 164 and mounting the component 164 on the printed-circuit board 38.

When the electronic components 164 are mounted on the printed-circuit board 38 in the electronic component mounting system including the transferring and mounting apparatus 12, the four concave globoidal cams 90a–90d are concurrently rotated by the main drive servomotor 108 to rotate and stop the twelve rotary plates 70 such that the acceleration, deceleration, constant-velocity movement and stopping of the rotary plates 70 are effected independently of each other. The rotary plates 70 are stopped at the component sucking position, image taking position and component mounting position, so that the electronic components 164 are sucked up by the heads 120 at the component sucking position, subjected to an image taking operation at the image taking position, and mounted on the board 38 by the heads 120 at the component mounting position.

The operation for the component holder head 120 to hold the electronic component 164 will be first explained.

When a given rotary plate 70 is rotated about the stationary shaft 66 toward the component sucking position, the cam follower roller 126 in rolling contact with the cam groove 130 is moved into the groove 272 formed through the vertically movable member 266 received in the groove 262 formed in the cylindrical cam 128. The roller 126 is moved from the cam groove 130 into the groove 272 before the rotary motion of the rotary plate 70 to the component sucking position is completed. After the cam follower roller 126 has been moved into the groove 272 and before the rotary plate 70 is stopped at the component sucking position, a downward movement of the vertically movable member 266 from the uppermost position is initiated, whereby the roller 126 lowered as the member 266 is lowered. As a result of the downward movement of the roller 126, the vertical slide 124 is lowered, and the component holder head 120 is accordingly lowered. Thus, a movement of the head 120 about the stationary shaft 66 and a downward movement of the head 120 are effected contemporaneously.

As a result of the downward movement of the head 120, the suction tube 162 of the suction nozzle 158 is brought into contact with the upper surface of the electronic component 164, and the switching device 178 is switched to a position in which the electronic component 164 is attracted under suction to the lower end of the suction tube 162. The rotary plate 70 has been stopped at the component sucking position when the suction tube 162 is brought into contact with the electronic component 164, so that the component 158 can be attracted to the suction tube 162 with high reliability. After the component 164 is sucked up by the head 120, the vertically movable member 266 is moved up, and the cam follower roller 126 is accordingly moved up, whereby the vertical slide 124 is elevated to elevate the head 120, so that the component 164 sucked up by the suction nozzle 158 is picked up from the cartridge 22.

After the component 164 is picked up from the cartridge 22 by the head 120, the rotation of the rotary plate 70 about the stationary shaft 66 is resumed before the vertically movable member 266 has reached its uppermost position and before the groove 272 has been aligned with the cam groove 130. The roller 126 is elevated in rolling contact with the groove 272 in the member 266, and is moved from the groove 272 into the cam groove 130 of the cylindrical cam 128 immediately after the member 266 has reached the uppermost position. Thus, the head 120 is simultaneously elevated and rotated after the component 164 is sucked up from the cartridge 22.

Upon sucking of the electronic component 164, the vertical stroke of the head 120 is changed as needed if necessary, depending upon the height dimension or level of the upper surface of the electronic component 164. The upper surfaces of the electronic components 164 may have different levels depending upon the height dimensions of the components 164, where a component accommodating portion of a component holder tape in the component supply cartridge 22 is supported by a body of the cartridge 22 which is located below the component accommodating portion.

The component holder tape has a multiplicity of component accommodating recesses in which the components 164 are accommodated. These recesses are closed by an upper covering tape to prevent removal of the components 164 from the recesses. The thickness of the component holder tape increases with an increase in the height dimension of the components 164. However, the height of the tape guiding surface of the body of the cartridge 22 is constant, so that the level of the upper surface of the component 164 is raised as the height dimension of the component 164 increases. Consequently, the vertical stroke of the component holder head 120 should be reduced with an increase in the height dimension of the electronic component 164 to be sucked up by the head 120. This adjustment of the vertical operating stroke of the head 120 is effected before the component 164 is sucked up by the suction nozzle 158. To this end, the head stroke adjusting servomotor 296 is actuated to move the support member 278 in the longitudinal direction of the lever 276, for thereby changing the position of the pivoting axis of the lever 276. For reliable attraction of the component 164 to the suction tube 162 of the suction nozzle 158, the vertical stroke of the head 120 is accurately determined on the basis of not only the distance between the lower end face of the suction tube 162 of the head 120 and the upper surface of the component 164, but also a height error of the component 164 due to a positioning error associated with the electronic component supply device 12. An excessive downward movement of the suction nozzle 158 may be accommodated or absorbed by compression of the coil spring 160 biasing the suction nozzle 158.

After the electronic component 164 has been held by the head 120, the rotary plate 70 is rotated to the image taking position, at which the rotary plate 70 is stopped so that the component 164 sucked up by the suction nozzle 158 is held stationary. In this condition, an image of the component 164 is taken by the CCD camera 114. On the basis of an output of the CCD camera 114, an angular position error, and X-axis and Y-axis position errors of the component 164 are calculated. The angular position of the component 164 is adjusted to remove the angular position error before the rotary plate 70 has reached the component mounting position. To this end, the nozzle rotating/selecting servomotor 192 is actuated to rotate the sleeve 138 and the inner shaft 144 so that the suction nozzle 158 placed in the operating position is rotated about its axis to rotate the component 164 by an angle suitable to remove the angular position error.

Before an operation to mount the electronic component 164 on the printed-circuit board 38, an image of a fiducial mark provided on the board 38 is taken to calculate X-axis and Y-axis positioning errors of the board 38 for each of the component mounting positions. When the electronic components 164 are mounted on the printed-circuit board 38, the board 38 are moved in the X-axis and Y-axis directions, so that the locations at which the electronic components 164 are mounted are right under the component holder head 120 located at the component mounting position. On the basis of the calculated positioning errors of the board 38 and the X-axis and Y-axis position errors of the component 164, the distances of movement of the board 38 in the X-axis and Y-axis directions are adjusted to mount the component 164 at the nominal X-axis and Y-axis positions on the board 38.

When the rotary plate 70 is rotated toward the component mounting position, the cam follower roller 126 is moved from the cam groove 130 of the cylindrical cam 128 into the groove 272 in the vertically movable member 266 at the component mounting position. After the roller 126 has entered the groove 272 and before the rotary plate 70 has reached the component mounting position, a downward movement of the vertically movable member 266 is initiated to lower the component holder head 120 while the head 120 is rotated toward the component mounting position. The rotary plate 70 has been stopped at the component mounting position before the component 164 is mounted on the printed-circuit board 38. Namely, the head 120 is further lowered to mount the component 164 at the predetermined point on the board 38 after the rotary plate 70 has reached the component mounting position.

The vertical operating stroke of the head 120 is changed depending upon the height dimension of the component 164 when the component 164 is mounted on the board 38. The stroke of the head 120 is reduced as the height dimension of the component 164 increases. Precisely, the stroke of the head 120 should accommodate positioning errors such as dimensional and positioning errors in the manufacture of the board supporting and positioning device 16, for example, so that the electronic components 164 can be accurately mounted on the board 38. After the component 164 has been placed at the predetermined point on the board 38, the switching device 178 is switched to a position to stop the application of a vacuum pressure to the suction nozzle 158, whereby the component 164 is released from the suction nozzle 158. After the component 164 is mounted on the board 38, the vertically movable member 266 is elevated to elevate the head 120. In this case, too, the rotation of the rotary plate 70 is resumed before the member 266 has reached the uppermost position, so that the roller 126 is elevated while it is moved in rolling contact with the groove 272. Immediately after the vertically movable member 266 has reached the uppermost position, the roller 126 is moved into the cam groove 120, and the rotary plate 70 is rotated toward the component sucking position.

While the rotary plate 70 is rotated form the component mounting position toward the component sucking position, the sleeve 138 is rotated in the direction opposite to the direction in which the sleeve 138 was rotated to correct the angular position of the component 164 before mounting thereof on the board 38. The amount of rotation of the sleeve 138 at this time is the same as that for correcting the angular position of the component 164, so that the sleeve 138 and the head 120 are returned to their original circumferential position.

In the event of some error at the component sucking position, the vertical stroke of the vertically movable member 266 at the component mounting position is reduced to a minimum value to avoid drawbacks described below. Such component sucking error may be a failure of the suction nozzle 158 to pick up the component 164, an erroneous operation of picking up of the wrong component 164, or an excessively large error of the angular position of the sucked component 164 that cannot be removed. In such event, the vertical stroke of the head 120 is reduced to a smallest value to prevent abutting contact of the suction nozzle 162 of the suction nozzle 158 (without the component 164 being attracted thereto) or the wrong component 164 with the printed-circuit board 38 when the head 120 is lowered to the lowermost position at the component mounting position. In this case, the switching device 178 is not switched at the component mounting position, and the vacuum pressure is kept applied to the suction nozzle 158, so that the component 164 is carried by the head 120 to the component discarding area. In the component discarding area, the switching device 178 is actuated to stop of the application of the vacuum pressure to the suction nozzle 158, for discarding the component 164 into the component container. Where the suction nozzle 158 fails to pick up the electronic component 164, this failure may be detected on the basis of the image taken at the image taking position. In this case, the switching device 178 is actuated to stop the application of the vacuum pressure to the suction nozzle 158.

When the rotary plate 70 is further rotated, the cam follower roller 218 provided on the elevator 210 is brought into engagement with the cam surface 250 of the nozzle selecting cam 248, so that the sleeve 138 is disconnected from the inner shaft 144. If the kind of the suction nozzle 156 is changed, the nozzle rotating/selecting servomotor 192 is operated to rotate the nozzle holder 154 so that the suction nozzle 156 to be used next is brought into the operating position.

As described above, there are three stop positions at which the rotary plate 70 is stopped. Between the component sucking position and the image taking position, and between the image taking position and the component mounting position, the rotary plate 70 is rotated through 90°, with acceleration, constant-velocity movement and deceleration. Between the component mounting and sucking positions, the rotary plate 70 is rotated through 180° at a constant velocity.

Figure 5:
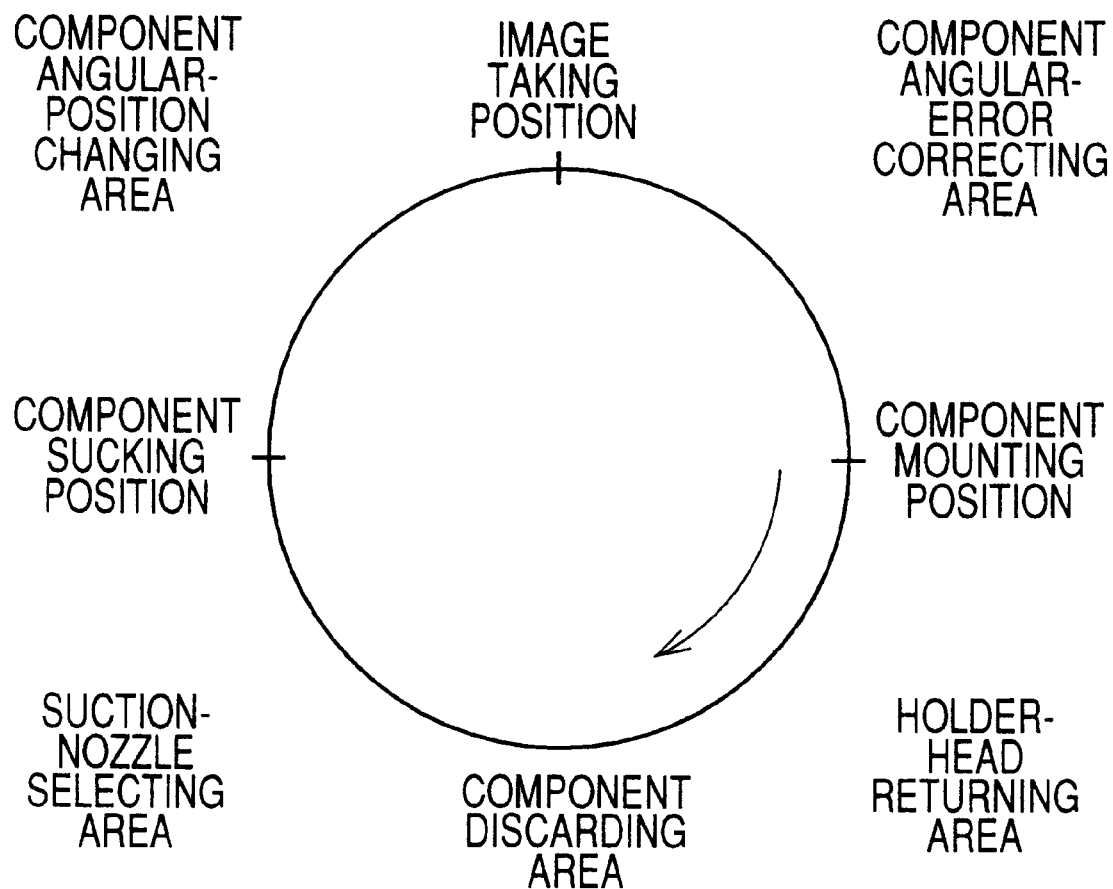
FIG. 5 is a view indicating three positions at which component holder heads are stopped in the transferring and mounting apparatus.

When the suction nozzle 158 sucks the electronic component ("EC") 164, the rotary plate 70 is stopped at the component sucking position shown in FIG. 5. After the sucking of the EC 164, the rotary plate 70 is rotated to the image taking position. If the position of the EC 164 about the axis line of the suction nozzle 158 (hereinafter, referred to as the "angular position" of the EC 164) is needed to be changed between when the EC 164 is sucked by the suction nozzle 158 and when the EC 164 is mounted on the PC board 38, the angular position of the EC 164 is changed by rotating the suction nozzle 158 holding the EC 164 while the rotary plate 70 is rotated from the component sucking position to the image taking position. As shown in FIG. 5, a component angular-position changing area is provided between the component sucking position and the image taking position. The amount (i.e., angle) of changing of the angular position of the EC 164 is, for example, 90° or 180° and is much greater than the positional error of the EC 164 about the axis line of the suction nozzle 158 (hereinafter, referred to as the "angular error") of the EC 164) that is produced when the EC 164 is sucked by the nozzle 158. The control device 330 or the CPU 332 obtains, from the EC mounting program pre-stored in the ROM 334, information about whether or not the angular position of each EC 164 needs to be changed and by what angle the angular position of the EC 164 needs to be changed.

Except when one of the suction nozzles 158 is selected while the rotary plate 70 is moved in a suction-nozzle selecting area between the component discarding area and the component sucking position, the engaging grooves 200 of the drive member 202 and the engaging projection of the driven member 232 are held in engagement with each other. Therefore, when the nozzle rotating/selecting servomotor 192 is activated to change the angular position of the EC 164, the inner shaft 144 is rotated and simultaneously the rotation of the servomotor 192 is transmitted to the sleeve 138 via the connecting member 196, the drive member 202, and the driven member 232. Thus, the sleeve 138 is also rotated. Since the axis line of the suction nozzle 158 being positioned at the operating position is aligned with the axis line of the sleeve 138, the suction nozzle 158 holding the EC 164 is rotated about the axis line thereof when the sleeve 138 is rotated. Thus, the angular position of the EC 164 is changed as needed.

When the sleeve 138 is rotated, the inner shaft 144 is also rotated. Therefore, the two bevel gears 188, 190 are not rotated or moved relative to each other. That is, the bevel gear 188 is not rotated and the nozzle holder 154 is not rotated about the support shaft 152. Thus, no nozzle selection takes place. FIG. 5 shows a component angular-error correcting area provided between the image taking position and the component mounting position where the angular error of the EC 164 is corrected as described above.

FIG. 5 also shows a holder-head returning area provided between the component mounting position and the component discarding area where the sleeve 138 is rotated in the direction opposite to the direction in which the sleeve 138 is rotated when the angular position and/or angular error of the EC 164 is changed and/or corrected, so that the component holder head 120 is returned to its original angular position where the engaging projection 220 and the engaging recess 238 are aligned with each other. The amount of returning rotation of the EC 164 is equal to the amount of correcting of the angular position of the EC 164 in the case where the angular position has been corrected, or the sum of the amount of correcting, and amount of changing, of the angular position of the EC 164 in the case where the angular position has not only been corrected but also changed in the component angular-position changing area. After the holder head 120 has been returned to its original angular position, the rotary head 70 is moved over the EC container that is elongate in the component discarding area. The suction nozzle 158 may discard the EC 164, as needed.

As is apparent from the foregoing description, in the present embodiment, the rotary plate 70 provides a movable member; the cam follower roller 88, the globoidal cams 90a–90d, the main drive servomotor 108, etc. cooperate with one another to provide a movable-member moving device; the nozzle holder 154 holding the suction nozzles 158 as component holders provides a rotary head; and the nozzle rotating/selecting servomotor 192 provides a drive source. The holder portion 146 formed as an integral part of the sleeve 138 provides a rotary holder; the inner shaft 144 provides a component-holder selecting-rotation input member; the gears 180, 186, the bevel gears 188, 190, etc. cooperate with one another to provide a component-holder selecting-rotation transmitting device; the sleeve 138 provides a component-holder rotating-rotation input member; and the holder portion 146, the support shaft 152, the nozzle holder, etc. cooperate with one another to provide a component-holder rotating-rotation transmitting device. Moreover, the cam follower roller 218, the nozzle selecting cam 248, the motor support 210, the compression coil spring 224 as a motor-support biasing member, etc. cooperate with one another to provide an engaging and disengaging device; the engaging and disengaging device cooperates with the drive and driven members 202, 232 to provide a switching device; the connecting member 196, the pin 198, the pin 208, etc. cooperate with one another to provide a connecting device which transmits the rotation of the nozzle rotating/selecting servomotor 192 to the inner sleeve 144; the switching device and the connecting device cooperate with each other to provide a transmission control device. Furthermore, the precisely produced gears 180, 186, the precisely produced gears 188, 190, etc. cooperate with one another to provide a rotary-head positioning device.

Figure 10:
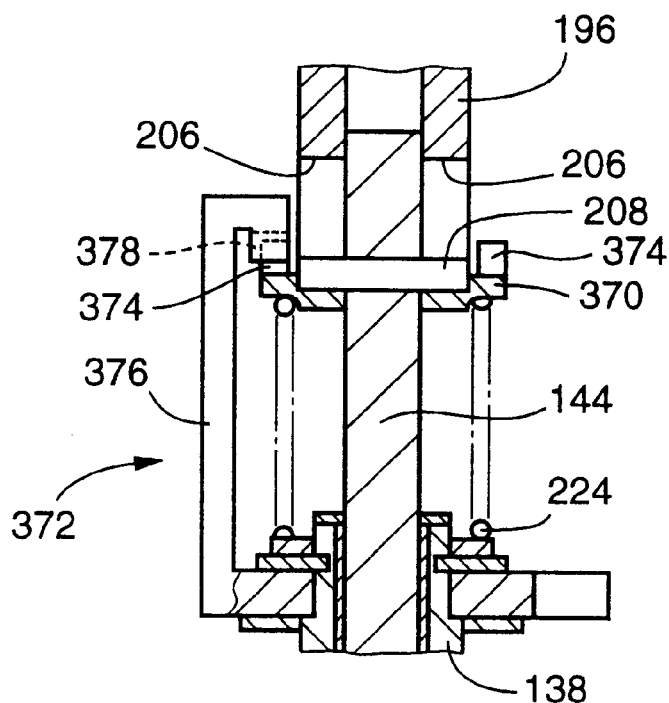
FIG. 10 is a front elevational view in cross section showing a drive member and a driven member employed in an electronic component transferring and mounting apparatus in an electronic component mounting system constructed according to another embodiment of this invention.
Figure 11:
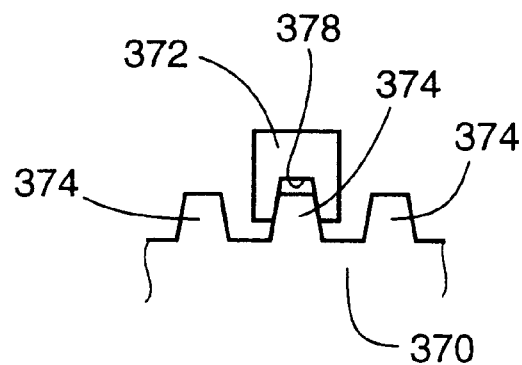
FIG. 11 is an enlarged view of the drive and driven members shown in FIG. 10.

The drive and driven members 202, 232 shown in FIG. 6 may be replaced by a drive and a driven member 370, 372 shown in FIGS. 10 and 11, respectively, in a second embodiment of the present invention. The drive member 370 has six upward projecting engaging projections 374 which are equiangularly spaced from one another about the axis line of the drive member. The driven member 372 includes an arm 376 which has an engaging recess 378 extending in a radial direction of the sleeve 138 and opening downward. The respective widths of each engaging projection 374 and the engaging recess 378 decrease in the upward direction at the same rate. That is, each engaging projection 374 have two outer inclined side surfaces and the engaging recess 378 have two inner inclined surfaces, and the inner side surfaces and the outer side surfaces have the same degree of inclination. Thus, the engaging recess 378 is engaged with each engaging projection, such that the connecting member 196 to which the drive member 370 is fixed is engaged with the sleeve 138 to which the driven member 372 is fixed, without any space being left in the directions in which the connecting member 196 and the sleeve 138 are rotated. Thus, the sleeve 138 is rotated with accuracy, and the angular error of the EC 164 is corrected with accuracy.

Figure 12:
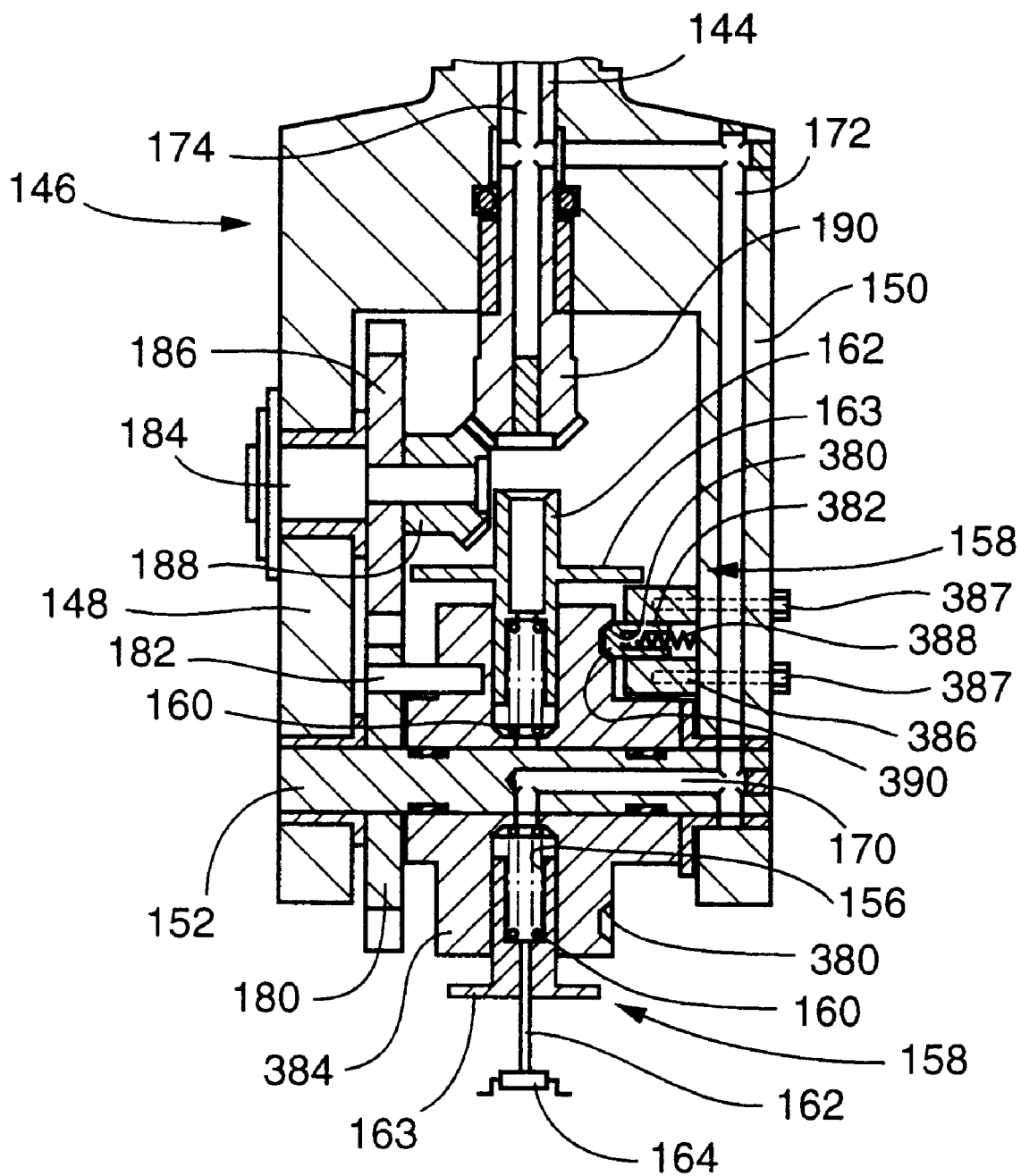
FIG. 12 is a front elevational view in cross section showing a nozzle holder of a component holder head, and a positioning device, of an electronic component transferring and mounting apparatus in an electronic component mounting system constructed according to another embodiment of this invention.

FIG. 12 shows a positioning device including positioning holes 380 and a positioning pin 382, employed in a third embodiment of the present invention. When the pin 382 is engaged with one of the holes 380, a nozzle holder 384 corresponding to the nozzle holder 154 shown in FIG. 6 is positioned at a predetermined angular position where one of the suction nozzles 158 is positioned at the operating position. The nozzle holder 384 has, in a side surface thereof opposed to the side wall 150 of the holder portion 146, six positioning holes 380 (two holes 380 shown in FIG. 12) which are equiangularly spaced from one another about the axis line of the holder 384 and are provided along a circle which has a center at the same axis line. Each hole 380 has a tapered inner wall surface whose diameter increases in a direction toward an opening thereof.

A bracket 386 is fixed to the side wall 150 with bolts 387, and the positioning pin 382 is fit in the bracket 386 such that the pin 382 is movable in directions parallel to the axis line of the nozzle holder 384 and such that the pin 382 is biased by a spring 388 in the direction toward the nozzle holder 384. The pin 382 has a tapered end portion whose tapered surface 390 has a degree of inclination corresponding to that of each positioning hole 380.

When the inner shaft 144 is rotated and accordingly the nozzle holder 384 is rotated, for selecting one of the suction nozzles 158, the positioning pin 382 is retracted against the biasing force of the spring 388 because of the effect of inclination of the tapered outer surface 390 of the pin 382 and the tapered inner surface of each hole 380. Consequently the pin 382 is disengaged from the hole 380, so that the rotation of the nozzle holder 384 is permitted. When the tapered surface 390 of the pin 382 is substantially aligned with the next hole 380 as a result of rotation of the nozzle holder 384, the pin 382 is advanced by the biasing force of the spring 388, so as to be engaged with the hole 380. Thus, the nozzle holder 384 is positioned with accuracy at the next predetermined angular position where the next one of the suction nozzles 158 is positioned at the operating position. In this embodiment, the bevel gears 188, 190 and the gears 180, 186 are provided with a backlash, for permitting the pin 382 to be engaged with each hole 380.

Referring next to FIGS. 13 to 22, there will be described an electronic component mounting system including an electronic component transferring and mounting apparatus 402 which functions as an electronic component transferring apparatus according to a fourth embodiment of the present invention.

Figure 13:
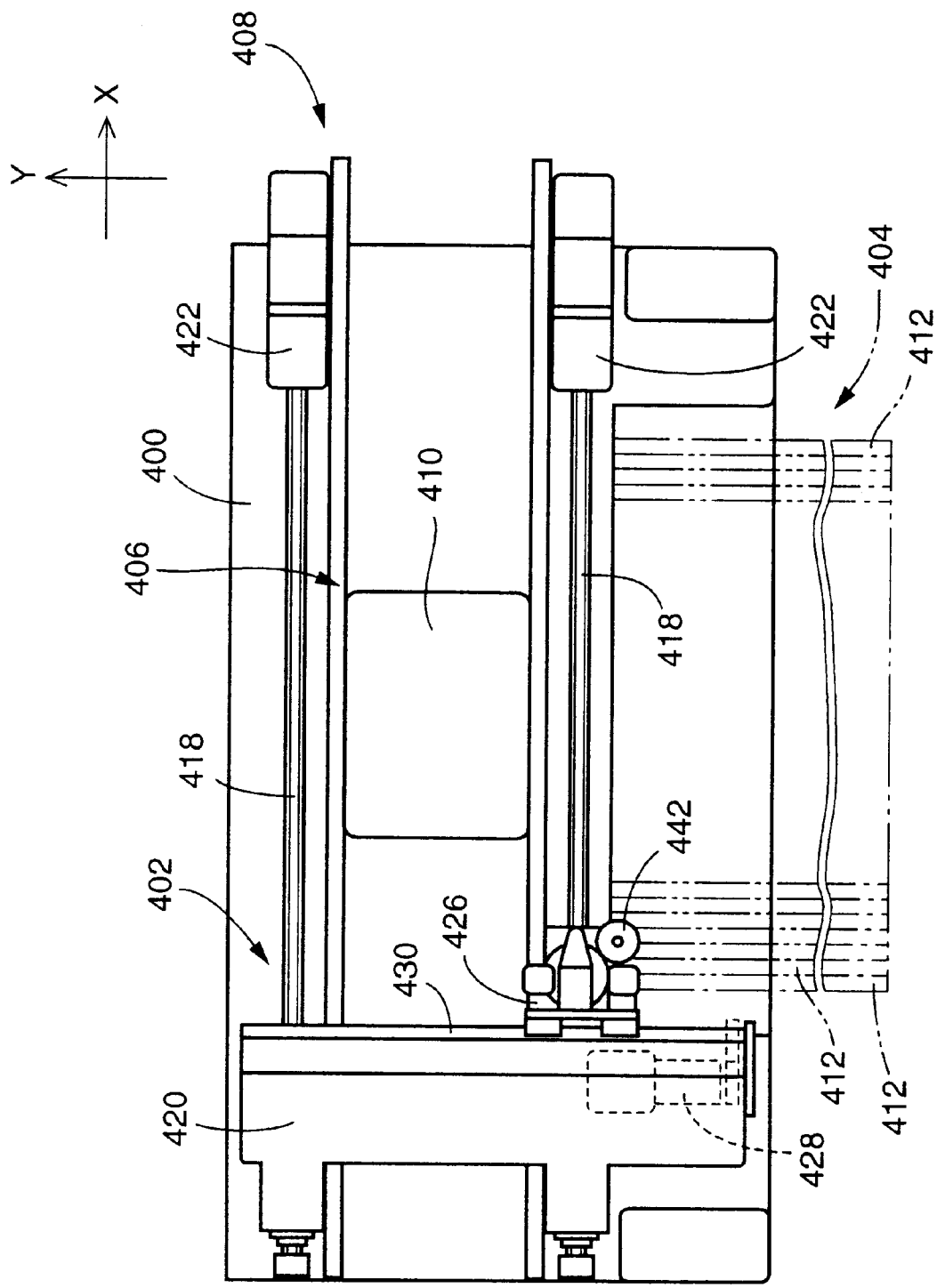
FIG. 13 is a plan view schematically showing an electronic component mounting system according to another embodiment of the present invention, including an electronic component transferring and mounting apparatus equipped with another embodiment of an electronic component transferring device of the invention.

In FIG. 13, reference numeral 400 designates a base on which the electronic component transferring and mounting apparatus 402, an electronic component supply device 404, and a board transferring device 406 are provided. The board transferring device 406 includes a board conveyor 408 which extends in an X-axis direction and which conveys or transfers a printed-circuit (PC) board 410 in the X-axis direction. The PC board 410 is supported and positioned at a predetermined electronic component mounting position by a supporting and positioning device (not shown).

The electronic component supply device 404 is provided on one side of the board conveyor 408 as viewed in a Y-axis direction perpendicular to the X-axis direction in a horizontal plane in which the conveyor 408 extends. Like the electronic component supply device 14 shown in FIG. 1, the supply device 404 includes a number of electronic component supply cartridges 412 which are arranged in the X-axis direction. The supply device 404 is fixedly provided on the base 400.

The electronic component (EC) transferring and mounting apparatus 402 includes a component holder head 416 (FIG. 14) which is linearly moved in the X-axis direction and the Y-axis direction to transfer an electronic component or EC 438 (FIG. 14) and mount the EC 438 on the PC board 410 being positioned at the EC mounting position. A pair of ball screws 418 which extend parallel to each other in the X-axis direction are provided on both sides of the board conveyor 408 as viewed in the Y-axis direction, respectively, on the base 400. The two ball screws 418 are engaged with two nuts (not shown) secured to an X-axis slide 420, respectively. When the two screws 418 are rotated by two X-axis drive servomotors 422, respectively, the X-axis slide 420 is moved in the X-axis direction. Two guide rails (not shown) are provided below the two screws 418, respectively, on the base 400, and a guide block (not shown) secured to the X-axis slide 420 is slidably fit between the two guide rails. Thus, the movement of the X-axis slide 420 in the X-axis direction is guided by the guide rails.

Figure 14:
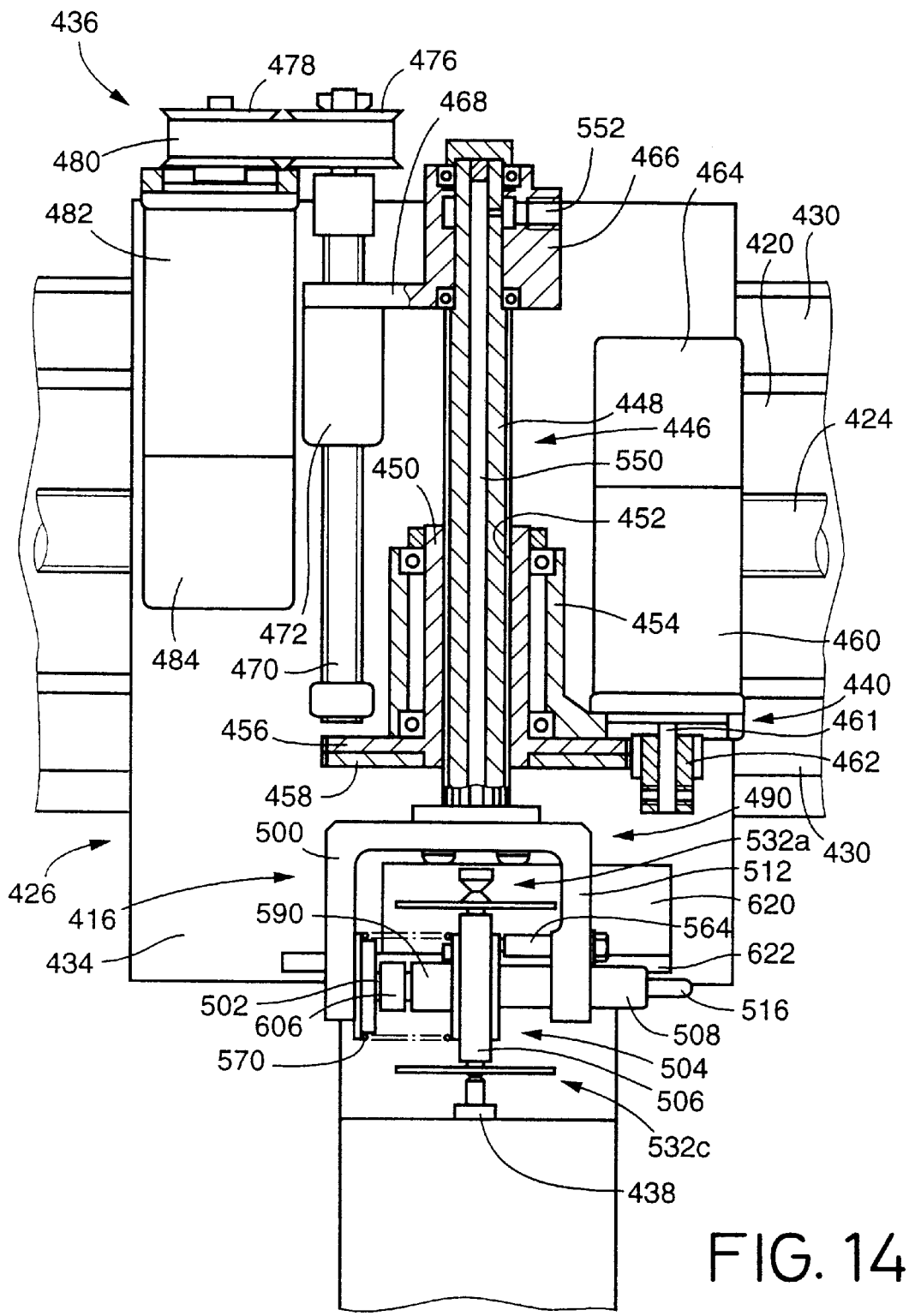
FIG. 14 is a front elevational view, partly in cross section, showing a component holder head of the apparatus shown in FIG. 13.

As shown in FIG. 14, a ball screw 424 which extends in the Y-axis direction is provided on the X-axis slide 420, and a nut (not shown) secured to a Y-axis slide 426 is engaged with the ball screw 424. When the screw 424 is rotated by a Y-axis drive servomotor 428 (FIG. 13), the Y-axis slide 426 is moved in the Y-axis direction while being guided by a pair of guide rails 430.

A line sensor 432 (FIG. 21) which functions as an image taking device is provided at a position between the EC supply device 404 and the board transferring device 406, below the Y-axis slide 426, on the X-axis slide 420. The line sensor 432 includes a number of image-taking elements which are arranged in a straight array or line in the X-axis direction, and takes an image of each portion (i.e., each line) of the EC 438 at a regular interval of time when the EC 438 is moved in the Y-axis direction. Thus, when the last line of the EC 438 passes over the line sensor 432, the sensor 432 takes the last line of an entire image of the EC 438. That is, a two-dimensional image of the EC 438 is obtained as the sum of respective line images taken by the line sensor 432 while the EC 438 is moved by the component holder head 416.

As shown in FIG. 14, the Y-axis slide 426 has a vertical side surface 434 which supports the component holder head 416 such that the head 416 is vertically movable by a vertically moving device 436 and is rotatable about a vertical axis line by a rotating device 440. The side surface 434 also supports the moving device 436 and the rotating device 440, and a CCD (charge-coupled device) camera 442 (FIG. 13) which takes images of reference marks provided on the PC board 410. The rotating device 440 rotates the component holder head 416, thereby rotating the EC 438 being held by the holder head 416, about an axis line thereof.

The component holder head 416 is held by a holder 446, which includes a spline axis member 448 which is fit in a spline hole 452 of a sleeve 450. The sleeve 450 is fit in an arm member 454 projecting from the side surface 434 of the Y-axis slide 426, such that the sleeve 450 is rotatable about a vertical axis line and is not movable in an axial direction thereof. A lower end portion of the sleeve 450 which projects from the arm member 454 supports a pair of gears 456, 458 which are provided for preventing backlash and which are engaged with a gear 462 which is fixed to a rotary output shaft 461 of a rotating servomotor 460 of the rotating device 440 and is rotated by the servomotor 460.

Thus, the spline axis member 448 is rotated with high accuracy about a vertical axis line thereof by the rotating servomotor 460 via the gears 462, 456, 458 and the sleeve 450, so that the component holder head 416 is rotated about a vertical axis line which is coaxial with the vertical axis line of the spline axis member 448. The servomotor 460 is rotatable in opposite directions, and the amount of rotation of the motor 460 in each direction is detected by an encoder 464. Thus, the angle of rotation of the component holder head 416 is detected.

An engaging member 466 is attached to an upper end portion of the spline axis member 448 such that the engaging member 466 is rotatable relative to the axis member 448 and is not movable relative to the axis member 448 in an axial direction of the same 448. The engaging member 466 includes a horizontally extending connecting portion 468 which is fixed to a nut 472. The nut 472 is engaged with a ball screw 470 which is supported by the side surface 434 of the Y-axis slide 426 such that the ball screw 470 is rotatable about about a vertical axis line and is not movable in an axial direction thereof. When the ball screw 470 is rotated by a vertically moving servomotor 482 via timing pulleys 476, 478 and a timing belt 480, the nut 472 is vertically moved, upward or downward, so that the engaging member 466, the holder 446, and the component holder head 416 are moved upward or downward.

The servomotor 482 is rotatable in opposite directions, and the amount of rotation of the motor 482 in each direction is detected by an encoder 484. Thus, the distance of upward or downward movement of the component holder head 416 is detected. When the EC 438 is sucked or mounted, the holder head 416 is moved up and down in a component sucking/mounting space below its downward-movement starting position shown in FIG. 14. When one of the suction nozzles 438 is selected as described later, the holder head 416 is moved to its nozzle selecting position higher by a small distance than the downward-movement starting position.

Figure 16:
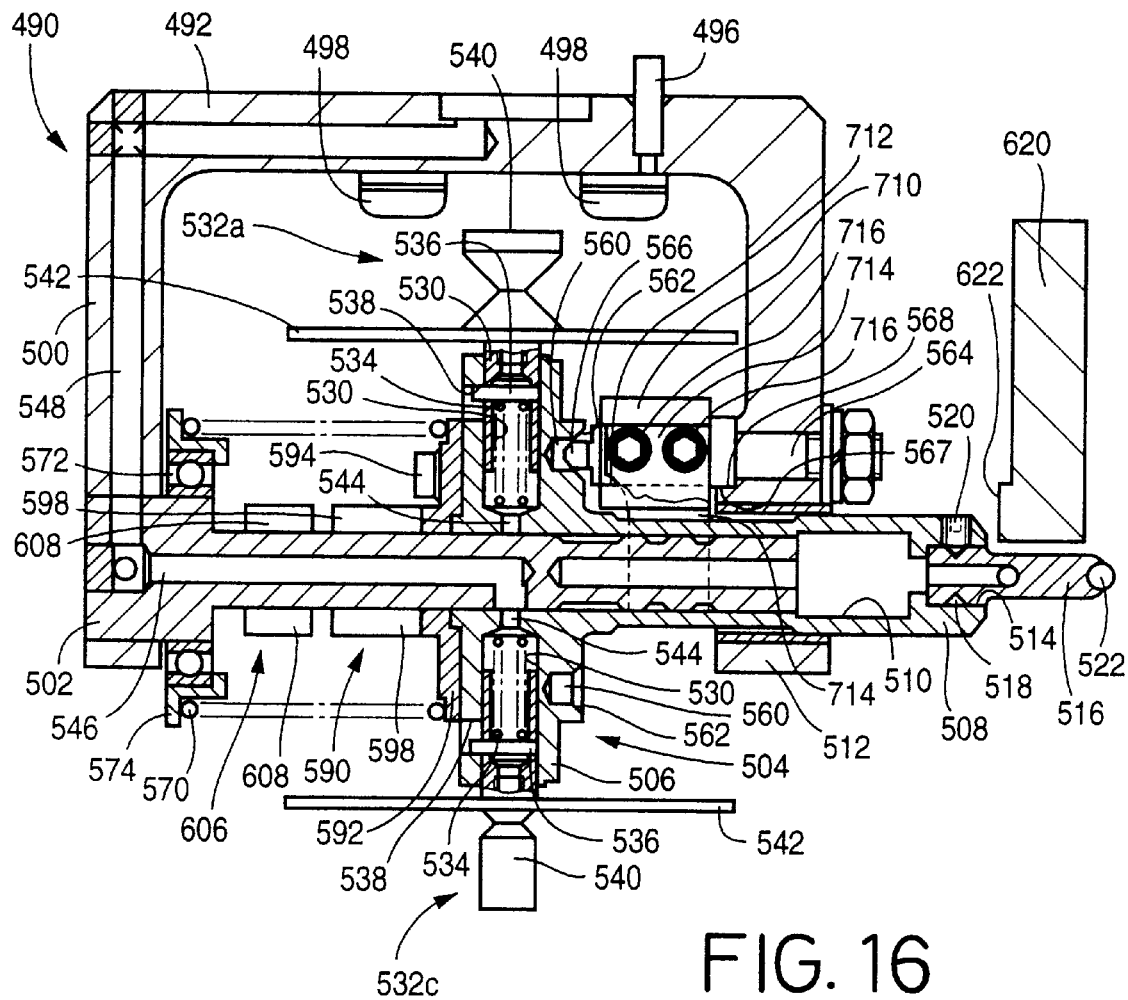
FIG. 16 is a front elevation view, partly in cross section, showing the nozzle holder, the support member, and the nozzle selecting cam shown in FIG. 15.

The component holder head 416 includes a support member 490 which is fixed to a lower end portion of the spline axis member 448. As shown in FIG. 16, the support member 490 has an inverted-U-shaped cross section including an upper wall 492 in which the lower end portion of the spline axis member 448 is fit. The support member 490 is positioned relative to the axis member 448 by a positioning pin 496 and is fixed to the axis member 448 by screws 498.

One of opposite end portions of a support axis member 502 which horizontally extends is fit in one 500 of opposite side walls 500, 512 of the support member 490. A nozzle holder 504 is fit on the axis member 502 such that the nozzle holder 504 is movable relative to the axis member 502 in an axial direction of the same 502 and is rotatable about a horizontal axis line relative to the same 502. The nozzle holder 504 includes a thick-walled holder portion 506 and an axis portion 508 projecting from one of opposite axial ends of the holder portion 506. The nozzle holder 504 has an elongate hole 510 which opens in the other axial end of the holder portion 506 remote from the axial end thereof from which the axial portion 508 projects. The hole 510 extends to a position near a free end of the axial portion 508. The support axis member 502 is fit in the elongate hole 510 of the nozzle holder 504, so that the nozzle holder 504 is rotatable, and axially movable, relative to the axis member 502. The axial portion 508 is fit in the other side wall 512 of the support member 490, such that the nozzle holder 504 is rotatable, and axially movable, relative to the second side wall 512.

The free end of the axial portion 508 projects outward from the second side wall 512. A receiving hole 514 which opens in the free end face of the axial portion 508 is formed through the free end portion of the same 508, such that the receiving hole 508 is concentric with the same 508. An engaging member 516 as a cam follower is received or fit in the receiving hole 514. The engaging member 516 has an annular groove 518 opening in an outer circumferential surface thereof, and a tip portion of an engaging pin 520 which is engaged with the axial portion 508 is fit in the annular groove 518. Thus, the engaging member 516 is prevented from coming off the axial portion 508. A ball 522 is held by a tip portion of the engaging member 516 which projects -from the receiving hole 514, such that the ball 522 is rotatable and does not come off the engaging member 516. A portion of an outer spherical surface of the ball 522 projects outward from the engaging member 516, that is, is exposed.

The holder portion 506 has four nozzle receiving holes 530 which are equiangularly spaced from one another about the axis line of the support axis member 502. Four component suction nozzles 532a, 532b, 532c, 532d are received or fit in the four nozzle receiving holes 530, respectively, such that each suction nozzle 532 is movable relative to the corresponding hole 530 in an axial direction thereof and is not rotatable about an axis line thereof relative to the same 530. Each suction nozzle 532 is biased by biasing means in the form of an elastic member in the form of a compression coil spring 534, in a radially outward direction of the holder portion 506. Each suction nozzle 532 is prevented from coming off the corresponding hole 530 or rotating in the same 530, by an engaging pin 536 which is adapted to be engaged with an end of an engaging hole 538. The four suction nozzles 532*a*, 532*b*, 532*c*, 532*d* have suction pipes 540 of different dimensions and different shapes, respectively, and thus are adapted to suck ECs of different kinds, respectively. In addition, the four suction nozzles 532*a*, 532*b*, 532*c*, 532*d* are associated with reflecting plates 542 of different dimensions, respectively. Since the four suction pipes 540 have the same length, the respective end faces of the suction pipes 540 are positioned along a circle whose center is located on the axis line of the support axis member 502.

Each suction nozzle 532 sucks an EC 438 by vacuum or negative pressure. To this end, four passages 544 are formed in the holder portion 506 such that the four passages 544 open in the four nozzle receiving holes 530, respectively, and also open in an inner circumferential surface of the holder portion 506 which defines the elongate hole 510. In addition, passages 546, 548, 550 are formed in the support axis member 502, the support member 490, and the spline axis member 448, respectively. The passage 550 communicates with a vacuum source (not shown) via a port 552 (FIG. 14). A solenoid-operated direction switch valve 554 (FIG. 21) which is provided between the port 552 and the vacuum source is operated in such a manner that one of the four suction nozzles 532 (532*a*, 532*b*, 532*c*, 532*d*) which is positioned at an opening position, described later, is selectively communicated with the vacuum source or the atmosphere. Thus, the suction nozzle 532 being positioned at the operating position sucks, or releases, the EC 438.

Figure 17:
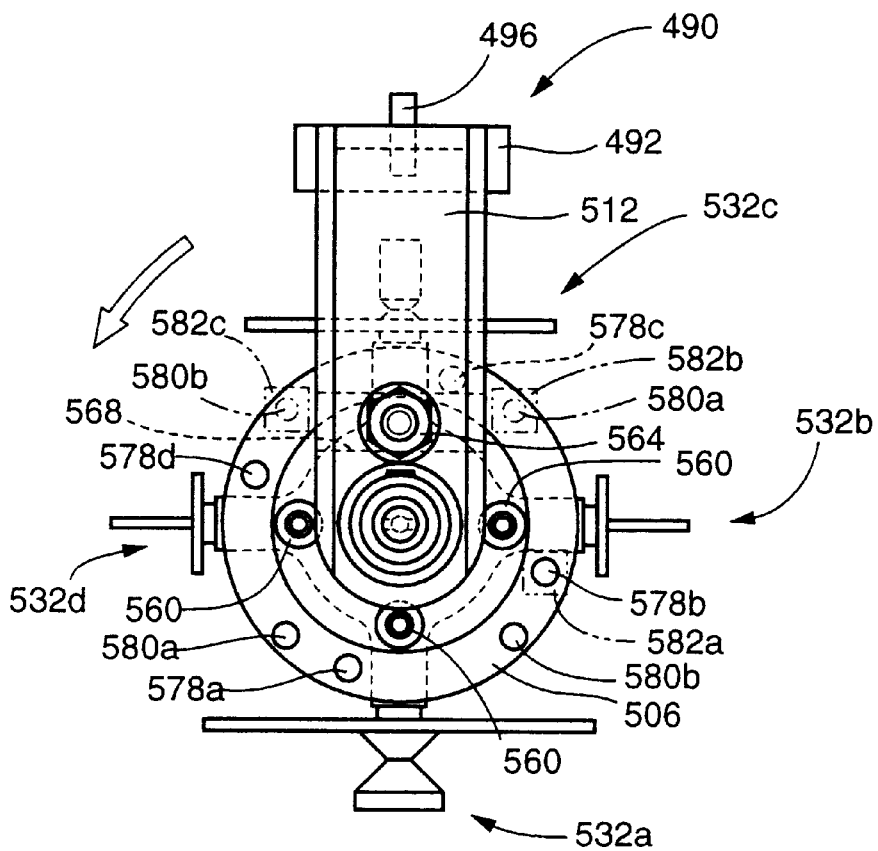
FIG. 17 is a side elevational view showing the nozzle holder and the support member shown in FIG. 15.

As shown in FIGS. 16 and 17, the first end face of the holder portion 506 from which the axial portion 508 projects has four positioning holes 560 which are equiangularly spaced from one another about the axis line of the nozzle holder 504 and are provided along a circle whose center is located on the axis line of the same 504. Only three positioning holes 560 are shown in FIG. 17. Each positioning hole 560 has a tapered inner circumferential surface 562 whose diameter increases in a direction toward an opening of the hole 560 in the first end face of the holder portion 506.

The second side wall 512 of the support member 490 supports a positioning pin 564 such that the pin 564 extends parallel to the axis line of the nozzle holder 504. A positioning projection 566 which has two part-tapered outer surfaces each having an inclination corresponding to that of the tapered inner surface 562 of each positioning hole 560, projects from one end of the positioning pin 564. The positioning projection 566 is obtained by cutting away an upper and a lower portion of a conical projection projecting from the positioning pin 564, such that the projection 566 has horizontal upper and lower cut surfaces. Thus, two side surfaces of the projection 566 provide the two part-tapered outer surfaces thereof. Meanwhile, an upper and a lower portion of an axially intermediate portion of the positioning pin 564 are cut away to provide horizontal upper and lower cut surfaces. The horizontal lower cut surface 567 is engaged with a horizontal seat surface 568 formed on the second side wall 512, so that the pin 564 is prevented from rotating relative to the support member 490 and so that the two part-tapered surfaces of the projection 566 are opposite to each other in a horizontal plane.

The nozzle holder 504 is biased by biasing means in the form of an elastic member in the form of a compression coil spring 570 (hereinafter, referred to as the "spring" 570) provided between the nozzle holder 504 itself and the first side wall 500 of the support member 490, in a direction in which to engage the positioning holes 560 with the positioning projection 566 of the positioning pin 564. The support axis member 502 supports a retainer 574 via a bearing 572 such that the retainer 574 is rotatable relative to the axis member 502 about the axis line of the same 502. One end of the spring 570 is secured to the retainer 574, and the other end of the same 570 is secured to the nozzle holder 504. Thus, the spring 570 is rotatable with the nozzle holder 504 about the axis line of the axis member 502.

When the component holder head 416 sucks or mounts the EC 438, one of the four positioning holes 560 is engaged with the positioning pin 564, and accordingly the nozzle holder 504 is positioned at a corresponding one of four predetermined angular positions where a corresponding one of the four suction nozzles 532 is positioned at the operating position where the axis line of that one nozzle 532 extends vertically and is aligned with the axis line of the spline axis member 448 and the suction pipe 540 of that one nozzle 532 is oriented downward. The passage 546 formed in the support axis member 502 communicates with only the one suction nozzle 532 being positioned at the operating position.

Figure 18:
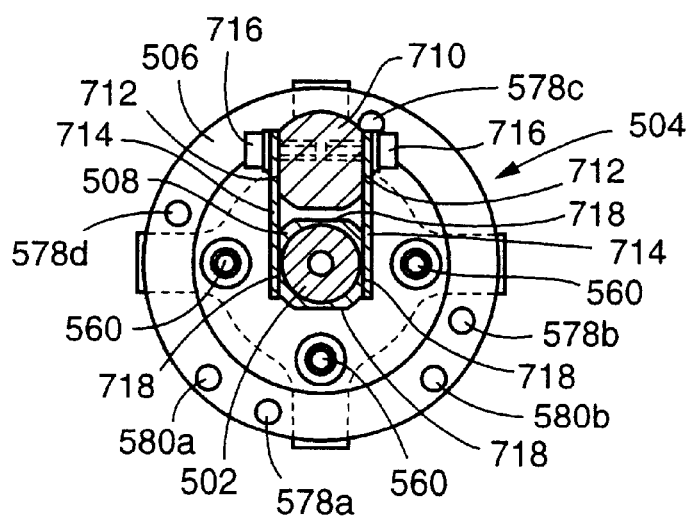
FIG. 18 is a side elevational view showing a state in which engaging members are engaged with an axis portion of the nozzle holder shown in FIG. 15.

As shown in FIGS. 16 and 18, the positioning pin 564 includes a large-diameter portion 710 which projects from the second side wall 512 toward the nozzle holder 504 and which is nearer to the holder 504 than the horizontal lower surface 567 of the pin 564. In FIG. 18, the suction nozzles 532 are omitted. The large-diameter portion 710 has two vertical side surfaces 712 which are obtained by cutting away two side portions of the portion 710 which are diametrically opposite to each other in a direction perpendicular to the axis line of the nozzle holder 504. Two engaging members 714 are fixed to the two side surfaces 712, respectively, by using two bolts 716 for each member 714. Each engaging member 714 is formed of a sheet spring and has a flat plate-like shape. The two engaging members 714 project downward from the large-diameter portion 710 of the positioning pin 564, and engage two engaging surfaces 718 (FIG. 18) of the axis portion 508, respectively.

The axis portion 508 has two additional engaging surfaces 718. Thus, the axis portion 508 has four engaging surfaces 718 in total, which are equiangularly spaced from one another about, and extends parallel to, the axis line of the same 508. When the nozzle holder 504 is positioned with the positioning pin 564 being engaged with one of the four positioning holes 560, one pair of engaging surfaces 718 are opposite to each other in a horizontal direction and the other pair of engaging surfaces 718 are opposite to each other in a vertical direction. When the pair of engaging members 714 engage one pair of engaging surfaces 718, the nozzle holder 504 is positioned at one of the four predetermined angular positions. However, this engagement permits the nozzle holder 504 to be moved relative to the positioning pin 564 in a direction parallel to the axis line of the holder 504.

Figure 19:
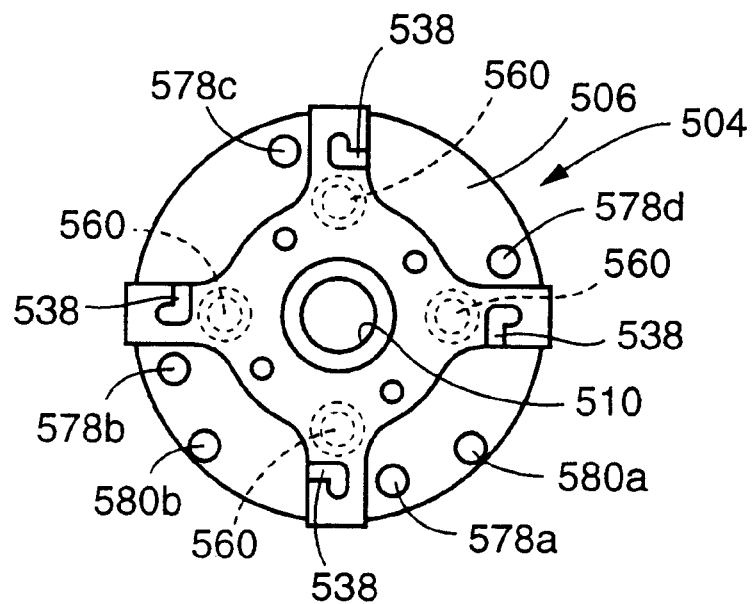
FIG. 19 is a side elevational view showing the nozzle holder shown in FIG. 15, as seen from the side opposite to the side from which the nozzle holder shown in FIG. 17 is seen.

As shown in FIGS. 17 and 19, the holder portion 506 of the nozzle holder 504 has four through-holes 578 (578*a*, 578*b*, 578*c*, 578*d*) which are formed through the thickness of the holder portion 506 in the axial direction thereof. The four through-holes 578 are equiangularly spaced from one another about the axis line of the nozzle holder 504, and are provided along a circle whose center is located on the axis line of the same 504. The four through-holes 578 are provided adjacent to the corresponding nozzle receiving holes 530. The holder portion 506 additionally has two through-holes 580*a*, 580*b* which are provided along a circle whose center is located on the axis line of the nozzle holder 504 and whose diameter is greater than that of the circle along which the through-holes 578 are provided. The two through-holes 580*a*, 580*b* are spaced from the two through-holes 578*a*, 578*b*, respectively, by the same angle in the same direction about the axis line of the nozzle holder 504.

Figure 15:
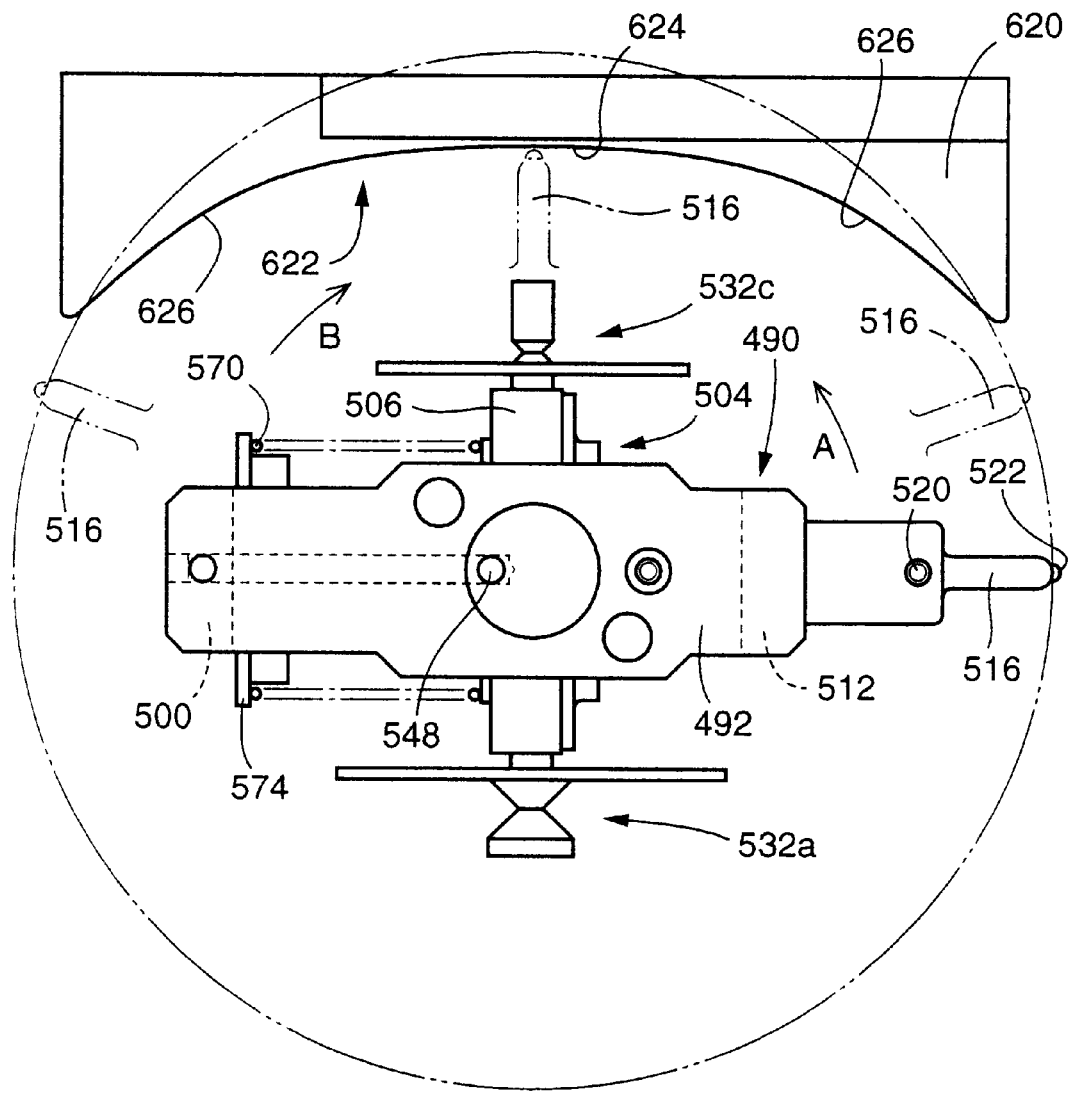
FIG. 15 is a plan view showing a nozzle holder and a support member of the component holder head, and a nozzle selecting cam, of the apparatus shown in FIG. 13.

The previously-described Y-axis slide 426 carries three transmittance-type light sensors 582 (582a, 582b, 582c, FIG. 17). Each light sensor 582 includes a light emitter and a light detector which are provided on both sides of the component holder head 416 as seen in the Y-axis direction, respectively. The three light sensors 582 are provided at respective positions which ensure that when the holder head 416 is positioned at its original angular position about the axis line thereof and simultaneously at the nozzle selection position, and simultaneously when the suction nozzle 532c is positioned at the operating position, the respective lights emitted from the respective light emitters of the light sensors 582a, 582b, 582c pass through the through-holes 578d, 580a, 580b, respectively, and are detected by the respective light detectors of the light sensors 582a, 582b, 582c. The original position of the component holder head 416 about the axis line thereof is defined, as shown in FIG. 15, as the position where the axis line of the nozzle holder 504 is parallel to the Y-axis direction and simultaneously the engaging member 516 is positioned on the downstream side of the nozzle holder 504 when the Y-axis slide 426 is moved from the EC supply device 404 toward the board transferring device 406. In FIG. 17, a while arrow indicates the direction in which the nozzle holder 504 is rotated when one of the suction nozzles 532 is selected.

The four through-holes 578a–578d are provided for the four suction nozzles 532a–532d, respectively. A control device 630 (FIG. 21) identifies whether or not any one of the four suction nozzles 532a–532d is positioned at the operating position, based on whether or not the light detector of the light sensor 582a detects the light. In addition, the control device 630 identifies which one of the four nozzles 532 is positioned at the operating position, based on whether or not the respective light detectors of the two light sensors 582b, 582c detect the corresponding lights, because four different combinations of whether the two light sensors 582b, 582c detect the lights or not correspond one by one to the four different kinds of nozzles 532, respectively.

Figure 20:
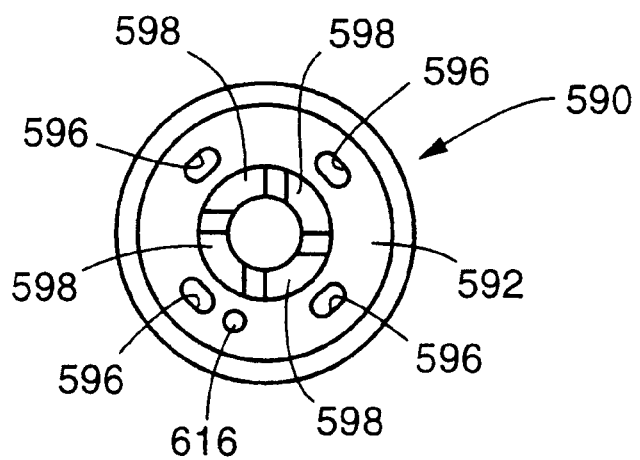
FIG. 20 is a front elevational view of a driven cam fixed to the nozzle holder shown in FIG. 15.

As shown in FIG. 16, a driven cam 590 is fixed to the end face of the holder portion 506 of the nozzle holder 504 which face is remote from the opposite end face from which the axis portion 508 projects. As shown in FIG. 20, the driven cam 590 has a cylindrical shape, and is fit on the support axis member 502 such that the driven cam 590 is movable relative to the axis member 502 in the axial direction of the same 502 and is rotatable about an axis line thereof relative to the same 502. The driven cam 590 has, at one of opposite ends thereof, an outer flange 592 with four elongate holes 596, and is fixed to the holder portion 506 of the nozzle holder 504 with four bolts 594 (only one bolt 594 is shown in FIG. 16) being threadedly engaged with the holder portion 506 through the four elongate holes 596, respectively. The four elongate holes 596 have a part-arcuate shape extending along a circle whose center is located on the axis line of the driven cam 590, and are equiangular spaced from one another along the circle. Strictly, the previously-described, other end of the spring 570 is secured to not the holder portion 506 but the outer flange 592 of the driven cam 590.

As shown in FIG. 20, the driven cam 590 has, at the other end thereof remote from the outer flange 592, four saw-toothed engaging portions 598 which are equiangularly spaced from one another. As shown in FIGS. 22(A) to 22(E), each engaging tooth 598 has an inclined tooth surface 600 which is inclined relative to the axis line of the drive cam 590, and a parallel tooth surface 602 which is parallel to the axis line of the same 590.

A drive cam 606 which is concentric with the support axis member 502 is provided integrally with an end portion of the axis member 502 which projects from the driven cam 590. The drive cam 606 has a diameter larger than that of the driven cam 590, and has four saw-toothed engaging portions 608 which are equiangularly spaced from one another (only one or two engaging portions or teeth 608 are shown in FIGS. 22(A) to 22(E)). As shown in FIGS. 22(A) to 22(E), each engaging portion or tooth 608 has an inclined tooth surface 610 which is inclined relative to the axis line of the drive cam 606, and a parallel tooth surface 612 which is parallel to the axis line of the same 606. In FIGS. 22(A) to 22(E), two-dot chain lines indicate portions of saw-toothed projections which are cut away to provide the engaging teeth 598, 608. The inclined surface 610 of each tooth 608 has the same degree of inclination as that of the inclined surface 600 of each tooth 598. Thus, the teeth 598 of the driven cam 590 and the teeth 608 of the drive cam 606 cooperate with each other to function as described later. The driven cam 590 is biased by the spring 570 which biases the nozzle holder 504, in a direction away from the drive cam 606.

As shown in FIG. 22(A), when the positioning pin 564 is engaged with one of the four positioning holes 560 and one of the four component suction nozzles 532a–532d is positioned at the operating position, only respective tip portions of the four inclined surfaces 600 of the driven cam 590 are opposed to only respective tip portions of the four inclined surfaces 610 of the drive cam 606. The rotational or angular position of the driven cam 590 relative to the nozzle holder 504 about the axis line of the same 590 can be adjusted by unfastening and moving the bolts 594 relative to the elongate holes 596 of the same 590. After the bolts 594 are fixed, a positioning pin 616 (FIG. 20) is driven into the driven cam 590 and the nozzle holder 504 to position the cam 590 relative to the holder 504.

As shown in FIG. 14, a nozzle selecting cam 620 is fixed to the side surface of the Y-axis slide 426. As shown in FIGS. 15 and 16, the selecting cam 620 has a vertical cam surface 620. However, in FIG. 16, the selecting cam 620 is shown in a phase rotated by 90 degrees from its actual position. The cam surface 622 includes a constant-distance surface 624 which has a constant distance from the axis line of the component holder head 416, and two variable-distance surfaces 626 which are provided on both sides of the constant-distance surface 624 as seen in the Y-axis direction and which have a variable distance from the axis line of the head 416. The distance between each variable-distance surface 626 and the axis line of the head 416 gradually increases in a direction away from the constant-distance surface 624. The distance between the constant-distance surface 624 and the axis line of the head 416 is shorter than a reference distance between the axis line of the head 416 and the tip of the ball 522 of the engaging member 516 in a state in which the movement of the head holder 504 due to the biasing action of the spring 570 is stopped by the engagement of the positioning pin and hole 564, 560 and accordingly the head holder 504 is positioned at its advanced position. The maximum distance between each variable-distance surface 626 and the axis line of the head 416 is slightly greater than the reference distance. The nozzle selecting cam 620 is provided at a fixed height or position where the cam surface 622 thereof is engageable with the engaging member 516 of the holder head 416 being positioned at the nozzle selecting position.

Figure 21:
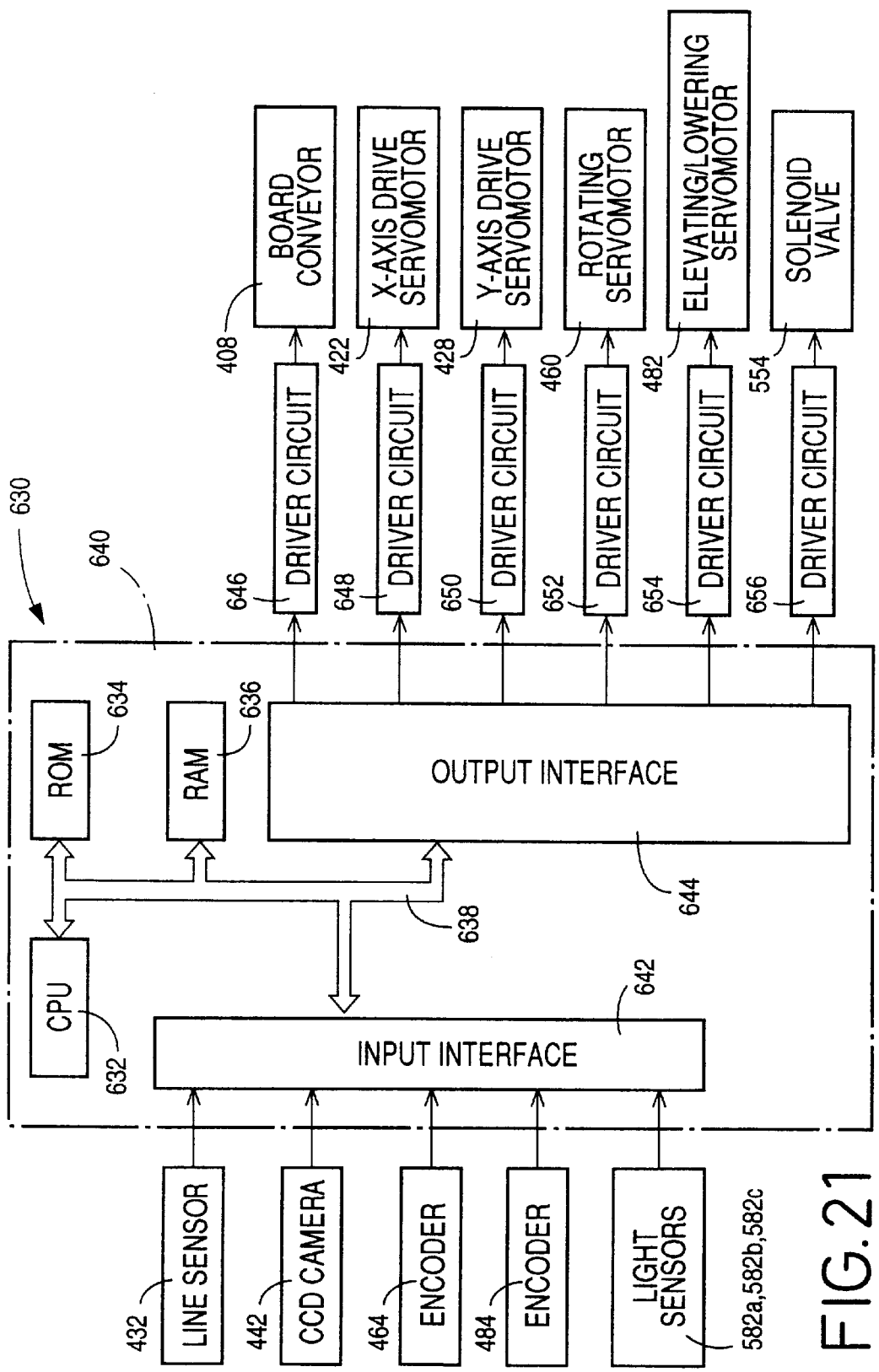
FIG. 21 is a block diagram illustrating a part of a control device for controlling the electronic component mounting system shown in FIG. 13, which part relates to the present invention.

As shown in FIG. 21, the present EC mounting system is controlled by the control device 630, which is essentially provided, like the control device 330 shown in FIG. 9, by a computer including a CPU 632, a ROM 634, a RAM 636, and a bus 638 which connects the elements 632, 634, 636 to one another. An input interface 642 is connected to the bus 638, and the line sensor 432, the CCD camera 442, the encoders 464, 484, and the light sensors 582*a*–582*c* are connected to the input interface 642. An output interface 644 is also connected to the bus 638, and the board conveyor 408, the X-axis drive servomotor 422, the Y-axis drive servomotor 428, the rotating servomotor 460, the vertically moving servomotor 482, and the solenoid-operated direction control valve 552 are connected to the output interface 644 via respective drive circuits 646, 648, 650, 652, 654, 656, respectively. The ROM 634 stores various control programs which are needed for sucking and mounting the ECs 438, and additionally stores a look-up table representing a one-to-one correspondence between the previously-described four possible combinations of whether or the two light sensors 582*b*, 582*c* detect lights and the four possible kinds of one component suction nozzle 532 being positioned at the operating position.

The servomotors 422, 428, 460, 482 are of a kind of electric motor as a drive source which is controllable about an angular phase thereof, and accordingly may be replaced by stepper motors.

When the EC mounting system constructed as described above mounts the EC 438 on the PC board 410, first, the component holder head 416 is moved to above an appropriate one of the EC supply cartridges 412, by the respective movements of the X-axis and Y-axis slides 420, 426. After the holder head 416 is stopped, the head 416 is moved downward from its downward-movement starting position, so that one component suction nozzle 532 being positioned at the operating position is brought into contact with the EC 438 and subsequently is supplied with vacuum from the vacuum source (not shown) to suck the EC 438. When the holder head 416 sucks or mounts the EC 438, the head 416 is held at its original position about the axis line thereof.

After the component holder head 416 sucks the EC 438, the holder head 416 is moved up to its downward-movement starting position. Subsequently, the head 416 is moved to above an EC mounting place on the PC board 410. In the case where the angular position of the EC 438 about the axis line of the suction pipe 540 of the suction nozzle 532 just after the EC 438 is sucked by the pipe 540 is different from that of the EC 438 when the EC 438 is released from the pipe 540 onto the board 410, the suction nozzle 532 is rotated by an appropriate angle before the EC 438 is moved to above the EC mounting place on the board 410. Specifically described, the rotating servomotor 460 is driven to rotate the spline axis member 448 and thereby rotate the support member 490, so that the suction nozzle 532 being positioned at the operating position is rotated about the axis line thereof. Thus, the angular position of the EC 438 is changed by an appropriate angle. This angle is a great angle, for example, 90 degrees or 180 degrees. However, when the EC 438 is sucked or mounted, the holder head 416 is moved up and down in a height range below its downward-movement starting position shown in FIG. 14. In this range, the engaging member 516 is located below the cam surface 622 of the nozzle selecting cam 620, and accordingly the support member 490 supporting the nozzle holder 504 is positioned relative to the selecting cam 620, at a spaced position where the engaging member 516 is not engageable with the cam surface even if the engaging member 516 is rotated. Thus, when the holder head 416 is rotated to change the angular position of the EC 438, the engaging member 516 and the cam surface 622 do not interfere with each other. That is, the suction nozzle 532 can be rotated by even a great angle to change the angular position of the EC 438.

After the angular position of the EC 438 is changed, if necessary, the EC 438 is moved to above the EC mounting place on the PC board 410. During this movement, the EC 438 passes over the line sensor 432, so that a posture of the EC 438 held by the suction nozzle 532 is detected, that is, the image of the EC 438 is taken by the line sensor 432. Thus, respective positional errors of the EC 438 in the X-axis and Y-axis directions and a rotational or angular error of the EC 438 about a reference vertical axis line thereof are calculated by the control device 630 based on the image taken by the line sensor 432. Meanwhile, as previously described, the two reference marks on the PC board 410 are picked up by the CCD camera 442 in advance, and respective positional errors of the board 410 in the X-axis and Y-axis directions are calculated by the control device 630 based on the image picked up by the CCD camera 442. Although each PC board 410 has a number of EC mounting places, the control device 630 calculates X-axis-direction and Y-axis-direction positional errors for each EC mounting place on the board 410.

The angular error of the EC 438 is corrected by rotating the component holder head 416 and thereby rotating the suction nozzle 532 being positioned at the operating position, about the axis line thereof, after the image of the EC 438 is taken and before the EC 438 arrives at the EC mounting place on the PC board 410. Meanwhile, the X-axis-direction and Y-axis-direction positional errors of the EC 438 and the board 410 are corrected by correcting the amounts of movement of the X-axis and Y-axis slides 420, 426 in the X-axis and Y-axis directions. When the angular error of the EC 438 is corrected, the engaging member 516 remains below the cam surface 622 of the nozzle selecting cam 620. Therefore, when the holder head 416 is rotated to correct the angular error of the EC 438, the engaging member 516 and the nozzle cam surface 622 do not interfere with each other. Thus, the holder head 416 can be rotated by even a great angle to correct the angular error of the EC 438.

After the holder head 416 is moved to above the EC mounting place on the PC board 410, the head 416 is moved down to place the EC 438 onto the board 410. Subsequently, the suction nozzle 532 is communicated with the atmosphere to release the EC 438 on the board 410. Then, the head 416 is moved up to its downward-movement starting position and is moved toward the EC supply device 406. While the head 416 is moved to the EC supply device, the head 416 is rotated in a direction opposite to the direction in which the head 416 is rotated to change the angular position, and correct the angular error, of the EC 438, by an angle equal to the sum of the changed angle and the corrected angle. Thus, the head 416 is returned back to its original angular position as shown in FIG. 15.

In the case where the suction nozzle 532 being positioned at the operating position is changed with another suction nozzle 532, this change is made after the holder head 416 is returned to its original angular position and before the head 416 is moved to the EC supply cartridge 412. When the nozzles 438 are changed, first, the holder head 416 is moved from its downward-movement starting position up to its nozzle selecting position where the engaging member 516 is located at the same height or position as that of the cam surface 622. That is, the support member 490 supporting the nozzle holder 504 is positioned relative to the nozzle selecting cam 620, at an aligned height or position where the engaging member 516 is engageable with the cam surface 622 when the engaging member 516 is rotated. When the spline axis member 448 is rotated and accordingly the holder head 416 is rotated in the first direction indicated at Arrow "A" in FIG. 15, the ball 522 of the engaging member 516 engages the variable-distance surface 626 of the cam surface 622, so that the nozzle holder 504 is retracted against the biasing force of the spring 570.

As shown in FIG. 22(A), with one of the four suction nozzles 532a–532d being positioned at the operating position, the positioning projection 566 of the positioning pin 564 is engaged with one of the positioning holes 560, and the teeth 598 of the driven cam 590 are spaced away from the teeth 608 of the driven cam 606. Only the respective tip portions of the inclined surfaces 600 are opposed to the respective tip portions of the inclined surfaces 610. When the nozzle holder 504 is retracted, the projection 566 is disengaged from the hole 560, and accordingly the rotation of the holder 504 relative to the support axis member 502 is permitted. Simultaneously, the tip portions of the inclined surfaces 600 are engaged with the tip portions of the inclined surfaces 610, as shown in FIG. 22(B).

The inclined surfaces 600, 610 are engaged with each other after the positioning projection 566 is disengaged from the positioning hole 560. However, when the nozzle holder 504 is moved relative to the support axis member 502 in the axial direction of the same 502, the holder 504 is prevented from freely rotating about the axis member 502 due to the engagement of the engaging surfaces 718 of the axis portion 508 with the engaging members 714 fixed to the positioning pin 564. Thus, the inclined surfaces 600 can be engaged with the corresponding inclined surfaces 610, respectively, with reliability. That is, when the holder 504 is released from the engagement with the pin 564, the holder 504 is effectively prevented from being rotated by some angle in a direction opposite to the direction in which the holder 504 is to be rotated by the engagement of the drive and driven cams 606, 590, that is, the teeth 598 are effectively prevented from failing to engage the teeth 608 and thereby failing to rotate the holder 504.

When the holder head 416 is further rotated from the state shown in FIG. 22(B), the nozzle holder 504 is further retracted and, as shown in FIG. 22(C), the inclined surfaces 600 are moved by being guided by the inclined surfaces 610, so that the holder 504 is rotated relative to the support axis member 502 about the axis line of the same 502 because of the effect of inclination of the surfaces 600, 610. Thus, the holder 504 is retracted and rotated to the position, shown in FIG. 22(C), where each tooth 598 is located between a pair of adjacent teeth 608 with a small space being left between the parallel surfaces 602, 612 and where the positioning pin 564 is engageable with the positioning hole 560 next to the previous hole 560 with which the pin 564 had been engaged before the holder 504 is rotated for changing the nozzles 532. At the position shown in FIG. 22(C), the center line of the pin 564 is aligned with the tapered inner surface 562 defining the hole 560 which is next to the previous hole 560 in the direction in which the holder 504 is rotated for changing the nozzles 532. This rotation of the holder 504 takes place against the biasing forces of the engaging members 714.

When the holder head 416 is further rotated and the engaging member 516 engages the second variable-distance surface 626 beyond the constant-distance surface 624, the distance between the second variable-distance surface 626 and the holder head 416 gradually increases, the nozzle holder 504 advances because of the biasing force of the spring 570. Thus, the driven cam 590 is disengaged from the drive cam 606 and, as shown in FIG. 22(D), each tooth 598 is disengaged from a pair of adjacent teeth 608 and the above-mentioned, next positioning hole 560 approaches the positioning pin 564. After the teeth 598 are completely disengaged from the teeth 608, the positioning projection 566 is engaged with the tapered inner surface 562 of the next hole 560. During this advancement of the holder 504, the holder 504 is prevented from freely rotating, because of the engagement of the engaging members 714 with the engaging surfaces 718. Thus, the holder 504 is prevented from being rotated in a direction opposite to the "correct" direction in which the holder 504 is to be rotated for changing the suction nozzles 532. Accordingly, the projection 566 engages the tapered inner surface 562 of the next hole 560 with reliability. Consequently the holder 504 is rotated by a small angle in the correct direction because of the engagement of the projection 566 with the tapered inner surface 562 under the biasing action of the spring 570. Thus, as shown in FIG. 22(E), the projection 566 engages the next hole 560, and the corresponding suction nozzle 532 is positioned at the operating position with accuracy. In this way, the tip portion of each tooth 598 is opposed to the tip portion of the tooth 608 next to the tooth 608 to which each tooth 598 had been opposed in the state shown in FIG. 22(A).

As previously described, the upper and lower portions of the positioning projection 566 are cut away to provide the upper and lower horizontal surfaces, respectively. Owing to those horizontal surfaces, one of the suction nozzles 532 is positioned at the operating position with accuracy. In the case where the projection 566 has a positional error relative to the holes 560 in a radial direction of the holder portion 506, if the projection 566 has a conical shape, the upper and lower portions of the tapered outer surface of the conical projection 566 engage the tapered inner surface of each hole 560, thereby preventing the pin 564 from engaging the hole 560 to an extent that the respective axis lines of the pin 564 and the hole 560 are aligned with each other in the circumferential direction of the holder 504. Thus, the holder 504 is positioned with some error in the circumferential direction thereof. In contrast, the projection 566 whose upper and lower portions are cut away is free from the above-indicated problem. That is, the pin 564 engages each hole 560 to an extent that the two part-tapered surfaces of the projection 566 which are horizontally opposite to each other engage the tapered inner surface 562 of the hole 560, and the holder 504 is rotated to an angular position where the respective axis lines of the pin 564 and the hole 560 are aligned with each other. Thus, one of the suction nozzles 532 is positioned at the operating position with accuracy.

In this way, each time the nozzle holder 504 is reciprocated on the support axis member 502, the holder 504 is rotated by one pitch, i.e., 90 degrees. If the holder head 416 is rotated by 180 degrees in the direction "A" and subsequently is rotated back in the direction "B", as shown in FIG. 15, the engaging member 516 engages the cam surface 622 and the holder 504 reciprocates once more, so that the direction in which the holder 504 is rotated for changing the suction nozzles 532, depends on only the direction of inclination of the inclined surfaces 600, 610 of the driven and drive cams 590, 606. Therefore, the nozzle holder 504 is rotated in the correct direction only, irrespective of whether the holder head 416 is rotated in the direction "A" or the direction B.

For example, in the case where a first suction nozzle 532 being positioned at the operating position is changed with a second suction nozzle 532 next to the first nozzle 532 in the correct direction, the holder head 416 is rotated by 180 degrees in the direction "A" and subsequently is additionally rotated by 180 degrees in the direction "A". During the additional rotation of the head 416 in the direction "A", the engaging member 516 does not engage the cam surface 622 and the head 416 returns to its original angular position without rotating the holder 504. The control device 630 selects the second suction nozzle 532 of the particular kind, according to the EC mounting control program pre-stored in the ROM 634, and rotates the holder head 416 by 360 degrees without stopping the same 416 at any intermediate angle for rotating the nozzle holder 504 by one pitch and thereby positioning the second nozzle 532 at the operating position. Eventually, the head 416 returns to its original angular position.

In addition, in the case where a first suction nozzle 532 being positioned at the operating position is changed with a third suction nozzle 532 diametrically opposite to the first nozzle 532 with respect to the axis line of the nozzle holder 504, the holder head 416 is first rotated by 180 degrees in the direction "A" and subsequently is rotated back by 180 degrees in the direction "B". During the two 180-degree rotations of the holder head 416 in the opposite directions "A" and "B", the nozzle holder 504 is rotated by two pitches to position the third nozzle 532 at the operating position. Thus, the selection of the third nozzle 532 can be completed in a shorter time than the case where the head 416 is fully rotated twice in the direction "A" only to rotate the holder 504 by two pitches. The head 416 returns to its original angular position because of the two 180-degree rotations of the head 416 in the opposite directions "A" and "B".

Moreover, in the case where a first suction nozzle 532 being positioned at the operating position is changed with a fourth suction nozzle 532 angularly spaced from the first nozzle 532 by 270 degrees in the correction direction, the holder head 416 is first rotated by 180 degrees in the direction "A", subsequently is rotated back by 180 degrees in the direction "B", and then is rotated by 360 degrees in the direction "A". Eventually, the head 416 returns to its original angular position.

With the holder head 416 being positioned at its original angular position, the control device 630 confirms that the desirable kind of suction nozzle 532 is positioned at the operating position, based on the information about whether or not the light sensors 582a–582c detect respective lights.

As is apparent from the foregoing description, in the present EC mounting system, the EC transferring and mounting apparatus 402 according to the fourth embodiment of the present invention includes the component holder head 416 which is linearly movable to suck and mount the EC 432. Like the EC mounting system disclosed in the previously-discussed Japanese Patent Application laid open for inspection purposes under Publication No. 2-69998, one of the plurality of component suction nozzles 532 carried by the Y-axis slide 426 as the movable member is selected and positioned at the operating position on the EC transferring apparatus 402, and this nozzle selection and the rotation of the selected nozzle 532 about the axis line thereof are effected by the common servomotor 460 also carried by the movable member 426. Thus, the EC transferring apparatus 402 need not be used with any independent suction-nozzle holding or changing apparatus. In addition, the suction nozzle 532 being placed or positioned at the operating position can be rotated about the axis line thereof. Thus, the present apparatus 402 enjoys the same advantages as described previously.

In addition, since the nozzle selecting cam 620 is provided on the Y-axis slide 426, the above nozzle selection is effected while the slide 426 is moved to the EC supply device 404 after the EC 432 is mounted on the PC board 410. Thus, it is not needed to stop the operation of the EC transferring apparatus 402 for the purpose of effecting the nozzle selection, or move the slide 426 to a special position where an independent suction-nozzle holding or changing apparatus might be provided. Thus, the ECs 438 are mounted on the PC board 410 with high efficiency, though the plurality of suction nozzles 532 can selectively be used.

Furthermore, since all the time after the component holder head 416 mounts each EC 438 and returns to its original angular position and before the holder head 416 sucks the next EC 438 can be used for selecting an appropriate one of the component suction nozzles 532, the nozzle holder 504 can be rotated by a great angle and any of the plurality of suction nozzles 532 can be selected and positioned at the operating position.

In addition, the vertically moving device 436 which moves the holder head 416 up and down for sucking and mounting the EC 438 is used for moving the holder head 416 between the first position where the engaging member 516 is engageable with the cam surface 622 and the second position where the engaging member 516 is not engageable with the cam surface 622. Thus, the moving device 436 also functions as a position changing device which changes the position of the holder head 416 relative to the nozzle selecting cam 620.

Moreover, since the engaging member 516 as the cam follower is detachably attached to the nozzle holder 504, the engaging member 516 can be replaced with a new one 516 by unfastening the engaging pin 520, when the ball 522 is worn because of the contact or friction thereof with the cam surface 622. This is more economical than the case where the nozzle holder 504 as a whole is replaced with a new one 504.

As is apparent from the foregoing description, in the fourth embodiment shown in FIGS. 13–21 and 22(A)–22(E), the Y-axis slide 426 provides a movable member; the X-axis slide 420, the ball screws 418, 424, the X-axis and Y-axis drive servomotors 422, 428, etc. cooperate with one another to provide a movable-member moving device; the support member 490 provides a rotary holder; the nozzle holder 504 which holds the component suction nozzles 532a–532d as component holders provides a rotary head; the rotating servomotor 460 provides a drive source; the spline axis member 448, the gears 456, 458, 462, the sleeve 450, etc. cooperate with one another to provide a connecting device as a rotation transmitting device; and a cam-follower-motion converting device which includes the drive cam 606, the driven cam 590, and the compression coil spring 570 as cam biasing means, cooperates with the nozzle selecting cam 620 and the engaging member 516 as a cam follower to provide a rotation converting device. The vertically moving device 436 which is provided by the ball screw 470, the nut 472, the vertically moving servomotor 482, etc., provides a position changing device; and the positioning holes 560 and the positioning pin 564 cooperate with each other to provide a rotary-head positioning device. The through-holes 578a–578d formed through the nozzle holder 504 cooperate with the light sensor 582a to provide a detector which detects that one of the suction nozzles 532 is positioned at the operating position; and the through-holes 580a, 580b, the light sensors 582b, 582c, and the control device 630 cooperate with one another to provide an identifier which identifies the particular kind of the suction nozzle 532 being positioned at the operating position, based on the signals supplied from the sensors 582b, 582c.

In the fourth embodiment shown in FIGS. 13–21 and 22(A)–22(E), the nozzle holder 504 is prevented from freely rotating by the engagement of the sheet springs 714 and the flat engaging surfaces 718. However, in a fifth embodiment shown in FIG. 23, the rotation of a nozzle holder 730 corresponding to the nozzle holder 504 is prevented by the engagement of an engaging member 738 fixed to a support member 736 corresponding to the support member 490 and each of four V grooves 734 formed in an outer circumferential surface of an axis portion 732 of the support member 736 and each having a V-shaped cross section. The four V grooves 734 extend in an axial direction of the axis portion 732 corresponding to the axis portion 508, and are equiangularly spaced from one another about an axis line of the axis portion 732. The engaging member 738 is formed of a sheet spring, and has two elongate holes 740 each of which is elongate in a vertical direction. Two bolts 742 are threadedly engaged with the support member 736 through the two elongate holes 740 of the engaging member 738, respectively. Thus, the height or elevational position of the engaging member 738 can be adjusted and the angular position of the same 738 cannot be changed. The engaging member 738 has, in a lower end portion thereof, a conical engaging projection 744 projecting toward the axis portion 732.

The engagement of the engaging projection 744 with each V groove 734 prevents the free rotation of the axis portion 732. When the nozzle holder 730 is moved in an axial direction thereof to disengage the positioning projection 566 of the positioning pin 564 from one of the positioning holes 560 and thereby permit the selection of an appropriate one of the suction nozzles 532, the movement of the engaging projection 744 relative to one V groove 734 takes place. Thus, the engagement of the projection 744 with each V groove 734 prevents the rotation of the nozzle holder 730 while permitting the movement of the holder 730 in the axial direction thereof. When the nozzle holder 730 is rotated by the engagement of the drive cam 606 and the driven cam 590, the engaging member 738 is elastically deformed and the engaging projection 744 is disengaged from one V groove 734, so that the rotation of the holder 730 is permitted. When the holder 703 is thus rotated by a certain angle of about 90 degrees, the projection 744 is engaged with another V groove 734, so that the free rotation of the holder 730 is inhibited.

Figure 23:
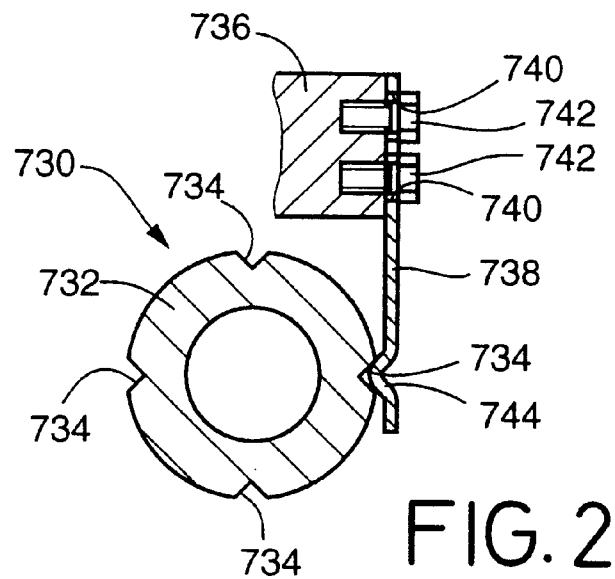
FIG. 23 is an illustrative view of a free-rotation preventing device which prevents a free rotation of a nozzle holder of a component holder head employed in an electronic component transferring and mounting apparatus in an electronic component mounting system constructed according to another embodiment of this invention.

Like the positioning holes and pin 560, 564 of the embodiment shown in FIGS. 13–21 and 22(A)–22(E), the V grooves 734 and the engaging member 738 shown in FIG. 23 have the function of angularly positioning the nozzle holder 730 such that one of the suction nozzles 532 is positioned at the operating position. Even in a state in which the positioning pin 564 is disengaged from the positioning holes 560, the engagement of the engaging projection 744 with one V groove is maintained, so that respective portions of the inclined surfaces 600, 610 of the driven and drive cams 590, 606 are opposed, with reliability, to each other in the axial direction of the nozzle holder 730. Thus, those portions of the inclined surfaces 600, 610 can be made as small as possible. In addition, even if the engaging projection 744 is engaged with each V groove 734 in a state in which the two elements 744, 734 are not accurately aligned with each other, the inclined inner surfaces of each V groove 734 and the inclined outer surfaces of the engaging projection 744 cooperate with the elasticity of the engaging member 738 to provide the function of guiding the nozzle holder 730 such that the two elements 744, 734 are accurately aligned with each other. Thus, in the fifth embodiment shown in FIG. 23, the positioning pin and holes 564, 560 may be omitted.

Figure 24:
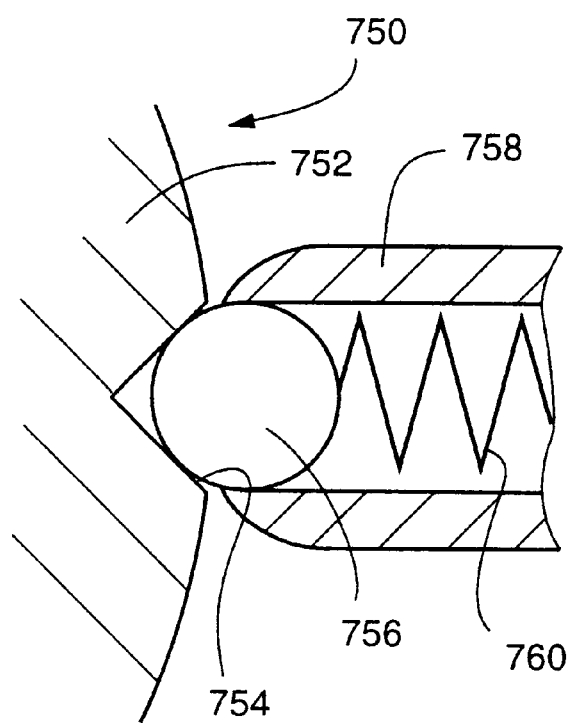
FIG. 24 is an illustrative view of a free-rotation preventing device which prevents a free rotation of a nozzle holder of a component holder head employed in an electronic component transferring and mounting apparatus in an electronic component mounting system constructed according to yet another embodiment of this invention.

In a sixth embodiment shown in FIG. 24, the engaging projection 744 shown in FIG. 23 is replaced by a ball 756, which is engageable with each of four V grooves 754 formed in an axis portion 752 of a nozzle holder 750 corresponding to the nozzle holder 730 shown in FIG. 23. In this case, the amount of wearing of the ball 756 is smaller than that of the projection 744, and accordingly the ball 756 enjoys an improved durability. The ball 756 is held by a bracket 758 fixed to a support member (not shown) which corresponds to the support member 736 shown in FIG. 23 and which supports the nozzle holder 750 such that the holder 750 is rotatable about an axis line thereof. The ball 756 can rotate in the bracket 758, and cannot come off the bracket 758. The ball 756 is biased by a spring 760, so that a portion of a spherical outer surface of the ball 756 projects outward from the bracket 758 and engages each V groove 754. When the nozzle holder 750 is rotated, the ball 756 is retracted into the bracket 758 against the biasing force of the spring 760, so that the rotation of the holder 550 is permitted. The ball 756 and the V grooves 754 have the function of positioning the nozzle holder 750 at each of four predetermined angular positions, and the function of guiding the holder 750 such that the ball 756 is aligned with accuracy with each V groove 754.

In the fourth embodiment shown in FIGS. 13–21 and 22(A)–22(E), the engaging member 516 held by the axis portion 508 of the nozzle holder 504 may be replaced by a ball which can rotate.

Otherwise, the engaging member 516 may be omitted, and a swing lever may be supported by the support member 490 such that the swing lever is swingable or rotatable about an axis line thereof parallel to the axis of rotation of the component holder head 416. In this case, when the swing lever is rotated while one end portion thereof is engaged with the cam surface 622 of the nozzle selecting cam 620, the nozzle holder 504 is moved in the axial direction thereof. Specifically described, the rotation of the swing lever results in changing the distance between another end portion of the lever which contacts the holder 504 and the axis line of the lever as seen in the axial direction of the holder 504, and thereby moving the holder 504 in the axial direction thereof. It is preferred that the frictional resistances produced between the two end portions of the swing lever and the cam surface 622 and nozzle holder 504 be reduced by providing those end portions of the lever with a ball or a roller.

In the fourth embodiment shown in FIGS. 13–21 and 22(A)–22(E), a positioning pin corresponding to the pin 564 provided on the support member 490, may be provided on the nozzle holder 504, and positioning holes corresponding to the holes 560 provided on the holder 504 may be provided on the support member 490.

In the fourth embodiment shown in FIGS. 13–21 and 22(A)–22(E), the nozzle holder 504 as the rotary head is movable relative to the support axis member 502 in the axial direction thereof. However, the axis member 502 may be modified such that the axis member 502 is movable relative to the nozzle holder 504 in the axial direction thereof and the nozzle holder 504 may be modified such that the holder 504 is rotatable about the axis line thereof and is not movable in the axial direction thereof. In the latter case, the cam follower provided by the engaging member 516, the ball 22, etc. is provided on the modified axis member 502 and the nozzle selecting cam 620 provided on the support member 490 is modified such that the cam 620 is engageable with the cam follower provided on the axis member 502. In addition, a positioning device which angularly positions the nozzle holder 504 such that one of the suction nozzles 532 is positioned at the operating position, is provided by, for example, a plurality of positioning holes which are provided on one of the nozzle holder 504 and the support member 40, and a positioning device which is provided on the other of the two elements 504, 490. Like the positioning device shown in FIG. 24, the positioning device may be provided by a ball which is engageable with, and disengageable from, each of the positioning holes, and a spring which biases the ball in a direction in which the ball engages each hole.

In the fourth embodiment shown in FIGS. 13–21 and 22(A)–22(E), the sucking and mounting of the EC 438 and the selecting of one suction nozzle 532 are carried out at different heights or elevational positions of the component holder head 416. However, the cam 622 may be provided at a height where the cam 622 is engageable, for a nozzle selection, with the cam follower 516, 522 of the holder head 416 which is being positioned at its downward-movement starting position from which the head 416 is moved down to suck and mount the EC 438. If the amounts of changing and/or correcting of respective angular positions of ECs 438 fall in a small angular range, the changing and/or correcting of the angular positions of the ECs 438 can be carried out by rotating the holder head 416 within such a small angular range in which the cam follower 516, 522 is not engageable with the cam 620.

In the fourth embodiment shown in FIGS. 13–21 and 22(A)–22(E), the light sensors 582*a*–582*c* are provided at a height where the sensors 582 can recognize that one of the suction nozzles 532 is positioned at the operating position and identify the particular kind of one suction nozzle 532 being positioned at the operating position, when the component holder head 416 is held at its elevated, nozzle selecting position. However, the sensors 582*a*–582*c* may be provided at a height where the sensors 582 can perform the above recognition and identification when the holder head 416 is held at its downward-movement starting position.

In the fourth embodiment shown in FIGS. 13–21 and 22(A)–22(E), it is not essentially required to provide the Y-axis slide 426 with the nozzle selecting cam 620 and move the cam 620 with the component holder head 416. Otherwise, the cam 620 may be provided on the X-axis slide 420 or the base 400. Although the selection of one suction nozzle 532 is carried out by stopping the holder head 416 at the position where the cam 620 is located, it is not essentially required to move up the holder head 416 for selecting one suction nozzle 532. The position of the holder head 416 relative to the cam 620 may be changed between a first position where the two elements 416, 620 are engageable with each other and a second position where the two elements 416, 620 are not engageable with each other, by moving the cam 620 relative to the head 416.

Figure 25:
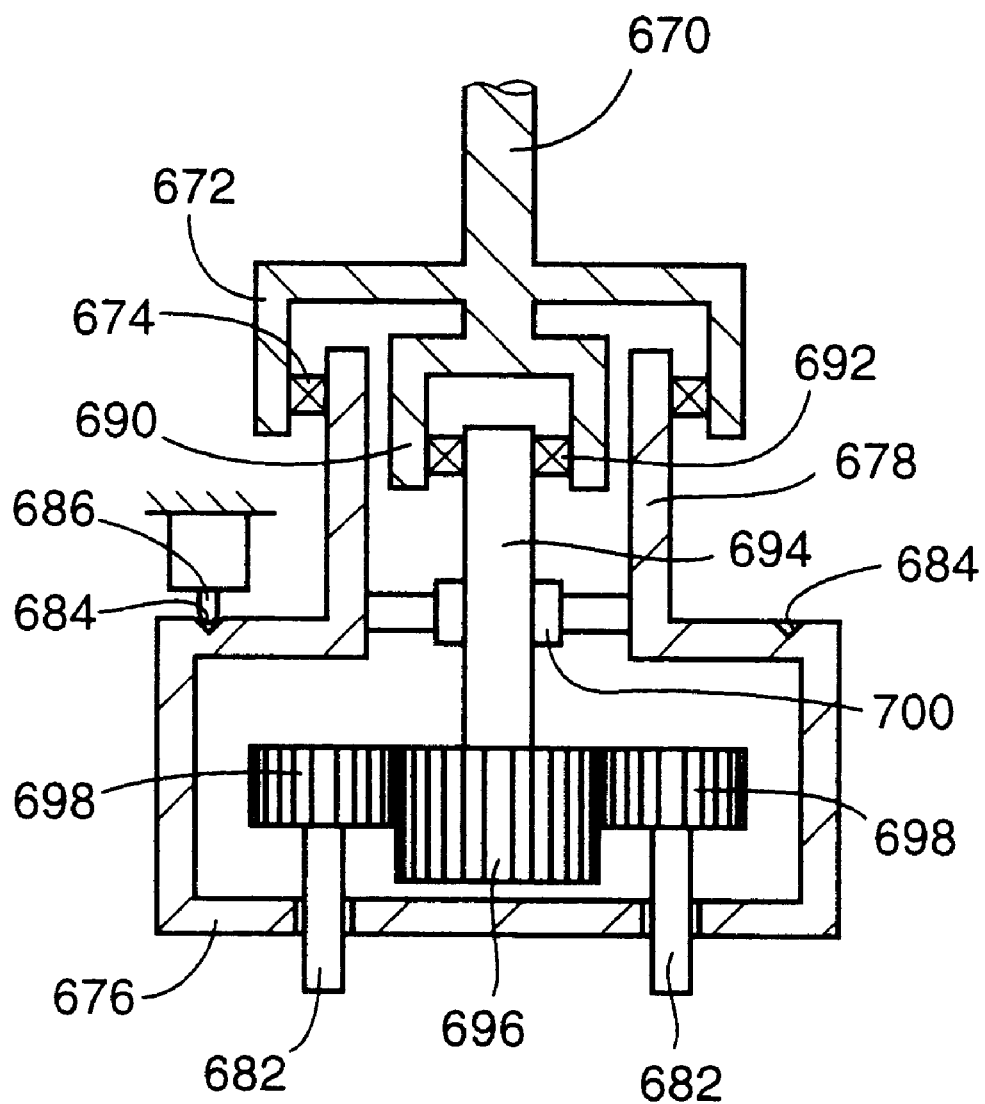
FIG. 25 is an illustrative view showing an electronic component transferring and mounting apparatus constructed according to yet another embodiment of this invention.

FIG. 25 shows an EC transferring apparatus according to a seventh embodiment of the present invention.

In the figure, reference numeral 670 designates a support member which is rotatable about an axis line thereof in opposite directions by a servomotor (not shown) as a drive source. The servomotor is of a kind of electric motor which is controllable about an angular phase thereof, and accordingly may be replaced by a stepper motor. The support member 670 includes a head support portion 672 which supports a rotary head 676 via a first one-way clutch 674 as a kind of a one-direction-rotation transmitting device such that the rotary head 676 is rotatable about the axis line of the support member 670. The rotary head 676 includes an integral part 678 which is supported by the head support portion 672 such that the rotary head 676 is rotatable as indicated above. The first one-way clutch 674 transmits the rotation of the support member 670 in the first direction, to the rotary head 676, and does not transmit the rotation of the support member 670 in the second direction opposite to the first direction.

The rotary head 676 supports, for example, four component holders 682 which are equiangularly spaced from one another about the axis line of the head 676 and are provided along a circle whose center is located on the same axis line. Each component holder 682 is rotatable about an axis line thereof parallel to the axis line of the rotary head 682. The rotary head 676 has four positioning holes 684 which are equiangularly spaced from one another about the axis line of the head 676 and are provided along a circle whose center is located on the same axis line. Each of the holes 684 is engageable with a positioning pin 686 which is provided independent of the rotary head 676. When the pin 686 is engaged with one of the four holes 684, one of the four holders 682 is positioned at an operating position where the one holder 682 sucks and mounts an EC. The pin 686 is biased by a spring (not shown) in a direction in which the pin 686 engages the holes 684.

The support member 670 includes a rotation-axis support portion 690 which supports a rotary axis member 694 via a second one-way clutch 692 as a kind of a one-direction-rotation transmitting device such that the axis member 694 is rotatable about the axis line of the support member 670. The second one-way clutch 692 does not transmit the rotation of the support member 670 in the first direction, to the axis member 694, and transmits the rotation of the support member 670 in the second direction to the axis member 694. A gear 696 is fixed to the axis member 694, and four gears 698 respectively fixed to the four component holders 682 are meshed with the gear 696. Reference numeral 700 designates a friction-type rotation transmitting device in the form of a brake which permits the rotation of the axis member 694 only when a rotating force greater than a reference value is applied to the axis member 694.

One of the four component holders 682 which is being positioned at the operating position is moved downward by a device (not shown) by a predetermined distance from the level of the other holders 682. In this state, the support member 670 is moved down and up and accordingly the rotary head 676 is moved down and up, so that an EC (not shown) is sucked and mounted by the holder 682 being positioned at the operating position. When the rotary head 676 is moved down and up, the positioning pin 686 is moved down and up together with the head 676, so that one holder 682 is kept at the operating position. The holder 682 being positioned at the operating position is moved up, i.e., returned to its original height by the not-shown device, for changing the current holder 682 to another holder 682.

The component holders 682 are rotated about respective axis lines thereof by rotating the servomotor in the second direction and thereby rotating the rotary axis member 694 in the second direction. This rotation of the servomotor is transmitted by the second one-way clutch 692 to the axis member 694. That is, a rotating force greater than the reference value is input to the axis member 694 to rotate the same 694. The rotation of the axis member 694 is transmitted via the gears 696, 698 to the component holders 682 to rotate the same 682 about the respective axis lines thereof. The head support portion 672 is integral with the rotary-axis support portion 690. The transmission of rotation of the support member 670 in the second direction to the rotary head 676 is inhibited by the first one-way clutch 674, but the rotation of the axis member 694 in the second direction is partially transmitted to the rotary head 676 via the brake 700 as the friction-type rotation transmitting device. However, this rotating force is not so great as can rotate the rotary head 676 in the second direction while disengaging one positioning hole 684 from the positioning pin 686 against the biasing force of the not shown spring. Thus, the rotary head 676 is not rotated and the component holders 682 are not rotated about the axis line of the support member 670.

The selection of one component holder 682 is carried out by rotating the servomotor in the first direction and thereby rotating the support member 670 in the first direction. This rotation of the servomotor is transmitted by the first one-way clutch 674 to the rotary head 676, so that the rotary head 676 is rotated about the axis line of the support member 670 while the positioning pin 686 is forcedly disengaged from one positioning hole 684 against the biasing force of the not shown spring. Thus, a selected one of the four component holders 682 is positioned at the operating position. The rotary-axis support portion 690 is integral with the head support portion 672. The transmission of rotation of the support member 670 in the first direction to the axis member 694 is inhibited by the second one-way clutch 692, but the rotation of the rotary head 676 in the first direction is partially transmitted to the axis member 690 via the brake 700. Thus, the rotary head 76 and the axis member 680 are rotated as a unit, and the component holders 682 are prevented from rotating relative to the rotary head 676.

While the present invention has been described in detail in its preferred embodiments, it is to be understood that the present invention may be otherwise embodied.

For example, in the EC transferring and mounting apparatuses according to the first to third embodiments shown in FIGS. 1-9, FIG. 10, and FIGS. 11 and 12, respectively, it is possible to employ the same nozzle selecting mechanism as that employed in the EC transferring and mounting apparatus according to the fourth embodiment shown in FIGS. 1–21 and 22(A)–22(E).

Specifically described, at least one of the rotary plates 70 shown in FIG. 1 is provided with the component holder head 416, the vertically moving device 436, the rotating device 440, and the nozzle selecting cam 620. In this case, at an appropriate timing during the rotation of the rotary plate 70, the nozzle holder 504 is rotated to select and position one of the suction nozzles 532 at the operating position. In addition, since the suction nozzle 532 is moved down and up at the EC sucking or mounting position by the vertically moving device 436, the head elevating and lowering device 260 may be omitted.

In addition, the nozzle selecting cam 620 is fixed at a nozzle selecting position where the rotary plate 70 is stopped to select and position one of the suction nozzles 532 at the operating position. In this case, the cam grooves 92a–92d of the concave globoidal cams 90a–90d are formed such that the rotary plate 70 is stopped at the nozzle selecting position, and the stationary cylindrical cam 130 is formed such that the rotary plate 70 is moved, around the nozzle selecting position, horizontally at a height where the engaging member 516 is engageable with the cam 620. While the rotary plate 70 is stopped at the nozzle selecting position, the component holder head 416 is rotated and an appropriate one of the nozzle holders 532 is selected.

Moreover, in the EC transferring and mounting apparatus according to the fourth embodiment shown in FIGS. 1–21 and 22(A)–22(E), it is possible to employ the same nozzle selecting mechanism as that employed in the EC transferring and mounting apparatuses according to the first to third embodiments shown in FIGS. 1–9, FIG. 10, and FIGS. 11 and 12, respectively. In this case, the nozzle selecting cam 248 which is engageable with the cam follower roller 218 fixed to the motor support 210 to move the support 210 downward, may be fixedly provided on either the X-axis slide 420 or the base 400 that is independent of the X-axis or Y-axis slide 420, 426.

Furthermore, the principle of the present invention may be applicable to an electronic component transferring and mounting apparatus including a movable member in the form of a rotary table which is intermittently rotatable about a vertical axis line thereof; an intermittently rotating device which intermittently rotates the rotary table; and a plurality of component holder heads which are supported by the rotary table such that the holder heads are equiangularly spaced from each other about the axis line of the rotary table and such that each holder head is rotatable about an axis line thereof. In this apparatus, each holder head is sequentially stopped at each of the same number of predetermined positions as the total number of the holder heads, so as to suck an electronic component (EC), take an image of the EC, mount the EC on a PC board, etc., respectively.

In addition, the principle of the present invention may be applicable to an electronic component transferring and mounting apparatus including a component holder head which is linearly movable in only one of an X-axis and an Y-axis direction to transfer and mount an EC, or other kinds of electronic component transferring and mounting apparatuses.

In the embodiment shown in FIGS. 1–9, vacuum is supplied to, and cut from, the suction nozzle 158 by the switching device 178 including a solenoid-operated switch valve. However, this electrical switching may be replaced by a mechanical switching. For example, each of the rotary plates 70 is provided with a pressure switch valve including a switch member which is movable between a vacuum supplying position in which the switch valve permits vacuum, i.e., pressure lower than atmospheric pressure to be supplied to the suction nozzle 158 so that the nozzle 158 can suck the electronic component or EC 164, and a vacuum cutting position in which the switch valve permits pressure higher than the atmospheric pressure to be supplied to the nozzle 158 so that the nozzle 158 releases the EC 164. In the latter case, the EC transferring and mounting apparatus 12 is provided with a first switch-member drive device at the component sucking position, and a second switch-member drive device at the component mounting position. The first switch-member drive device moves the switch member to the vacuum supplying position in mechanical synchronism with the downward movement of the holder head 120 caused by the head elevating and lowering device 260, and the second switch-member drive device moves the switch member to the vacuum cutting position in mechanical synchronism with the downward movement of the holder head 120 caused by the head elevating and lowering device 260. The switch member is held at the vacuum supplying or cutting position, unless an external force is applied to move it.

The above-described mechanical switching of the vacuum supply to the suction nozzle 158 is applicable to the case where the EC transferring and mounting apparatus 12 in accordance with the first, second, or third embodiment shown in FIGS. 1–12, or an EC transferring and mounting apparatus which includes a rotary table as a rotary member which intermittently rotates about an axis line, and a component holder head supported by the rotary table, is so modified as to select and rotate the suction nozzle 158 in the same manner as employed in the fourth embodiment shown in FIGS. 13–22.

The above-described first or second switch-member drive device may include an operating member which is provided at the component sucking or mounting position and which operates or moves the switch member, and an assisting member which assists the operating member in moving the switching member.

Also in the case where the above mechanical switching is employed in place of the electrical switching, the vertical stroke of the vertically movable member 266 of the head elevating and lowering device 260 is likewise changed to a minimum value, when an error is detected about the sucking of the EC 164 by the suction nozzle 158. Thus, the EC 164 or the suction pipe 162 is prevented from contacting the PC board 38. In addition, the second switch-member drive device does not move the switch member to the vacuum cutting position. Thus, the EC 164 is not mounted on the PC board 38. A third switch-member drive device which is provided in the component discarding area moves the switch member of the pressure switch valve of the rotary plate 70, moving in the discarding area, to the vacuum cutting position, so that the suction nozzle 158 releases or discards the erroneously sucked EC 164. If the suction nozzle 158 fails to suck the EC 164, the vacuum supply is cut from the nozzle 158.

The vertical movement of the holder head 120 that takes place when the EC 164 is sucked or mounted may be effected in such an EC transferring apparatus which is not provided with the cams 90 and the cam followers 88, like the fourth embodiment shown in FIGS. 13–22. In the latter case, an electric motor as a drive source employed for vertically moving the holder head 120 is controlled such that when an error is detected about the sucking of the EC 164, the holder head 120 is not vertically moved. Thus, the EC 164 or the suction pipe 162 is prevented from contacting the PC board 38, and the vacuum supply is cut from the suction nozzle 158.

In the first embodiment shown in FIGS. 1–9, it is not essentially required that the rotation of the rotary plate 70 and the vertical movement of the holder head 120 be effected concurrently with each other. For example, the first embodiment may be modified such that after the rotary plate 70 is moved to, and stopped at, the component sucking or mounting position, the holder head 120 is moved downward and such that after the holder head 120 is moved upward to its uppermost position, the rotary plate 70 is started to move.

In the case where the holder head 120 is supported by the above-indicated intermittently rotary table or the linearly movable member 426, the holder head 120 may be vertically moved while the rotary table is rotated or while the movable member 426 is moved, or the head 120 may be vertically moved after the rotary table or the movable member 426 is stopped.

In the first embodiment shown in FIGS. 1–9, the rotary plates 70 are rotatably supported by the stationary shaft 66. However, the rotary plates 70 may be supported by a rotary shaft which is rotatable about an axis line. In the latter case, a vacuum supply passage formed through the rotary shaft may be connected to a vacuum source via piping and a rotary valve, on one hand, and connected to each of the switching devices 178 via a flexible connecting member such as a hose. The rotary shaft may be rotated by the main drive servomotor 108 that is employed mainly for rotating the globoidal cams 90. In the latter case, the total number of drive sources can be reduced.

In the first embodiment shown in FIGS. 1–9, the rotary valve which is provided in the stationary shaft 66 to connect between the passage of the shaft 66 and the switching devices 178, is rotated or driven by the exclusive valve drive servomotor (not show) provided therefor. However, the rotary valve may be engaged with one of the rotary plates 70, so that the rotary valve may be rotated with the said one rotary plate 70. This manner may be employed in the case where the first embodiment shown in FIGS. 1–9 is modified to select the suction nozzle 158 in the same manner as employed in the fourth embodiment shown in FIGS. 13–22.

In the case where the suction nozzles 158 are held or supported by the intermittently rotary table, a rotary valve may be provided between an axis portion of the rotary table and a support member which supports the axis portion such that the rotary table is rotatable about the axis portion thereof. In the latter case, the switching devices 178 are kept in communication with the vacuum source, even if the rotary table is rotated.

In the first embodiment shown in FIGS. 1–9, the switching device 178 which selectively supplies the vacuum to, and cuts the vacuum supply from, the suction nozzle 158 is rotated together with the holder head 120. However, the switching device 178 may be provided on a stationary member such as the base 10. In the latter case, the same number of switching devices 178 as the number of the holder heads 120 are employed, and the switching devices 178 are connected to the corresponding holder heads 120, respectively, via respective passages, a rotary valve, and respective hoses as flexible connecting members. This manner may be employed in the case where the EC transferring and mounting apparatus in which the holder heads 120 are supported by the intermittently rotary table, or the first embodiment shown in FIGS. 1–9, is modified to select the suction nozzle 158 in the same manner as employed in the fourth embodiment shown in FIGS. 13–22.

Moreover, the principle of the present invention may be applicable to not only an electronic component transferring and mounting apparatus which transfers an EC and mounts the EC on a PC board or the like, but also an electronic component transferring apparatus which receives an EC, transfers the EC, and passes the EC to another device but does not mount the EC on a workpiece.

The present invention may be embodied by combining one or more elements of any one of the illustrated embodiments with one or more elements of the other embodiments.

It is to be understood that the present invention may be embodied with other changes, improvements, and modifications that may occur to those skilled in the art without departing from the spirit and scope of the invention defined in the appended claims.

What is claimed is:

1. An electronic component transferring apparatus for transferring electronic components, comprising:

at least one movable member;

a movable-member moving device which moves said movable member;

a rotary head which is supported by said movable member such that said rotary head is rotatable about an axis line thereof;

a plurality of component holders which are supported by said rotary head such that said component holders are axis-symmetric with each other with respect to said axis line of the rotary head;

a drive source which is supported by said movable member, which includes an output member, and which provides a motion to said output member; and a motion transmitting device which is selectively operable in a component-holder selecting state in which said motion transmitting device transmits said motion of said output member of said drive source to said rotary head, to rotate the rotary head about said axis line thereof and thereby position one of said component holders at a predetermined position in which said one component holder holds one of the electronic components, and in a component-holder rotating state in which said motion transmitting device transmits said motion of said output member of said drive source to at least said one component holder being positioned at said predetermined position, to rotate said one component holder about an axis line thereof.

2. The electronic component transferring apparatus according to claim 1, further comprising a rotary holder which supports said rotary head such that the rotary head is rotatable about said axis line thereof and which is supported by said movable member such that said rotary holder is rotatable about an axis line thereof coaxial with said axis line of said one component holder being positioned at said operating position, wherein said motion transmitting device rotates, in said component-holder rotating state thereof, said rotary holder about said axis line thereof coaxial with said axis line of said one component holder being positioned at said operating position, so as to rotate said one component holder about said axis line thereof.

3. The electronic component transferring apparatus according to claim 1, wherein said drive source comprises a rotary motor having a rotary output shaft, and wherein said motion transmitting device comprises a component-holder selecting-rotation transmitting device including a component-holder selecting-rotation input member which is rotatable to rotate said rotary head about said axis line thereof, a component-holder rotating-rotation transmitting device including a component-holder rotating-rotation input member which is rotatable to rotate at least said one component holder positioned at said operating position, about said axis line thereof, a transmission control device which is selectively operable in a first transmitting state in which said transmission control device permits a rotation of said output shaft of said rotary motor to be transmitted to each of said component-holder selecting-rotation input member and said component-holder rotating-rotation input member, and in a second transmitting state in which said transmission control device permits said rotation of said output shaft to be transmitted to only one of said component-holder selecting-rotation input member and said component-holder rotating-rotation input member.

4. The electronic component transferring apparatus according to claim 3, wherein said motion transmitting device comprises a connecting device which permits said rotation of said output shaft of said drive motor to be transmitted to one of said component-holder selecting-rotation input member and said component-holder rotating-rotation input member, and a switching device which is selectively operable in a first state in which said switching device permits said rotation of said output shaft to be transmitted to the other of said selecting-rotation input member and said rotating-rotation input member and in a second state in which the switching device does not permit said rotation of said output shaft to be transmitted to said other of said selecting-rotation input member and said rotating-rotation input member.

5. The electronic component transferring apparatus according to claim 3, wherein said rotary motor comprises a bidirectional rotary motor having a rotary output shaft which is rotatable in a first direction and a second direction opposite to said first direction, and wherein said motion transmitting device comprises an each-direction-rotation transmitting device which transmits a rotation of said output shaft of said bi-directional rotary motor in each of said first and second directions to one of said component-holder selecting-rotation input member and said component-holder rotating-rotation input member, and in a one-direction-rotation transmitting device which transmits, to the other of said selecting-rotation input member and said rotating-rotation input member, the rotation of said output shaft in said first direction and does not transmit the rotation of said output shaft in said second direction.

6. The electronic component transferring apparatus according to claim 1, wherein said motion transmitting device comprises a switching device which is selectively operable in a first state in which said switching device permits the transmission of said motion of said drive source, and in a second state in which the switching device does not permit the transmission of said motion of said drive source.

7. The electronic component transferring apparatus according to claim 6, wherein said drive source comprises a rotary motor having a rotary output shaft, wherein said motion transmitting device comprises a component-holder selecting-rotation transmitting device including a component-holder selecting-rotation input member which is rotatable to rotate said rotary head about said axis line thereof, and a component-holder rotating-rotation transmitting device including a component-holder rotating-rotation input member which is rotatable to rotate at least said one component holder being positioned at said operating position, about said axis line thereof, and wherein said switching device comprises a drive member which is rotatable with said output shaft of said rotary motor, a driven member which is rotatable with one of said component-holder selecting-rotation input member and said component-holder rotating-rotation input member and which is engageable with said drive member such that said driven member is rotatable with said drive member, and an engaging and disengaging device which moves at least one of said drive member and said driven member relative to each other in an axial direction of said output shaft of said rotary motor and thereby engages, and disengages, the drive member and the driven member with, and from, each other.

8. An electronic component transferring apparatus according to claim 7, wherein said driven member is rotatable with said component-holder rotating-rotation input member, and wherein said motion transmitting device comprises a rotation preventing device which permits the rotation of said component-holder rotating-rotation input member, while said drive member and said driven member are engaged with each other, and prevents the rotation of said component-holder rotating-rotation input member, while said drive member and said driven member are disengaged from each other.

9. The electronic component transferring apparatus according to claim 8, wherein said rotation preventing device comprises a first rotation preventing member which is rotatable with said component-holder rotating-rotation input member, and a second rotation preventing member which is not rotatable relative to said movable member and which is engageable with said first rotation preventing member, and wherein said engaging and disengaging device engages, and disengages, said drive member and said driven member with, and from, each other and simultaneously disengages, and engages, said first and second rotation preventing members from, and with, each other.

10. The electronic component transferring apparatus according to claim 9, further comprising a motor support on which said rotary motor is fixedly supported and which is supported by said movable member such that said motor support is movable relative to said rotary holder in an axial direction of said output shaft of said rotary motor, wherein said drive member and said second rotation preventing member are immovable relative to said motor support in said axial direction of said output shaft, and wherein said engaging and disengaging device comprises a biasing member which provides a biasing force to bias said motor support in a direction away from said rotary holder, and a motor-support moving device which moves said motor support toward said rotary holder against the biasing force of said biasing member.

11. The electronic component transferring apparatus according to claim 1, further comprising a rotary-head positioning device which positions said rotary head at an angular position about said axis line thereof where said one component holder is positioned at said operating position.

12. The electronic component transferring apparatus according to claim 11, wherein said rotary-head positioning device comprises an engageable projection and an engageable recess one of which is provided in a portion of said rotary head which portion is away from said axis line of the rotary head and the other of which is supported by a head holder which holds said rotary head such that said rotary head is rotatable about said axis line thereof, and a pressing device which elastically presses at least one of said projection and said recess to engage each other at least in a state in which one of said component holders is positioned at said operating position, said projection and said recess having respective shapes which are engageable with each other to define an angular position of said rotary head about said axis line thereof.

13. The electronic component transferring apparatus according to claim 1, wherein respective axis lines of said component holders intersect said axis line of said rotary head.

14. The electronic component transferring apparatus according to claim 1, wherein respective axis lines of said component holders are parallel to said axis line of said rotary head.

15. The electronic component transferring apparatus according to claim 1, further comprising a component-holder selecting-rotation transmitting device including a component-holder selecting-rotation input member which is rotatable to rotate said rotary head about said axis line thereof, and a component-holder rotating-rotation transmitting device including a component-holder rotating-rotation input member which is rotatable to rotate at least said one component holder being positioned at said operating position, about said axis line thereof.

16. The electronic component transferring apparatus according to claim 15, further comprising a rotary holder which supports said rotary head such that the rotary head is rotatable about said axis line thereof and which is supported by said movable member such that said rotary holder is rotatable about an axis line thereof coaxial with said axis line of said one component holder being positioned at said operating position, wherein said component-holder selecting-rotation transmitting device includes (a) said component-holder selecting-rotation input member which is held by said rotary holder such that the selecting-rotation input member is rotatable about said axis line of the rotary holder relative thereto, and (b) an input-member-rotation converting device which converts the rotation of said selecting-rotation input member into the rotation of said rotary head about said axis line thereof.

17. The electronic component transferring apparatus according to claim 16, wherein said input-member-rotation converting device comprises at least one pair of bevel gears which are engaged with each other.

18. The electronic component transferring apparatus according to claim 1, further comprising a rotary holder which supports said rotary head such that the rotary head is rotatable about said axis line thereof and which is supported by said movable member such that said rotary holder is rotatable about an axis line thereof coaxial with said axis line of said one component holder being positioned at said operating position, wherein said drive source comprises a rotary motor having a rotary output shaft, and wherein said motion transmitting device comprises a rotation transmitting device which transmits a rotation of said output shaft of said rotary motor to said rotary holder, and a rotation converting device which is provided between the rotary holder and said rotary head and which converts at least a portion of a rotation of said rotary holder into a rotation of said rotary head relative to the rotary holder.

19. The electronic component transferring apparatus according to claim 18, wherein said rotation converting device comprises a cam, a cam follower which is supported by said rotary holder such that said cam follower is movable relative thereto and which is engageable with said cam when the rotary holder is rotated about said axis line thereof, and a cam-follower-motion converting device which converts the motion of said cam follower relative to said rotary holder into said rotation of said rotary head relative to the rotary holder.

20. The electronic component transferring apparatus according to claim 19, wherein said motion transmitting device comprises a position changing device which changes a position of at least one of said rotary holder and said cam relative to the other of the rotary holder and the cam, between a first position in which the cam and said cam follower are engageable with each other when the rotary holder is rotated about said axis line thereof, and in a second position in which the cam and said cam follower are not engageable with each other.

21. The electronic component transferring apparatus according to claim 19, wherein said rotation converting device comprises a drive cam which is not rotatable about said axis line of said rotary head, a driven cam which is rotatable with said rotary head and which is movable relative to said drive cam in a direction parallel to said axis line of said rotary head, and a biasing member which provides a biasing force to bias at least one of said drive cam and said driven cam in a direction away from each other, said drive cam and said driven cam having respective shapes which cooperate with each other to rotate said rotary head about said axis line thereof by a predetermined angle each time the drive cam and the driven cam are engaged, based on the movement of said cam follower relative to the rotary holder, with each other against the biasing force of said biasing member.

22. The electronic component transferring apparatus according to claim 21, further comprising a rotary-head positioning device which positions said rotary head at an angular position about said axis line thereof where said one component holder is positioned at said operating position, said rotary-head positioning device comprising an engageable projection which projects from a portion of one of said rotary head and said rotary holder which portion is away from said axis line of the rotary head, an engageable recess which is formed in the other of said rotary head and said rotary holder and which is engageable with said engageable projection, and a holding and biasing device which holds one of said engageable projection and said engageable recess such that said one of said projection and said recess is movable in a first direction to engage the other of the projection and the recess and in a second direction to disengage from the other of the projection and the recess and such that said one of said projection and said recess is rotatable with said rotary head, said holding and biasing device biasing said one of said projection and said recess in said first direction, one of said projection and said recess being provided in a number which is not less than one and is natural-number times as great as a number of said component holders, the other of said projection and said recess being provided in one, said projection and said recess having respective shapes which cooperate with each other to guide, when one of said projection and said recess being not accurately aligned with each other is biased by said biasing member, said one of the projection and the recess and thereby accurately align the projection and the recess with each other, so as to cause the projection and the recess to be engaged with each other.

23. The electronic component transferring apparatus according to claim 22, wherein said rotary head and said driven cam are supported by said rotary holder such that the rotary head and the driven cam are movable in a direction parallel to said axis line of the rotary head, and wherein said holding and biasing device comprises fixing means for fixing one of said engageable projection and said engageable recess to said rotary head, and a biasing member which biases said rotary head in a direction to engage said projection and said recess with each other.

24. The electronic component transferring apparatus according to claim 21, wherein said rotary head and said driven cam are supported by said rotary holder such that the rotary head and the driven cam are movable in a direction parallel to said axis line of the rotary head, and wherein said rotary-head positioning device comprises an engageable projection and an engageable recess one of which is provided in a portion of said rotary head which portion is away from said axis line of the rotary head and the other of which is supported by said rotary holder such that said other of said engageable projection and said engageable recess is not movable in an direction of rotation of said rotary head and is movable toward, and away from, the rotary head and is biased in a direction to engage said one of said projection and said recess, said projection and said recess having respective shapes which are engageable with each other to define an angular position of said rotary head about said axis line thereof and permit the rotary head to be moved in said direction parallel to said axis line thereof.

25. The electronic component transferring apparatus according to claim 1, wherein said rotary head supports said component holders such that said component holders are rotatable about respective axis lines thereof parallel to said axis line of the rotary head, and wherein said motion transmitting device rotates, in said component-holder selecting state thereof, said rotary head about said axis line thereof and rotates, in said component-holder rotating state thereof, said at least one component holder about said axis line thereof relative to said rotary head.

26. The electronic component transferring apparatus according to claim 25, wherein said drive source comprises a rotary motor having a rotary output shaft which is rotatable in a first direction and a second direction opposite to said first direction, and wherein said motion transmitting device comprises a component-holder selecting-rotation transmitting device including a component-holder selecting-rotation input member which is rotatable to rotate said rotary head about said axis line thereof, a component-holder rotating-rotation transmitting device including a component-holder rotating-rotation input member which is rotatable to rotate at least said one component holder positioned at said operating position, about said axis line thereof, a first one-way rotation transmitting device which transmits, to said selecting-rotation input member, a rotation of said rotary motor in said first direction and does not transmit a rotation of the rotary motor in said second direction, and a second one-way rotation transmitting device which transmits, to said rotating-rotation input member, said rotation of said rotary motor in said second direction and does not transmit said rotation of the rotary motor in said first direction.

27. The electronic component transferring apparatus according to claim 1, wherein said drive source comprises a rotary motor which is rotatable in a first direction and a second direction opposite to said first direction, and wherein said motion transmitting device comprises a one-way rotation transmitting device which transmits a rotation of said rotary motor in said first direction and does not transmit a rotation of the rotary motor in said second direction.

28. An electronic component transferring apparatus for transferring electronic components, comprising:

at least one movable member;

a movable-member moving device which moves said movable member;

a rotary head which is supported by said movable member such that said rotary head is rotatable about an axis line thereof;

a plurality of component holders which are supported by said rotary head such that said component holders are axis-symmetric with each other with respect to said axis line of the rotary head;

a drive source which is supported by said movable member, which includes an output member, and which provides a motion to said output member;

a component-holder selecting device which rotates, based on said motion of said output member of said drive source, said rotary head about said axis line thereof and positions one of said component holders at a predetermined position in which said one component holder holds one of the electronic components; and a component-holder rotating device which rotates, based on said motion of said output member of said drive source, at least said one component holder being positioned at said predetermined position, about an axis line thereof, without causing the rotation of said rotary head about said axis line thereof.

29. The electronic component transferring apparatus according to claim 28, wherein respective axis lines of said component holders intersect said axis line of said rotary head.

30. The electronic component transferring apparatus according to claim 28, wherein respective axis lines of said component holders are parallel to said axis line of said rotary head.

31. The electronic component transferring apparatus according to claim 28, wherein said component-holder selecting device comprises a component-holder selecting-rotation transmitting device including a component-holder selecting-rotation input member which is rotatable to rotate said rotary head about said axis line thereof, and wherein said component-holder rotating device comprises a component-holder rotating-rotation transmitting device including a component-holder rotating-rotation input member which is rotatable to rotate at least said one component holder being positioned at said operating position, about said axis line thereof.

32. The electronic component transferring apparatus according to claim 31, further comprising a rotary holder which supports said rotary head such that the rotary head is rotatable about said axis line thereof and which is supported by said movable member such that said rotary holder is rotatable about an axis line thereof coaxial with said axis line of said one component holder being positioned at said operating position, wherein said component-holder selecting-rotation transmitting device includes (a) said component-holder selecting-rotation input member which is held by said rotary holder such that the selecting-rotation input member is rotatable about said axis line of the rotary holder relative thereto, and (b) an input-member-rotation converting device which converts the rotation of said selecting-rotation input member into the rotation of said rotary head about said axis line thereof.

* * * * *